(12) United States Patent
Peters et al.

(10) Patent No.: US 10,134,303 B2
(45) Date of Patent: *Nov. 20, 2018

(54) SYSTEMS AND METHODS PROVIDING ENHANCED EDUCATION AND TRAINING IN A VIRTUAL REALITY ENVIRONMENT

(71) Applicant: LINCOLN GLOBAL, INC., City of Industry, CA (US)

(72) Inventors: Carl Peters, Solon, OH (US); Deanna Postlethwaite, Chagrin Falls, OH (US); Matthew Wayne Wallace, South Windsor, CT (US)

(73) Assignee: LINCOLN GLOBAL, INC., Santa Fe Springs, CA (US)

( * ) Notice: Subject to any disclaimer, the term of this patent is extended or adjusted under 35 U.S.C. 154(b) by 123 days.

This patent is subject to a terminal disclaimer.

(21) Appl. No.: 15/018,908

(22) Filed: Feb. 9, 2016

(65) Prior Publication Data

US 2016/0155361 A1 Jun. 2, 2016

Related U.S. Application Data

(60) Division of application No. 13/792,300, filed on Mar. 11, 2013, now Pat. No. 9,280,913, which is a
(Continued)

(51) Int. Cl.
*G09B 19/24* (2006.01)
*B23K 9/095* (2006.01)
(Continued)

(52) U.S. Cl.
CPC .......... *G09B 19/24* (2013.01); *G06F 17/5009* (2013.01); *G09B 5/00* (2013.01);
(Continued)

(58) Field of Classification Search
CPC .......... G09B 19/24; B23K 9/09; B23K 9/095; B23K 9/0953; B23L 9/09; B23L 9/095; B23L 9/0953
See application file for complete search history.

(56) References Cited

U.S. PATENT DOCUMENTS

| | | |
|---|---|---|
| 317,063 A | 5/1885 | Wittenstrom |
| 428,459 A | 5/1890 | Oopfin |
| (Continued) | | |

FOREIGN PATENT DOCUMENTS

| | | |
|---|---|---|
| CA | 2698078 | 9/2011 |
| CN | 1403351 | 3/2003 |
| (Continued) | | |

OTHER PUBLICATIONS

ISMAR 2004 The Third IEEE and ACM International Symposium on Mixed and Augmented reality; Nov. 2-5, Arlington, VA, USA.
(Continued)

*Primary Examiner* — Robert J Utama
(74) *Attorney, Agent, or Firm* — Tucker Ellis LLP; Carlos Garritano; Evan Perry

(57) ABSTRACT

Virtual reality arc welding systems that provide virtual reality simulations for training purposes. Virtual reality welding systems to aid in training welding students may provide intelligent connections to web sites on the internet, overlays of ideal weld puddles, recommended corrective actions based on virtual testing results, simulations of virtual environments with safety hazards, and simulations of relationships between improperly set welding parameters and weld defects and discontinuities.

19 Claims, 28 Drawing Sheets

Related U.S. Application Data continuation-in-part of application No. 13/081,725, filed on Apr. 7, 2011, now Pat. No. 8,657,605, which is a continuation-in-part of application No. 12/501,257, filed on Jul. 10, 2009, now Pat. No. 8,747,116.

(60) Provisional application No. 61/349,029, filed on May 27, 2010.

(51) Int. Cl.
  *G09B 5/00* (2006.01)
  *G09B 5/02* (2006.01)
  *G09B 7/00* (2006.01)
  *G09B 9/00* (2006.01)
  *G06F 17/50* (2006.01)
  *G09B 5/06* (2006.01)

(52) U.S. Cl.
  CPC ............... *G09B 5/02* (2013.01); *G09B 5/06* (2013.01); *G09B 7/00* (2013.01); *G09B 9/00* (2013.01); *B23K 9/095* (2013.01); *B23K 9/0953* (2013.01); *B23K 9/0956* (2013.01)

(56) References Cited

U.S. PATENT DOCUMENTS

| | | |
|---|---|---|
| 483,428 A | 9/1892 | Goppin |
| 1,159,119 A | 11/1915 | Springer |
| D140,630 S | 3/1945 | Garibay |
| D142,377 S | 9/1945 | Dunn |
| D152,049 S | 12/1948 | Welch |
| 2,681,969 A | 6/1954 | Burke |
| D174,208 S | 3/1955 | Abidgaard |
| 2,728,838 A | 12/1955 | Barnes |
| D176,942 S | 2/1956 | Cross |
| 2,894,086 A | 7/1959 | Rizer |
| 3,035,155 A | 5/1962 | Hawk |
| 3,059,519 A | 10/1962 | Stanton |
| 3,356,823 A | 12/1967 | Waters et al. |
| 3,555,239 A | 1/1971 | Kerth |
| 3,621,177 A | 11/1971 | McPherson et al. |
| 3,654,421 A | 4/1972 | Streetman et al. |
| 3,739,140 A | 6/1973 | Rotilio |
| 3,866,011 A | 2/1975 | Cole |
| 3,867,769 A | 2/1975 | Schow et al. |
| 3,904,845 A | 9/1975 | Minkiewicz |
| 3,988,913 A | 11/1976 | Metcalfe et al. |
| D243,459 S | 2/1977 | Bliss |
| 4,024,371 A | 5/1977 | Drake |
| 4,041,615 A | 8/1977 | Whitehill |
| D247,421 S | 3/1978 | Driscoll |
| 4,124,944 A | 11/1978 | Blair |
| 4,132,014 A | 1/1979 | Schow |
| 4,237,365 A | 12/1980 | Lambros et al. |
| 4,280,041 A | 7/1981 | Kiessling et al. |
| 4,280,137 A | 7/1981 | Ashida et al. |
| 4,314,125 A | 2/1982 | Nakamura |
| 4,354,087 A | 10/1982 | Osterlitz |
| 4,359,622 A | 11/1982 | Dostoomian et al. |
| 4,375,026 A | 2/1983 | Kearney |
| 4,410,787 A | 10/1983 | Kremers et al. |
| 4,429,266 A | 1/1984 | Traadt |
| 4,452,589 A | 6/1984 | Denison |
| D275,292 S | 8/1984 | Bouman |
| D277,761 S | 2/1985 | Korovin et al. |
| D280,329 S | 8/1985 | Bouman |
| 4,611,111 A | 9/1986 | Baheti et al. |
| 4,616,326 A | 10/1986 | Meier et al. |
| 4,629,860 A | 12/1986 | Lindbom |
| 4,677,277 A | 6/1987 | Cook et al. |
| 4,680,014 A | 7/1987 | Paton et al. |
| 4,689,021 A | 8/1987 | Vasiliev et al. |
| 4,707,582 A | 11/1987 | Beyer |
| 4,716,273 A | 12/1987 | Paton et al. |
| D297,704 S | 9/1988 | Bulow |
| 4,867,685 A | 9/1989 | Brush et al. |
| 4,877,940 A | 10/1989 | Bangs et al. |
| 4,897,521 A | 1/1990 | Burr |
| 4,907,973 A | 3/1990 | Hon |
| 4,931,018 A * | 6/1990 | Herbst ............ G09B 19/24 |
| | | 345/10 |
| 4,973,814 A | 11/1990 | Kojima |
| 4,998,050 A | 3/1991 | Nishiyama et al. |
| 5,034,593 A | 7/1991 | Rice et al. |
| 5,061,841 A | 10/1991 | Richardson |
| 5,089,914 A | 2/1992 | Prescott |
| 5,192,845 A | 3/1993 | Kirmsse et al. |
| 5,206,472 A | 4/1993 | Myking et al. |
| 5,266,930 A | 11/1993 | Ichikawa et al. |
| 5,285,916 A | 2/1994 | Ross |
| 5,305,183 A | 4/1994 | Teynor |
| 5,320,538 A | 6/1994 | Baum |
| 5,337,611 A | 8/1994 | Fleming et al. |
| 5,360,156 A | 11/1994 | Ishizaka et al. |
| 5,360,960 A | 11/1994 | Shirk |
| 5,370,071 A | 12/1994 | Ackermann |
| D359,296 S | 6/1995 | Witherspoon |
| 5,424,634 A | 6/1995 | Goldfarb et al. |
| 5,436,638 A | 7/1995 | Bolas et al. |
| 5,464,957 A | 11/1995 | Kidwell et al. |
| D365,583 S | 12/1995 | Viken |
| 5,562,843 A | 10/1996 | Yasumoto |
| 5,662,822 A | 9/1997 | Tada et al. |
| 5,670,071 A | 9/1997 | Ueyama et al. |
| 5,676,503 A | 10/1997 | Lang |
| 5,676,867 A | 10/1997 | Allen |
| 5,708,253 A | 1/1998 | Bloch et al. |
| 5,710,405 A | 1/1998 | Solomon et al. |
| 5,719,369 A | 2/1998 | White et al. |
| D392,534 S | 3/1998 | Degen et al. |
| 5,728,991 A | 3/1998 | Takada et al. |
| 5,751,258 A | 5/1998 | Fergason et al. |
| D395,296 S | 6/1998 | Kaya et al. |
| D396,238 S | 7/1998 | Schmitt |
| 5,781,258 A | 7/1998 | Debral et al. |
| 5,823,785 A | 10/1998 | Matherne, Jr. |
| 5,835,077 A | 11/1998 | Dao et al. |
| 5,835,277 A | 11/1998 | Hegg |
| 5,845,053 A | 12/1998 | Watanabe et al. |
| 5,877,777 A | 3/1999 | Colwell |
| 5,963,891 A | 10/1999 | Walker et al. |
| 6,008,470 A | 12/1999 | Zhang et al. |
| 6,037,948 A | 3/2000 | Liepa |
| 6,049,059 A | 4/2000 | Kim |
| 6,051,805 A | 4/2000 | Vaidya et al. |
| 6,114,645 A | 9/2000 | Burgess |
| 6,155,475 A | 12/2000 | Ekelof et al. |
| 6,155,928 A | 12/2000 | Burdick |
| 6,230,327 B1 | 5/2001 | Briand et al. |
| 6,236,013 B1 | 5/2001 | Delzenne |
| 6,236,017 B1 | 5/2001 | Smartt et al. |
| 6,242,711 B1 * | 6/2001 | Cooper ............ A61F 9/06 |
| | | 219/130.01 |
| 6,271,500 B1 | 8/2001 | Hirayama et al. |
| 6,330,938 B1 | 12/2001 | Herve et al. |
| 6,330,966 B1 | 12/2001 | Eissfeller |
| 6,331,848 B1 | 12/2001 | Stove et al. |
| D456,428 S | 4/2002 | Aronson et al. |
| 6,373,465 B2 | 4/2002 | Jolly et al. |
| D456,828 S | 5/2002 | Aronson et al. |
| D461,383 S | 8/2002 | Balckburn |
| 6,441,342 B1 | 8/2002 | Hsu |
| 6,445,964 B1 | 9/2002 | White et al. |
| 6,492,618 B1 | 12/2002 | Flood et al. |
| 6,506,997 B2 | 1/2003 | Matsuyama |
| 6,552,303 B1 | 4/2003 | Blankenship et al. |
| 6,560,029 B1 | 5/2003 | Dabble et al. |
| 6,563,489 B1 | 5/2003 | Latypov et al. |
| 6,568,846 B1 | 5/2003 | Cote et al. |
| D475,726 S | 6/2003 | Suga et al. |
| 6,572,379 B1 | 6/2003 | Sears et al. |
| 6,583,386 B1 | 6/2003 | Ivkovich |
| 6,621,049 B2 | 9/2003 | Suzuki |

(56) References Cited

U.S. PATENT DOCUMENTS

| | | | |
|---|---|---|---|
| 6,624,388 B1 * | 9/2003 | Blankenship | B23K 9/1062 |
| | | | 219/130.5 |
| D482,171 S | 11/2003 | Vui et al. | |
| 6,647,288 B2 | 11/2003 | Madill et al. | |
| 6,649,858 B2 | 11/2003 | Wakeman | |
| 6,655,645 B1 | 12/2003 | Lu et al. | |
| 6,660,965 B2 | 12/2003 | Simpson | |
| 6,697,701 B2 | 2/2004 | Hillen et al. | |
| 6,697,770 B1 | 2/2004 | Nagetgaal | |
| 6,703,585 B2 | 3/2004 | Suzuki | |
| 6,708,385 B1 | 3/2004 | Lemelson | |
| 6,710,298 B2 | 3/2004 | Eriksson | |
| 6,710,299 B2 | 3/2004 | Blankenship et al. | |
| 6,715,502 B1 | 4/2004 | Rome et al. | |
| D490,347 S | 5/2004 | Meyers | |
| 6,730,875 B2 | 5/2004 | Hsu | |
| 6,734,393 B1 * | 5/2004 | Friedl | A61F 9/067 |
| | | | 219/130.01 |
| 6,744,011 B1 | 6/2004 | Hu et al. | |
| 6,750,428 B2 | 6/2004 | Okamoto et al. | |
| 6,765,584 B1 | 7/2004 | Matthias | |
| 6,772,802 B2 | 8/2004 | Few | |
| 6,788,442 B1 | 9/2004 | Potin et al. | |
| 6,795,778 B2 | 9/2004 | Dodge et al. | |
| 6,798,974 B1 | 9/2004 | Nakano et al. | |
| 6,857,553 B1 | 2/2005 | Hartman et al. | |
| 6,858,817 B2 | 2/2005 | Blankenship et al. | |
| 6,865,926 B2 | 3/2005 | O'Brien et al. | |
| D504,449 S | 4/2005 | Butchko | |
| 6,920,371 B2 | 7/2005 | Hillen et al. | |
| 6,940,039 B2 | 9/2005 | Blankenship et al. | |
| 7,021,937 B2 | 4/2006 | Simpson et al. | |
| 7,024,342 B1 | 4/2006 | Waite | |
| 7,126,078 B2 | 10/2006 | Demers et al. | |
| 7,132,617 B2 | 11/2006 | Lee et al. | |
| 7,170,032 B2 | 1/2007 | Flood | |
| 7,194,447 B2 | 3/2007 | Harvey et al. | |
| 7,247,814 B2 | 7/2007 | Ott | |
| D555,446 S | 11/2007 | Picaza Ibarrondo | |
| 7,315,241 B1 | 1/2008 | Daily et al. | |
| D561,973 S | 2/2008 | Kinsley et al. | |
| 7,353,715 B2 | 4/2008 | Myers | |
| 7,363,137 B2 | 4/2008 | Brant et al. | |
| 7,375,304 B2 | 5/2008 | Kainec et al. | |
| 7,381,923 B2 | 6/2008 | Gordon et al. | |
| 7,414,595 B1 | 8/2008 | Muffler | |
| 7,465,230 B2 | 12/2008 | LeMay et al. | |
| 7,478,108 B2 | 1/2009 | Townsend et al. | |
| D587,975 S | 3/2009 | Aronson et al. | |
| 7,516,022 B2 | 4/2009 | Lee et al. | |
| 7,580,821 B2 | 8/2009 | Schirm | |
| D602,057 S | 10/2009 | Osicki | |
| 7,621,171 B2 | 11/2009 | O'Brien | |
| D606,102 S | 12/2009 | Bender et al. | |
| 7,643,890 B1 | 1/2010 | Hillen et al. | |
| 7,687,741 B2 | 3/2010 | Kainec et al. | |
| D614,217 S | 4/2010 | Peters et al. | |
| D615,573 S | 5/2010 | Peters et al. | |
| 7,817,162 B2 | 10/2010 | Bolick et al. | |
| 7,853,645 B2 | 12/2010 | Brown et al. | |
| D631,074 S | 1/2011 | Peters et al. | |
| 7,874,921 B2 | 1/2011 | Baszucki et al. | |
| 7,970,172 B1 | 6/2011 | Hendrickson | |
| 7,972,129 B2 | 7/2011 | O'Donoghue | |
| 7,991,587 B2 | 8/2011 | Ihn | |
| 8,069,017 B2 | 11/2011 | Hallquist | |
| 8,100,694 B2 * | 1/2012 | Portoghese | F41A 33/02 |
| | | | 434/21 |
| 8,224,881 B1 | 7/2012 | Spear et al. | |
| 8,248,324 B2 | 8/2012 | Nangle | |
| 8,265,886 B2 | 9/2012 | Bisiaux et al. | |
| 8,274,013 B2 | 9/2012 | Wallace | |
| 8,287,522 B2 | 10/2012 | Moses et al. | |
| 8,316,462 B2 | 11/2012 | Becker et al. | |
| 8,363,048 B2 | 1/2013 | Gering | |
| 8,365,603 B2 | 2/2013 | Lesage et al. | |
| 8,512,043 B2 | 8/2013 | Choquet | |
| 8,569,646 B2 | 10/2013 | Daniel et al. | |
| 8,680,434 B2 | 3/2014 | Stoger | |
| 8,692,157 B2 * | 4/2014 | Daniel | B23K 10/006 |
| | | | 219/125.1 |
| 8,747,116 B2 | 6/2014 | Zboray | |
| 8,777,629 B2 | 7/2014 | Kreindl et al. | |
| RE45,062 E | 8/2014 | Maguire | |
| 8,834,168 B2 * | 9/2014 | Peters | G09B 5/02 |
| | | | 345/427 |
| 8,851,896 B2 | 10/2014 | Wallace et al. | |
| 8,860,760 B2 | 10/2014 | Chen | |
| RE45,398 E | 3/2015 | Wallace | |
| 9,193,558 B2 | 11/2015 | Matthews et al. | |
| 9,196,169 B2 | 11/2015 | Wallace | |
| 9,293,056 B2 | 3/2016 | Zboray | |
| 9,293,057 B2 | 3/2016 | Zboray | |
| 9,318,026 B2 | 4/2016 | Peters et al. | |
| 9,323,056 B2 | 4/2016 | Williams | |
| 9,761,153 B2 | 9/2017 | Zboray | |
| 2001/0045808 A1 | 11/2001 | Hietmann et al. | |
| 2001/0052893 A1 | 12/2001 | Jolly et al. | |
| 2002/0032553 A1 | 3/2002 | Simpson et al. | |
| 2002/0046999 A1 | 4/2002 | Veikkolainen et al. | |
| 2002/0050984 A1 | 5/2002 | Roberts | |
| 2002/0085843 A1 | 7/2002 | Mann | |
| 2002/0175897 A1 | 11/2002 | Pelosi | |
| 2003/0000931 A1 | 1/2003 | Ueda et al. | |
| 2003/0014212 A1 * | 1/2003 | Ralston | G01C 11/06 |
| | | | 702/150 |
| 2003/0023592 A1 | 1/2003 | Modica et al. | |
| 2003/0025884 A1 | 2/2003 | Hamana et al. | |
| 2003/0075534 A1 | 4/2003 | Okamoto | |
| 2003/0106787 A1 | 6/2003 | Santilli | |
| 2003/0111451 A1 | 7/2003 | Blankenship et al. | |
| 2003/0172032 A1 | 9/2003 | Choquet | |
| 2003/0186199 A1 * | 10/2003 | McCool | G09B 19/24 |
| | | | 434/219 |
| 2003/0234885 A1 | 12/2003 | Pilu | |
| 2004/0020907 A1 | 2/2004 | Zauner et al. | |
| 2004/0035990 A1 | 2/2004 | Ackeret | |
| 2004/0050824 A1 | 3/2004 | Samler | |
| 2004/0088071 A1 | 5/2004 | Kouno | |
| 2004/0140301 A1 | 7/2004 | Blankenship et al. | |
| 2004/0181382 A1 | 9/2004 | Hu | |
| 2005/0007504 A1 | 1/2005 | Fergason | |
| 2005/0017152 A1 | 1/2005 | Fergason | |
| 2005/0029326 A1 | 2/2005 | Henrikson | |
| 2005/0046584 A1 | 3/2005 | Breed | |
| 2005/0050168 A1 | 3/2005 | Wen et al. | |
| 2005/0101767 A1 | 5/2005 | Clapham et al. | |
| 2005/0103766 A1 | 5/2005 | Iizuka et al. | |
| 2005/0103767 A1 | 5/2005 | Kainec et al. | |
| 2005/0109735 A1 | 5/2005 | Flood | |
| 2005/0128186 A1 | 6/2005 | Shahoian et al. | |
| 2005/0133488 A1 | 7/2005 | Blankenship | |
| 2005/0159840 A1 | 7/2005 | Lin et al. | |
| 2005/0163364 A1 | 7/2005 | Beck | |
| 2005/0189336 A1 | 9/2005 | Ku | |
| 2005/0199602 A1 | 9/2005 | Kaddani et al. | |
| 2005/0230573 A1 | 10/2005 | Ligertwood | |
| 2005/0252897 A1 | 11/2005 | Hsu | |
| 2005/0275913 A1 | 12/2005 | Vesely et al. | |
| 2005/0275914 A1 | 12/2005 | Vesely et al. | |
| 2006/0014130 A1 | 1/2006 | Weinstein | |
| 2006/0076321 A1 | 4/2006 | Maev | |
| 2006/0136215 A1 | 6/2006 | Choquet | |
| 2006/0154226 A1 | 7/2006 | Maxfield | |
| 2006/0163227 A1 * | 7/2006 | Hillen | B23K 9/095 |
| | | | 219/130.01 |
| 2006/0163228 A1 | 7/2006 | Daniel | |
| 2006/0166174 A1 | 7/2006 | Rowe | |
| 2006/0169682 A1 | 8/2006 | Kainec et al. | |
| 2006/0173619 A1 | 8/2006 | Brant et al. | |
| 2006/0189260 A1 | 8/2006 | Sung | |
| 2006/0207980 A1 * | 9/2006 | Jacovetty | B23K 9/1062 |
| | | | 219/130.5 |
| 2006/0213892 A1 | 9/2006 | Ott | |

(56) References Cited

U.S. PATENT DOCUMENTS

| | | |
|---|---|---|
| 2006/0214924 A1 | 9/2006 | Kawamoto et al. |
| 2006/0226137 A1 | 10/2006 | Huismann et al. |
| 2006/0252543 A1 | 11/2006 | Van Noland et al. |
| 2006/0258447 A1 | 11/2006 | Baszucki et al. |
| 2007/0034611 A1 | 2/2007 | Drius et al. |
| 2007/0038400 A1 | 2/2007 | Lee et al. |
| 2007/0045488 A1 | 3/2007 | Shin |
| 2007/0088536 A1 | 4/2007 | Ishikawa |
| 2007/0112889 A1 | 5/2007 | Cook et al. |
| 2007/0198117 A1 | 8/2007 | Wajihuddin |
| 2007/0211026 A1 | 9/2007 | Ohta |
| 2007/0221797 A1 | 9/2007 | Thompson et al. |
| 2007/0256503 A1 | 11/2007 | Wong et al. |
| 2007/0277611 A1 | 12/2007 | Portzgen et al. |
| 2007/0291035 A1 | 12/2007 | Vesely et al. |
| 2008/0031774 A1 | 2/2008 | Magnant et al. |
| 2008/0038702 A1* | 2/2008 | Choquet .............. A61B 5/1124 434/260 |
| 2008/0078811 A1 | 4/2008 | Hillen et al. |
| 2008/0078812 A1 | 4/2008 | Peters et al. |
| 2008/0117203 A1 | 5/2008 | Gering |
| 2008/0120075 A1 | 5/2008 | Wloka |
| 2008/0128398 A1 | 6/2008 | Schneider |
| 2008/0135533 A1 | 6/2008 | Ertmer et al. |
| 2008/0140815 A1 | 7/2008 | Brant et al. |
| 2008/0149686 A1 | 7/2008 | Daniel et al. |
| 2008/0203075 A1 | 8/2008 | Feldhausen et al. |
| 2008/0233550 A1 | 9/2008 | Solomon |
| 2008/0314887 A1 | 12/2008 | Stoger et al. |
| 2009/0015585 A1 | 1/2009 | Klusza |
| 2009/0021514 A1 | 1/2009 | Klusza |
| 2009/0045183 A1 | 2/2009 | Artelsmair et al. |
| 2009/0050612 A1 | 2/2009 | Serruys et al. |
| 2009/0057286 A1 | 3/2009 | Ihara et al. |
| 2009/0152251 A1 | 6/2009 | Dantinne et al. |
| 2009/0173726 A1 | 7/2009 | Davidson et al. |
| 2009/0184098 A1 | 7/2009 | Daniel et al. |
| 2009/0200281 A1 | 8/2009 | Hampton |
| 2009/0200282 A1 | 8/2009 | Hampton |
| 2009/0231423 A1* | 9/2009 | Becker .............. A61F 9/06 348/82 |
| 2009/0259444 A1 | 10/2009 | Dolansky et al. |
| 2009/0298024 A1* | 12/2009 | Batzler .............. B23K 9/32 434/234 |
| 2009/0325699 A1 | 12/2009 | Delgiannidis |
| 2010/0012017 A1 | 1/2010 | Miller |
| 2010/0012637 A1 | 1/2010 | Jaeger |
| 2010/0048273 A1 | 2/2010 | Wallace et al. |
| 2010/0062405 A1 | 3/2010 | Zboray et al. |
| 2010/0062406 A1 | 3/2010 | Zboray et al. |
| 2010/0096373 A1 | 4/2010 | Hillen et al. |
| 2010/0121472 A1 | 5/2010 | Babu et al. |
| 2010/0133247 A1 | 6/2010 | Mazumder et al. |
| 2010/0133250 A1 | 6/2010 | Sardy et al. |
| 2010/0176107 A1 | 7/2010 | Bong |
| 2010/0201803 A1 | 8/2010 | Melikian |
| 2010/0224610 A1 | 9/2010 | Wallace |
| 2010/0276396 A1 | 11/2010 | Cooper et al. |
| 2010/0299101 A1 | 11/2010 | Shimada et al. |
| 2010/0307249 A1 | 12/2010 | Lesage et al. |
| 2011/0006047 A1 | 1/2011 | Penrod et al. |
| 2011/0060568 A1 | 3/2011 | Goldfine et al. |
| 2011/0091846 A1 | 4/2011 | Kreindl et al. |
| 2011/0114615 A1 | 5/2011 | Daniel et al. |
| 2011/0116076 A1 | 5/2011 | Chantry et al. |
| 2011/0117527 A1 | 5/2011 | Conrardy et al. |
| 2011/0122495 A1 | 5/2011 | Togashi |
| 2011/0183304 A1 | 7/2011 | Wallace et al. |
| 2011/0248864 A1 | 10/2011 | Becker et al. |
| 2011/0316516 A1 | 12/2011 | Schiefermuller et al. |
| 2012/0018993 A1 | 1/2012 | Boegli, et al. |
| 2012/0077174 A1* | 3/2012 | DePaul .............. G09B 7/02 434/322 |
| 2012/0122062 A1* | 5/2012 | Yang .............. G09B 9/00 434/219 |
| 2012/0180180 A1* | 7/2012 | Steve .............. A61F 9/067 2/12 |
| 2012/0189993 A1 | 7/2012 | Kindig et al. |
| 2012/0291172 A1 | 11/2012 | Wills et al. |
| 2012/0298640 A1* | 11/2012 | Conrardy .............. B23K 37/04 219/130.01 |
| 2013/0026150 A1 | 1/2013 | Chantry et al. |
| 2013/0040270 A1* | 2/2013 | Albrecht .............. B23K 9/00 434/234 |
| 2013/0075380 A1 | 3/2013 | Albrech et al. |
| 2013/0189656 A1* | 7/2013 | Zboray .............. G06F 3/011 434/219 |
| 2013/0189657 A1 | 7/2013 | Wallace et al. |
| 2013/0189658 A1 | 7/2013 | Peters et al. |
| 2013/0206741 A1* | 8/2013 | Pfeifer .............. B23K 9/095 219/130.01 |
| 2013/0327747 A1 | 12/2013 | Dantinne |
| 2014/0038143 A1 | 2/2014 | Daniel et al. |
| 2014/0134580 A1 | 5/2014 | Becker |
| 2014/0184496 A1* | 7/2014 | Gribetz .............. G02B 27/017 345/156 |
| 2014/0220522 A1 | 8/2014 | Peters |
| 2014/0263224 A1 | 9/2014 | Becker |
| 2014/0272835 A1* | 9/2014 | Becker .............. G09B 19/24 434/234 |
| 2014/0272836 A1 | 9/2014 | Becker |
| 2014/0272837 A1* | 9/2014 | Becker .............. G09B 19/24 434/234 |
| 2014/0272838 A1 | 9/2014 | Becker |
| 2015/0056584 A1* | 2/2015 | Boulware .............. B23K 9/173 434/234 |
| 2015/0056585 A1* | 2/2015 | Boulware .............. B23K 9/16 434/234 |
| 2015/0056586 A1 | 2/2015 | Penrod et al. |
| 2015/0234189 A1 | 8/2015 | Lyons |
| 2015/0268473 A1 | 9/2015 | Yajima |
| 2016/0125763 A1 | 5/2016 | Becker |
| 2016/0165220 A1 | 6/2016 | Fujimaki |
| 2016/0188277 A1 | 6/2016 | Miyasaka |
| 2016/0260261 A1 | 9/2016 | Hsu |
| 2016/0331592 A1 | 11/2016 | Stewart |
| 2017/0045337 A1 | 2/2017 | Kim |

FOREIGN PATENT DOCUMENTS

| | | |
|---|---|---|
| CN | 201083660 Y | 7/2008 |
| CN | 101419755 A1 | 4/2009 |
| CN | 201229711 Y | 4/2009 |
| CN | 101571887 A | 11/2009 |
| CN | 101587659 | 11/2009 |
| CN | 101587659 A | 11/2009 |
| CN | 101587859 | 11/2009 |
| CN | 101661589 | 3/2010 |
| CN | 102053563 | 5/2011 |
| CN | 102083580 | 6/2011 |
| CN | 10265504 | 8/2011 |
| CN | 102165505 | 8/2011 |
| CN | 202684308 | 1/2013 |
| CN | 103871279 A | 6/2014 |
| CN | 105209207 | 12/2015 |
| DE | 28 33 638 A1 | 2/1980 |
| DE | 30 46 634 A1 | 1/1984 |
| DE | 32 44 307 A1 | 5/1984 |
| DE | 35 22 581 A1 | 1/1987 |
| DE | 4037879 A1 | 6/1991 |
| DE | 196 15 069 A1 | 10/1997 |
| DE | 197 39 720 C1 | 10/1998 |
| DE | 19834205 A1 | 2/2000 |
| DE | 200 09 543 U1 | 8/2001 |
| DE | 10 2005 047 204 A1 | 4/2007 |
| DE | 10 2010 038 902 A1 | 2/2012 |
| DE | 202012013151 U1 | 2/2015 |
| EP | 0 108 599 A1 | 5/1984 |
| EP | 0 127 299 | 12/1984 |
| EP | 0 145 891 A1 | 6/1985 |
| EP | 319623 B1 | 10/1990 |

(56) References Cited

FOREIGN PATENT DOCUMENTS

| | | |
|---|---|---|
| EP | 0852986 A1 | 7/1998 |
| EP | 1 527 852 A1 | 5/2005 |
| EP | 1905533 A2 | 4/2008 |
| ES | 2 274 736 A1 | 5/2007 |
| FR | 1456780 | 3/1965 |
| FR | 2 827 066 A1 | 1/2003 |
| FR | 2 926 660 A1 | 7/2009 |
| GB | 1 455 972 | 11/1976 |
| GB | 1 511 608 | 5/1978 |
| GB | 2 254 172 A | 9/1992 |
| GB | 2435838 A | 9/2007 |
| GB | 2 454 232 A | 5/2009 |
| JP | 478719 | 10/1972 |
| JP | 5098035 | 8/1975 |
| JP | 2-224877 | 9/1990 |
| JP | 05-329645 | 12/1993 |
| JP | 07-047471 | 2/1995 |
| JP | 07-232270 | 9/1995 |
| JP | 08-505091 | 4/1996 |
| JP | 08-150476 | 6/1996 |
| JP | 08-132274 | 5/1998 |
| JP | 11104833 | 4/1999 |
| JP | 2000-167666 A | 6/2000 |
| JP | 2001-071140 A | 3/2001 |
| JP | 2002278670 A | 9/2002 |
| JP | 2003-200372 A | 7/2003 |
| JP | 2003-326362 A | 11/2003 |
| JP | 2006-006604 A | 1/2006 |
| JP | 2006-175205 | 7/2006 |
| JP | 2006-281270 A | 10/2006 |
| JP | 2007-290025 A | 11/2007 |
| JP | 2009-500178 A | 1/2009 |
| JP | 2009160636 A | 7/2009 |
| JP | 2010231792 | 10/2010 |
| JP | 2012024867 A | 2/2012 |
| KR | 100876425 | 12/2008 |
| KR | 1000876425 | 12/2008 |
| KR | 20090010693 | 1/2009 |
| KR | 20110068544 | 6/2011 |
| RU | 2008 108 601 C1 | 11/2009 |
| SU | 1038963 A1 | 8/1983 |
| WO | 98/45078 | 10/1998 |
| WO | 0112376 A1 | 2/2001 |
| WO | 01/43910 | 6/2001 |
| WO | 0158400 A1 | 8/2001 |
| WO | 2005102230 A1 | 11/2005 |
| WO | 2006034571 A1 | 4/2006 |
| WO | 2007009131 | 1/2007 |
| WO | 2007039278 | 4/2007 |
| WO | 2009120921 | 1/2009 |
| WO | 2009060231 A1 | 5/2009 |
| WO | 2010020867 | 8/2009 |
| WO | 2009149740 A1 | 12/2009 |
| WO | 2010000003 A2 | 1/2010 |
| WO | 2010020870 | 2/2010 |
| WO | 2010044982 | 4/2010 |
| WO | 2010091493 A1 | 8/2010 |
| WO | 2011045654 A1 | 4/2011 |
| WO | 2011058433 | 5/2011 |
| WO | 2011067447 A1 | 6/2011 |
| WO | 2011097035 A2 | 8/2011 |
| WO | 2011148258 | 12/2011 |
| WO | 2012082105 A1 | 6/2012 |
| WO | 2012143327 A1 | 10/2012 |
| WO | 2013014202 A1 | 1/2013 |
| WO | 2013061518 | 5/2013 |
| WO | 2013114189 A1 | 8/2013 |
| WO | 2013175079 A1 | 11/2013 |
| WO | 2014007830 A1 | 1/2014 |
| WO | 2014019045 A1 | 2/2014 |
| WO | 2014020386 | 2/2014 |
| WO | 2014020429 | 2/2014 |
| WO | 2014140721 | 8/2014 |
| WO | 2014140682 | 9/2014 |
| WO | 2014140710 | 9/2014 |
| WO | 2014140719 | 9/2014 |
| WO | 2014140722 | 9/2014 |
| WO | 2016137578 | 9/2016 |

OTHER PUBLICATIONS

Kenneth Fast, et al.; National Shipbuilding Research Program (NSRP); Virtual Welding—a Low Cost Virtual Reality Welder Training System; Phase II Final Report Feb. 29, 2012.

International Search Report for PCT/IB2009/00605.

Robert Schoder, "Design and Implementation of a Video Sensor for Closed Loop Control of Back Bead Weld Puddle Width," Massachusetts, Institute of Technology, Dept. of Mechanical Engineering, May 27, 1983, 64 pages.

Hills and Steele, Jr.; "Data Parallel Algorithms", Communications of the ACM, Dec. 1986, vol. 29, No. 12, p. 1170.

Nancy C. Porter, J. Allan Cote, Timothy D. Gifford, and Wim Lam, Virtual Reality Welder Training, 29 pages, dated Jul. 14, 2006.

J.Y. (Yosh) Mantinband, Hillel Goldenberg, Llan Kleinberger, Paul Kleinberger, Autosteroscopic, field-sequential display with full freedom of movement OR Let the display were the shutter-glasses, 3ality (Israel) Ltd., 8 pages, 2002.

ARS Electronica Linz Gmbh, Fronius, 2 pages, May 18, 1997.

D.K. Aidun and S.A. Martin, "Penetration in Spot GTA Welds during Centrifugation," Journal of Material Engineering and Performance vol. 7(5), 4 pages, Oct. 1998—597.

Arc+ simulator; httl://www.123arc.com/en/depliant_ang.pdf; 2 pages, 2000.

Glen Wade, "Human uses of ultrasound: ancient and modern", Ulrasonics vol. 38, 5 pages, dated 2000.

ASME Definitions, Consumables, Welding Positions, 4 pages, dated Mar. 19, 2001. See http://www.gowelding.com/asme4.htm.

M. Abbas, F. Waeckel, Code Aster (Software) EDF (France), 14 pages, Oct. 2001.

Achim Mahrle, Jurgen Schmidt, "The influence of fluid flow phenomena on the laser beam welding process"; International Journal of Heat and Fluid Flow 23, 10 pages, dated 2002.

The Lincoln Electric Company; CheckPoint Production Monitoring brochure; four (4) pages; http://www.lincolnelectric.com/assets/en_US/products/literature/s232.pdf; Publication S2.32; 4 pages, Issue Date Feb. 2012.

G. Wang, P.G. Huang, and Y.M. Zhang; "Numerical Analysis of Metal Transfer in Gas Metal Arc Welding," Departments of Mechanical and Electrical Engineering. University of Kentucky, 10 pages, Dec. 10, 2001.

Desroches, X.; Code-Aster, Note of use for alclculations of welding; Instruction manual U2.03 booklet: Thermomechincal; Document: U2.03.05; 13 pages, Oct. 1, 2003.

Fast, K. et al., "Virtual Training for Welding", Mixed and Augmented Reality, 2004, ISMAR 2004, Third IEEE and SM International Symposium on Arlington, VA, 2 pages, Nov. 2-5, 2004.

Cooperative Research Program, Virtual Reality Welder Training, Summary Report SR 0512, 4 pages, Jul. 2005.

Porter, et al., Virtual Reality Training, Paper No. 2005-P19, 14 pages, 2005.

Eduwelding+, Weld Into the Future; Online Welding Seminar—A virtual training environment; 123arc.com; 4 pages, 2005.

Miller Electric MFG Co.; MIG Welding System features weld monitoring software; NewsRoom 2010 (Dialog® File 992); © 2011 Dialog. 2010; http://www.dialogweb.com/cgi/dwclient?reg=133233430487; three (3) pages; printed Mar. 8, 2012.

M. Abida and M. Siddique, Numerical simulation to study the effect of tack welds and root gap on welding deformations and residual stresses of a pipe-flange joint, Faculty of Mechanical Engineering, GIK Institute of Engineering Sciences and Technology, Topi, NWFP, Pakistan, 12 pages, Available on-line Aug. 25, 2005.

Abbas, M. et al. .; Code_Aster; Introduction to Code_Aster; User Manual; Booklet U1.0-: Introduction to Code_Aster; Document: U1.02.00; Version 7.4; 14 pages, Jul. 22, 2005.

Mavrikios D et al, A prototype virtual reality-based demonstrator for immersive and interactive simulation of welding processes, Inter-

(56) References Cited

OTHER PUBLICATIONS national Journal of Computer Integrated manufacturing, Taylor and Francis, Basingstoke, GB, vol. 19, No. 3, 8 pages, Apr. 1, 2006, pp. 294-300.

Nancy C. Porter, Edison Welding Institute; J. Allan Cote, General Dynamics Electric Boat; Timothy D. Gifford, VRSim; and Wim Lam, FCS Controls; Virtual Reality Welder Trainer, Sessiion 5: Joining Technologies for Naval Applications, 16 pages, earliest date Jul. 14, 2006 (http://weayback.archive.org).

T Borzecki, G. Bruce, Y.S. Han, M. Heinemann, A. Imakita, L. Josefson, W. Nie, D. Olson, F. Roland, and Y. Takeda, 16th International Shop and Offshore Structures Congress: Aug. 20-25, 2006: Southhampton, UK, 49 pages, vol. 2 Specialist Committee V.3 Fabrication Technology Committee Mandate.

Ratnam and Khalid: "Automatic classification of weld defects using simulated data and an MLP neutral network." Insight vol. 49, No. 3; 6 pages, Mar. 2007.

Wang et al., Study on welder training by means of haptic guidance and virtual reality for arc welding, 2006 IEEE International Conference on Robotics and Biomimetics, ROBIO 2006 ISBN-10: 1424405718, 5 pages, p. 954-958.

CS Wave, The Virtual Welding Trainer, 6 pages, 2007.

asciencetutor.com, A division of Advanced Science and Automation Corp., VWL (Virtual Welding Lab), 2 pages, 2007.

Eric Linholm, John Nickolls, Stuart Oberman, and John Montrym, "NVIDIA Testla: A Unifired Graphics and Computing Architecture", IEEE Computer Society, 17 pages, 2008.

NSRP ASE, Low-Cost Virtual Realtiy Welder Training System, 1 Page, 2008.

Edison Welding Institute, E-Weld Predictor, 3 pages, 2008.

CS Wave, A Virtual learning tool for welding motion, 10 pages, Mar. 14, 2008.

The Fabricator, Virtual Welding, 4 pages, Mar. 2008.

N. A. Tech., P/NA.3 Process Modeling and Optimization, 11 pages, Jun. 4, 2008.

FH Joanneum, Fronius—virtual welding, 2 pages, May 12, 2008.

Eduwelding+, Training Activities with arc+ simulator; Weld Into the Future, Online Welding Simulator—A virtual training environment; 123arc.com; 6 pages, May 2008.

ChemWeb.com, Journal of Materials Engineering and Performance (v.7, #5), 3 pgs., printed Sep. 26, 2012.

Choquet, Claude; "Arc+: Today's Virtual Reality Solution for Welders" Internet Page, 6 pages, Jan. 1, 2008.

Juan Vicenete Rosell Gonzales, "RV-Sold: simulator virtual para la formacion de soldadores"; Deformacion Metalica, Es. vol. 34, No. 301, 14 pages, Jan. 1, 2008.

White et al., Virtual welder training, 2009 IEEE Virtual Reality Conference, 1 page, p. 303, 2009.

Training in a virtual environment gives welding students a leg up, retrieved on Apr. 12, 2010 from: http://www.thefabricator.com/article/arcwelding/virtually-welding, 4 pages.

Sim Welder, retrieved on Apr. 12, 2010 from: http://www.simwelder.com, 2 pages.

P. Beatriz Garcia-Allende, Jesus Mirapeix, Olga M. Conde, Adolfo Cobo and Jose M. Lopez-Higuera; Defect Detection in Arc-Welding Processes by Means of the Line-to-Continuum Method and Feature Selection; www.mdpi.com/journal/sensors; 2009; 18 pages; Sensors 2009, 9, 7753-7770; doi; 10.3390/s91007753.

Production Monitoring 2 brochure, four (4) pages, The Lincoln Electric Company, May 2009.

International Search Report and Written Opinion from PCT/IB10/02913, 11 pages, dated Apr. 19, 2011.

Bjorn G. Agren; Sensor Integration for Robotic Arc Welding; 1995; vol. 5604C of Dissertations Abstracts International p. 1123; Dissertation Abs Online (Dialog® File 35): © 2012 ProQuest Info& Learning: http://dialogweb.com/cgi/dwclient?req=1331233317524; one (1) page; printed Mar. 8, 2012.

J. Hu and Hi Tsai, Heat and mass transfer in gas metal arc welding. Part 1: the arc, found in ScienceDirect, International Journal of Heat and Mass Transfer 50 (2007), 14 pages, 833-846 Available on Line on Oct. 24, 2006 http://www.web.mst.edu/~tsai/publications/HU-IJHMT-2007-1-60.pdf.

M. Ian Graham, Texture Mapping, Carnegie Mellon University Class 15-462 Computer Graphics, Lecture 10, 53 pages, dated Feb. 13, 2003.

The Lincoln Electric Company, CheckPoint Operator's Manual, 188 pages, issue date Aug. 2015.

Russel and Norvig, "Artificial Intelligence: A Modem Approach", Prentice-Hall (Copyright 1995).

Mechanisms and Mechanical Devices Source Book, Chironis, Neil Sclater-, McGraw Hill; 2nd Addition, 1996.

ARC+ Welding Simulation presentation; 25 pages.

Bender Shipbuilding and Repair Co. Virtual Welding—A Low Cost Virtual Reality Welding Training System. Proposal submitted pursuant to MSRP Advanced Shipbuilding Enterprise Research Announcement, Jan. 23, 2008. 28 pages, See also, http://www.nsrp.org/6-PresentationsM/D/020409 Virtual Welding Wilbur.pdf.

Aiteanu, Dorian; and Graser, Axel. "Generation and Rendering of a Virtual Welding Seam in an Augmented Reality Training Environment." Proceedings of the Sixth IASTED International Conference on Visualization, Imaging and Image Processing, Aug. 28-30, 2006, 8 pages, allegedly Palma de Mallorca, Spain. Ed. J.J. Villaneuva. ACTA Press.

Tschirner, Petra; Hillers, Bernd; and Graser, Axel "A Concept for the Application of Augmented Reality in Manual Gas Metal Arc Welding." Proceedings of the International Symposium on Mixed and Augmented Reality; 2 pages; 2002.

Penrod, Matt. "New Welder Training Tools." EWI PowerPoint presentation; 16 pages allegedly 2008.

Fite-Georgel, Pierre. Is there a Reality in Industrial Augmented Reality? 10th IEEE International Symposium on Mixed and Augmented Reality (ISMAR). 10 pages, allegedly 2011.

Hillers, B.; Graser, A. "Real time Arc-Welding Video Observation System." 62nd International Conference of IIW, Jul. 12-17, 2009, 5 pages, allegedly Singapore 2009.

Advance Program of American Welding Society Programs and Events. Nov. 11-14, 2007. 31 pages. Chicago.

Terebes: examples from http://www.terebes.uni-bremen.de.; 6 pages.

Sandor, Christian; Gudrun Klinker. "PAARTI: Development of an Intelligent Welding Gun for BMW." PIA2003, 7 pages, Tokyo. 2003.

ARVIKA Forum Vorstellung Projekt PAARI. BMW Group Virtual Reality Center. 4 pages. Nuernberg. 2003.

Sandor, Christian; Klinker, Gudrun. "Lessons Learned in Designing Ubiquitous Augmented Reality User Interfaces." 21 pages, allegedly from Emerging Technologies of Augmented Reality: Interfaces Eds. Haller, M.; Billinghurst, M.; Thomas, B. Idea Group Inc. 2006.

Impact Welding: examples from current and archived website, trade shows, etc. See, e.g., http://www.impactwelding.com. 53 pages.

Http://www.nsrp.org/6-Presentations/WDVirtual_Welder.pdf (Virtual Reality Welder Training, Project No. SI051, Navy ManTech Program, Project Review for ShipTech 2005); 22 pages. Biloxi, MS.

Https://app.aws_org/w/r/www/wj/2005/031WJ_2005_03.pdf (AWS Welding Journal, Mar. 2005 (see, e.g., p. 54)).; 114 pages.

Https://app.aws.org/conferences/defense/live index.html (AWS Welding in the Defense Industry conference schedule, 2004); 12 pages.

https://app.aws.org/wj/2004/04/052/njc (AWS Virtual Reality Program to Train Welders for Shipbuilding, workshop information, 2004); 7 pages.

https://app.aws.org/wj/2007/11WJ200711.pdf (AWS Welding Journal, Nov. 2007); 240 pages.

American Welding Society, "Vision for Welding Industry"; 41 pages.

Energetics, Inc. "Welding Technology Roadmap", Sep. 2000, 38 pages.

Aiteanu, Dorian; and Graser, Axel. Computer-Aided Manual Welding Using an Augmented Reality Supervisor Sheet Metal Welding Conference XII, Livonia, MI, May 9-12, 2006, 14 pages.

Hillers, Bend; Aiteanu, Dorin and Graser, Axel Augmented Reality—Helmet for the Manual Welding Process. Institute of Automation, University of Bremen, Germany; 21 pages.

(56) References Cited

OTHER PUBLICATIONS

Aiteanu, Darin, Hillers, Bernd and Graser, Axel "A Step Forward in Manual Welding: Demonstration of Augmented Reality Helmet" Institute of Automation, University of Bremen, Germany, Proceedings of the Second IEEE and ACM International Symposium on Mixed and Augmented Reality; 2003; 2 pages.

ArcSentry Weld Quality Monitoring System; Native American Technologies, allegedly 2002, 5 pages.

P/NA.3 Process Modelling and Optimization; Native American Technologies, allegedly 2002, 5 pages.

B. Hillers, D. Aitenau, P. Tschimer, M. Park, A. Graser, B. Balazs, L. Schmidt, "TEREBES: Welding Helmet with AR capabilities", Institute of Automatic University Bremen; Institute of Industrial Engineering and Ergonomics, 10 pages, allegedly 2004.

Sheet Metal Welding Conference XI r, American Welding Society Detroit Section, May 2006, 11 pages.

Kenneth Fast, Timothy Gifford, Robert Yancey, "Virtual Training for Welding", Proceedings of the Third IEEE and ACM International Symposium on Mixed and Augmented Reality (ISMAR 2004); 2 pages.

Amended Answer to Complaint with Exhibit A for Patent Infringement filed by Seabery North America Inc. in *Lincoln Electric Co. et al.* v. *Seabery Soluciones, S.L. et al.*, Case No. 1:15-cv-01575-DCN, docket No. 44, filed Mar. 1, 2016, in the U.S. District Court for the Northern District of Ohio; 19 pages.

Amended Answer to Complaint with Exhibit A for Patent Infringement filed by Seabery Soluciones SL in *Lincoln Electric Co. et al.* v. *Seabery Soluciones, S.L_ et al.*, Case No. 1:15-cv-01575-DCN, docket No. 45, filed Mar. 1, 2016 in the U.S. District Court for the Northern District of Ohio; 19 pages.

Reply to Amended Answer to Complaint for Patent Infringement filed by Lincoln Electric Company; Lincoln Global, Inc. in *Lincoln Electric Co. et al.* v. *Seabery Soluciones, S.L. et al.*, Case No. 1:15-cv-01575-DCN; docket No. 46, filed Mar. 22, 2016; 5 pages.

Answer for Patent Infringement filed by Lincoln Electric Company, Lincoln Global, Inc. in *Lincoln Electric Co. et al.* v. *Seabery Soluciones, S.L. et al.*, Case No. 1:15-cv-01575-DCN; docket No. 47, filed Mar. 22, 2016; 5 pages.

Petition for Inter Partes Review of U.S. Pat. No. 8,747,116; IPR 2016-00749; Apr. 7, 2016; 70 pages.

Petition for Inter Partes Review of U.S. Pat. No. RE45,398; IPR 2016-00840; Apr. 18, 2016; 71 pages.

Petition for Inter Partes Review of U.S. Pat. No. 9,293,056; IPR 2016-00904; May 9, 2016; 91 pages.

Petition for Inter Partes Review of U.S. Pat. No. 9,293,057; IPR 2016-00905; dated May 9, 2016; 87 pages.

http://www.vrsim.net/history, downloaded Feb. 26, 2016 10:04:37 pm.

Complaint for Patent Infringement in *Lincoln Electric Co. et al.* v. *Seabery Soluciones, S.L. et al.*, Case No. 1:15-av-01575-DCN, docket No. 1, filed Aug. 10, 2015, in the U.S. District Court for the Northern District of Ohio; 81 pages.

Kobayashi, Ishigame, and Kato, Simulator of Manual Metal Arc Welding with Haptic Display ("Kobayashi 2001"), Proc. of the 11th International Conf. on Artificial Reality and Telexistence (ICAT), Dec. 5-7, 2001, pp. 175-178, Tokyo, Japan.

Wahi, Maxwell, and Reaugh, "Finite-Difference Simulation of a Multi-Pass Pipe Weld" ("Wahi"), vol. L, paper ¾, International Conference on Structural Mechanics in Reactor Technology, San Francisco, CA, Aug. 15-19, 1977.

Declaration of Dr. Michael Zyda, May 3, 2016, exhibit to IPR 2016-00749.

Declaration of Edward Bohnert, Apr. 27, 2016, exhibit to IPR 2016-00749.

Swantec corporate web page downloaded Apr. 19, 2016. httpl/www.swantec.com/technology/numerical-simulation/.

Catalina, Stefanescu, Sen, and Kaukler, Interaction of Porosity with a Planar Solid/Liquid Interface (Catalina,), Metallurgical and Materials Transactions, vol. 35A, May 2004, pp. 1525-1538.

Fletcher Yoder Opinion re RE45398 and U.S. Appl. No. 14/589,317; including appendices; Sep. 9, 2015; 1700 pages.

Kobayashi, Ishigame, and Kato, "Skill Training System of Manual Arc Welding by Means of Face-Shield-Like HMD and Virtual Electrode" ("Kobayashi 2003"), Entertainment Computing, vol. 112 of the International Federation for Information Processing (IFIP), Springer Science + Business Media, New York, copyright 2003, pp. 389-396.

G.E. Moore, No exponential is forever: but Forever can be delayed!: IEEE International Solid-State Circuits Conference, 2003. 19 pages.

High Performance Computer Architectures_ A Historical Perspective, downloaded May 5, 2016. http://homepages.inf.ed.ac.uk/cgi/mi/comparch. pl?Paru/perf.html,Paru/perf-f.html,Paru/menu-76.html; 3 pages.

Hoff et al. "Computer vision-based registration techniques for augmented reality." Proceedings of Intelligent Robots and Computer Vision XV, SPIE vol. 2904, Nov. 18-22, 1996, Boston, MA, pp. 538-548.

TEREBES: examples from http://www.terebes.uni-bremen.de.; 10 pages; Hillers, et al; Welding Helmet with AR Capabilities; 2002.

American Welding Society, "Vision for Welding Industry"; 41 pages; 2017 American Welding Society.

Arc Welding Simulation Presentation; 25 Pages, Seabery North America; IPR2016-00840; *Seabery* v. *Lincoln*. Exh. 1011; 2016.

Johannes Hirche, Alexander Ehlert, Stefan Guthe, Michael Doggett, Hardware Accelerated Per-Pixel Displacement Mapping, 8 Pages; London, Ontario, Canada—May 17-19, 2004.

Rodriguez, Jose M., et al. SIMPOR/CESOL, "RV-SOLD" Welding Simulator, Technical and Functional Features, 20 pages. 2010.

Applications of Micro-computer in Robotic Technology written by Sun Yaoming; Scientific and Technical Documentation Press; Sep. 1987; Unfiled book book No. 15176-818.

Aidun, Daryush K; Influence of Simulated High-g on the Weld size of A1-Li Alloy; Acta Astronautica vol. 48, No. 2-3, pp. 153-156, 2001; published by Elsevier Science Ltd. (rec'd Sep. 13, 2000).

Applications of Micro-computer in Robotic Technology written by Sun Yaoming; Scientific and Technical Documentation Press; Sep. 1987; Unified book No. 15176-818; Originally submitted on Mar. 31, 2017 without English Translation.

Andreas Grahn, "Interactive Simulation of Contrast Fluid using Smoothed Particle Hydrodynamics," Jan. 1, 2008, Masters Thesis in Computing Science, Umea University, Department of Computing Science, Umea Sweden; 69 pages.

Marcus Vesterlund, Simulation and Rendering of a Viscous Fluid using Smoothed Particle Hydrodynamics, Dec. 3, 2004, Master's Thesis in Computing Science, Umea University, Department of Computing Science, Umea Sweden; 46 pages.

M. Muller,, et al., Point Based Animation of Elastic, Plastic and Melting Objects, Eurographics/ACM SIGGRAPH Symposium on Computer Animation (2004); 11 pages.

Andrew Nealen, "Point-Based Animation of Elastic, Plastic, and Melting Objects," CG topics, Feb. 2005; 2 pages.

D. Tonnesen, Modeling Liquids and Solids using Thermal Particles, Proceedings of Graphics Interface'91, pp. 255-262, Calgary, Alberta, 1991.

CUDA Programming Guide Version 1.1, Nov. 29, 2007. 143 pages.

Websters II new college dictionary, 3rd ed., Houghton Mifflin Co., copyright 2005, Boston, MA, p. 1271, definition of Wake. 3 pages.

Da Dalto L, et al. "CS Wave: Learning welding motion in a virtual environment" Published in Proceedings of the IIW International Conference, Jul. 10-11, 2008; 19 pages.

CS Wave-Manual, "Virtual Welding Workbench User Manual 3.0" 2007; 25 pages.

Choquet, Claude. ARC+®: Today's Virtual Reality Solution for Welders, Published in Proceedings of the IIW International Conference; Jul. 10-11, 2008; 19 pages.

Welding Handbook, Welding Science & Technology, American Welding Society, Ninth Ed., Copyright 2001. Appendix A Terms and Definitions 54 pages.

Virtual Welding: A Low Cost Virtual Reality Welder Training System, NSRP RA Jul. 2011—BRP Oral Review Meeting in Charleston, SC at ATI, Mar. 2008; 6 pages.

(56) References Cited

OTHER PUBLICATIONS

Dorin Aiteanu Virtual and Augmented Reality Supervisor for a New Welding Helmet Dissertation Nov. 15, 2005; 154 pages.
Screen Shot of CS Wave Exercise 135.FWPG Root Pass Level 1 https://web.archive.org/web/20081128081858/http:/wave.c-s.fr/images/english/snap_evolution2.Jpg; 1 page.
Screen Shot of CS Wave Control Centre V3.0.0 https://web.archive.org/web/20081128081915/http:/wave.c-s.fr/images/english/snap_evolution4.jpg; 1 page.
Screen Shot of CS Wave Control Centre V3.0.0 https://web.archive.org/web/20081128081817/http:/wave.c-s.fr/images/english/snap_evolution6.jpg; 1 page.
Da Dalto L, et al. "CS Wave A Virtual learning tool for the welding motion," Mar. 14, 2008; 10 pages.
Nordruch, Stefan, et al. "Visual Online Monitoring of PGMAW Without a Lighting Unit", Jan. 2005; 14 pages.
The Evolution of Computer Graphics; Tony Tamasi, NVIDIA, 2008; 36 pages.
VRSim Powering Virtual Reality, www.lincolnelectric.com/en-us/eguipment/Irainings-eguipment/Pages/powered-by-'rsim.aspx, 2016, 1 page.
Hillers, B.; Graser, A. "Direct welding arc observation without harsh flicker," 8 pages, allegedly FABTECH International and AWS welding show, 2007.
Declaration of Dr. Michael Zyda, May 3, 2016, exhibit to IPR 2016-00905; 72 pages.
Declaration of Edward Bohnart, Apr. 27, 2016, exhibit to IPR 2016-00905; 23 pages.
Declaration of Dr. Michael Zyda, May 3, 2016, exhibit to IPR 2016-00904; 76 pages.
Declaration of Edward Bohnart, Apr. 27, 2016, exhibit to IPR 2016-00904; 22 pages.
Declaration of Axel Graeser, Apr. 17, 2016, exhibit to IPR 2016-00840; 88 pages.
http://www.sciencedirect.com/science/article/pit/S009457650000151X.
Arc+—Archived Press Release from WayBack Machine from Jan. 31, 2008-Apr. 22, 2013, Page, https://web.3rchive.org/web/20121006041803/http://www.123certification.com/en/article_press/index.htm, Jan. 21, 2016, 3 pages.
P. Tschirner et al., Virtual and Augmented Reality for Quality Improvement of Manual Welds National Institute of Standards and Technology, Jan. 2002, Publication 973, 24 pages.
Y. Wang et al., "Impingement of Filler Droplets and Weld Pool During Gas Metal Arc Welding Process" International Journal of Heat and Mass Transfer, Sep. 1999, 14 pages.
Larry Jeffus, Welding Principles and Applications.Sixth Edition, 2008, 10 pages.
R.J. Renwick et al., "Experimental Investigation of GTA Weld Pool Oscillations" Welding Research—Supplement to the Welding Journal, Feb. 1983, 7 pages.
Matt Phar, GPU Gems 2 Programming Techniques for High-Performance Graphics and General-Purpose Computation 2005, 12 pages.
Chuansong Wu: "Microcomputer-based welder training simulator", Computers in Industry, vol. 20, No. 3, Oct. 1992, 5 pages, pp. 321-325, XP000205597, Elsevier Science Publishers, Amsterdam, NL.
ViziTech USA, retrieved on Mar. 27, 2014 from http://vizitechusa.com/, 2 pages.
Guu and Rokhlin ,Technique for Simultaneous Real-Time Measurements of Weld Pool Surface Geometry and Arc Force, 10 pages, Dec. 1992.
William T. Reeves, "Particles Systems—A Technique for Modeling a Class of Fuzzy Objects", Computer Graphics 17:3 pp. 359-376, 1983, 17 pages.
S.B. Chen, L. Wu, Q. L. Wang and Y. C. Liu, Self-Learning Fuzzy Neural Networks and Computer Vision for Control of Pulsed GTAW, 9 pages, dated May 1997.

Patrick Rodjito, Position tracking and motion prediction using Fuzzy Logic, 81 pages, 2006, Colby College.
D'Huart, Deat, and Lium; Virtual Environment for Training, 6th International Conference, ITS 20002, 6 pages, Jun. 2002.
Konstantinos Nasios (Bsc), Improving Chemical Plant Safety Training Using Virtual Reality, Thesis submitted to the University of Nottingham for the Degree of Doctor of Philosophy, 313 pages, Dec. 2001.
ANSI/A WS D 10.11 MID 10. 11 :2007 Guide for Root Pass Welding of Pipe without Backing Edition: 3rd American Welding Society / Oct. 13, 2006/36 pages ISBN: 0871716445, 6 pages.
M. Jonsson, L. Karlsson, and L-E Lindgren, Simulation of Tack Welding Procedures in Butt Joint Welding of Plates Welding Research Supplement, Oct. 1985, 7 pages.
Isaac Brana Veiga, Simulation of a Work Cell in the IGRIP Program, dated 2006, 50 pages.
Balijepalli, A. and Kesavadas, Haptic Interfaces for Virtual Environment and Teleoperator Systems, Haptics 2003, 7-.,Department of Mechanical & Aerospace Engineering, State University of New York at Buffalo, NY.
Yao et al., 'Development of a Robot System for Pipe Welding'. 2010 International Conference on Measuring Technology and Mechatronics Automation. Retrieved from the Internet: http://ieeexplore.ieee.org/stamp/stamp.jsp?tp=&arnumber=5460347&tag=1; pp. 1109-1112, 4 pages.
Steve Mann, Raymond Chun Bing Lo, Kalin Ovtcharov, Shixiang Gu, David Dai, Calvin Ngan, Tao Ai, Realtime HDR (High Dynamic Range) Video for Eyetap Wearable Computers, FPGA-Based Seeing Aids, and Glasseyes (EYETAPS), 2012 25th IEEE Canadian Conference on Electrical and Computer Engineering (CCECE),pp. 1-6, 6 pages, Apr. 29, 2012.
Kyt Dotson, Augmented Reality Welding Helmet Prototypes How Awsome the Technology Can Get, Sep. 26, 2012, Retrieved from the Internet: URL:http://siliconangle.com/blog/2012/09/26/augmented-reality-welding-helmet-prototypes-how-awesome-the-technology-can-get/,1 page, retrieved on Sep. 26, 2014.
Terrence O'Brien, "Google's Project Glass gets some more details",Jun. 27, 2012 (Jun. 27, 2012), Retrieved from the Internet: http://www.engadget.com/2012/06/27/googles-project-glass-gets-some-more-details/, 1 page, retrieved on Sep. 26, 2014.
T. Borzecki, G. Bruce, YS. Han, et al., Specialist Committee V.3 Fabrication Technology Committee Mandate, Aug. 20-25, 2006, 49 pages, vol. 2, 16th International Ship and Offshore Structures Congress, Southampton, UK.
G. Wang, P.G. Huang, and Y.M. Zhang: "Numerical Analysis of Metal Transfer in Gas Metal Arc Welding": Departments of Mechanical Engineering; and Electrical and Computer Engineering, University of Kentucky, Lexington, KY 40506-0108, 10 pages, Dec. 10, 2001.
Echtler et al, "17 The Intelligent Welding Gun: Augmented Reality for Experimental Vehicle Construction," Virtual and Augmented Reality Applications in Manufacturing (2003) pp. 1-27.
Teeravarunyou et al, "Computer Based Welding Training System," International Journal of Industrial Engineering (2009) 16(2): 116-125.
Antonelli et al, "A Semi-Automated Welding Station Exploiting Human-Robot Interaction," Advanced Manufacturing Systems and Technology (2011) pp. 249-260.
Praxair Technology Inc, "The RealWeld Trainer System: Real Weld Training Under Real Conditions" Brochure (2013) 2 pages.
United States Provisional Patent Application for "System for Characterizing Manual Welding Operations on Pipe and Other Curved Structures," U.S. Appl. No. 62/055,724, filed Sep. 26, 2014, 35 pages.
Lincoln Global, Inc., "VRTEX 360: Virtual Reality Arc Welding Trainer" Brochure (2015) 4 pages.
Wuhan Onew Technology Co Ltd, "ONEW-360 Welding Training Simulator" http://en.onewtech.com/_d276479751.htm as accessed on Jul. 10, 2015, 12 pages.
The Lincoln Electric Company, "VRTEX Virtual Reality Arc Welding Trainer," http://www.lincolnelectric.com/en-us/equipment/training-equipment/Pages/vrtex.aspx as accessed on Jul. 10, 2015, 3 pages.

(56) References Cited

OTHER PUBLICATIONS

Miller Electric Mfg Co, "LiveArc: Welding Performance Management System" Owner's Manual, (Jul. 2014) 64 pages.
Miller Electric Mfg Co, "LiveArc Welding Performance Management System" Brochure, (Dec. 2014) 4 pages.
Echtler, et al.; The Intelligent Welding Gun: Augmented Reality for Experimental Vehicle Constructions; In: Virtual and Augmented Reality Applications in Manufacturing. Ong S.K and Nee A.YC.C, EDS. Springer Verlag 2003. 28 Pages.
Extended Search Report—PCT/US2010/060129 dated Jun. 6, 2017.
Application No. 14 732 357.0-1016—EP Examination Report dated Dec. 2, 2018.
Extended European Search Report dated Apr. 24, 2018 for appl. No. 17001804.8-1016.

\* cited by examiner

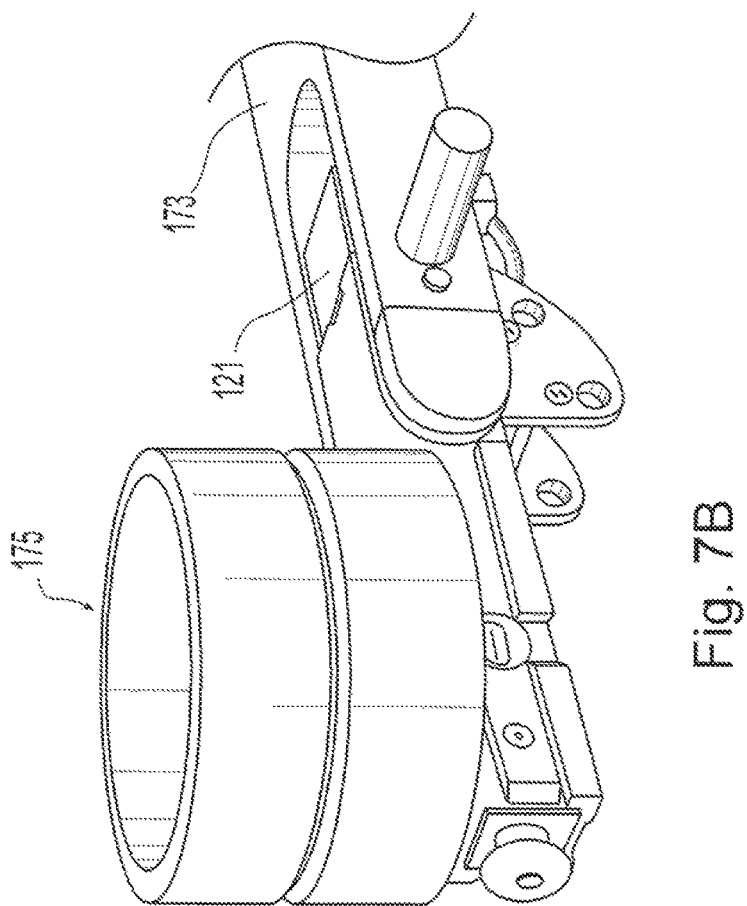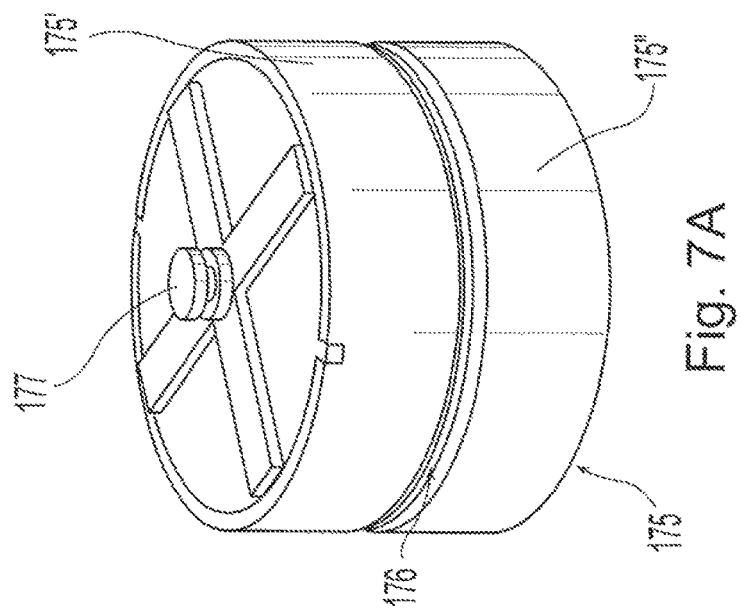

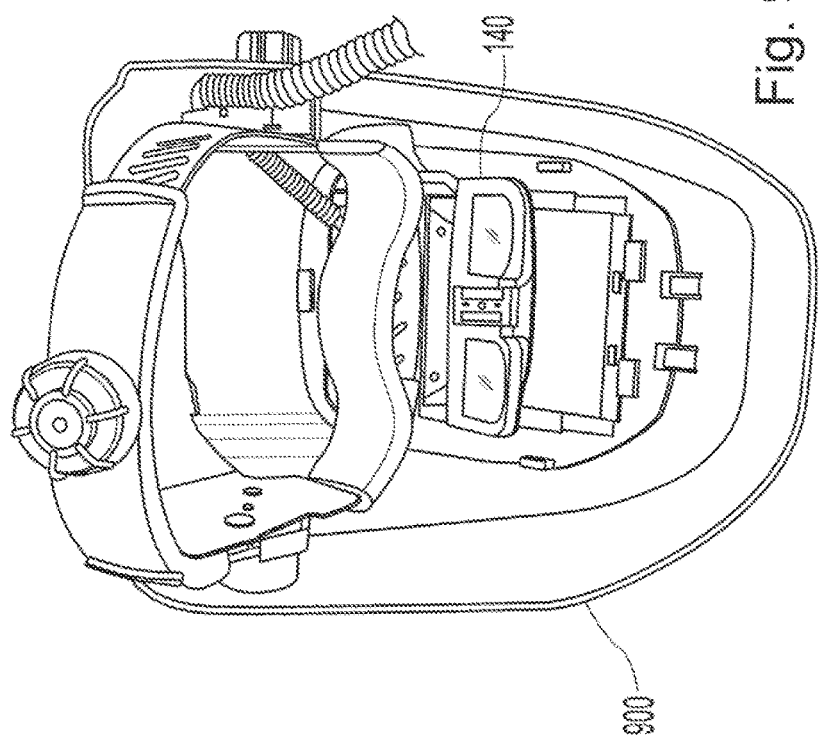
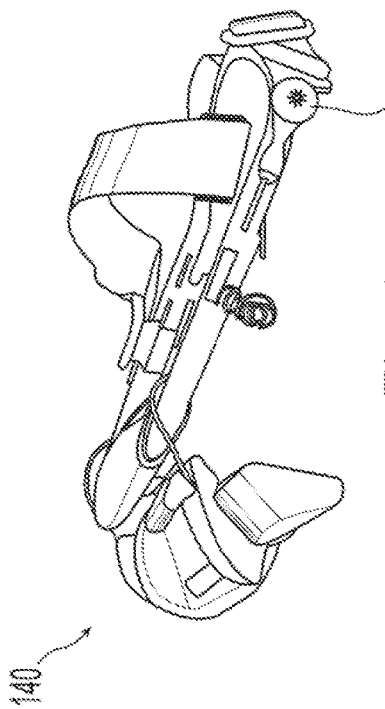
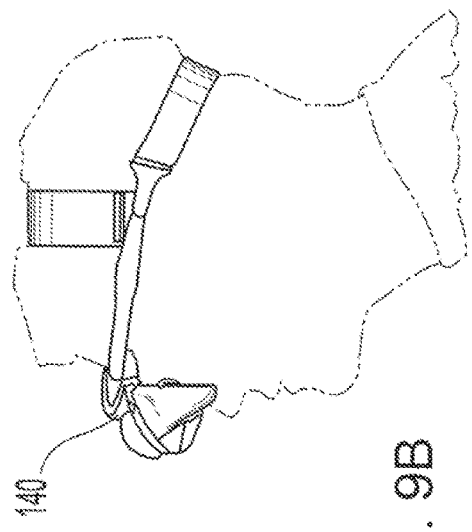
Fig. 9A
Fig. 9B
Fig. 9C

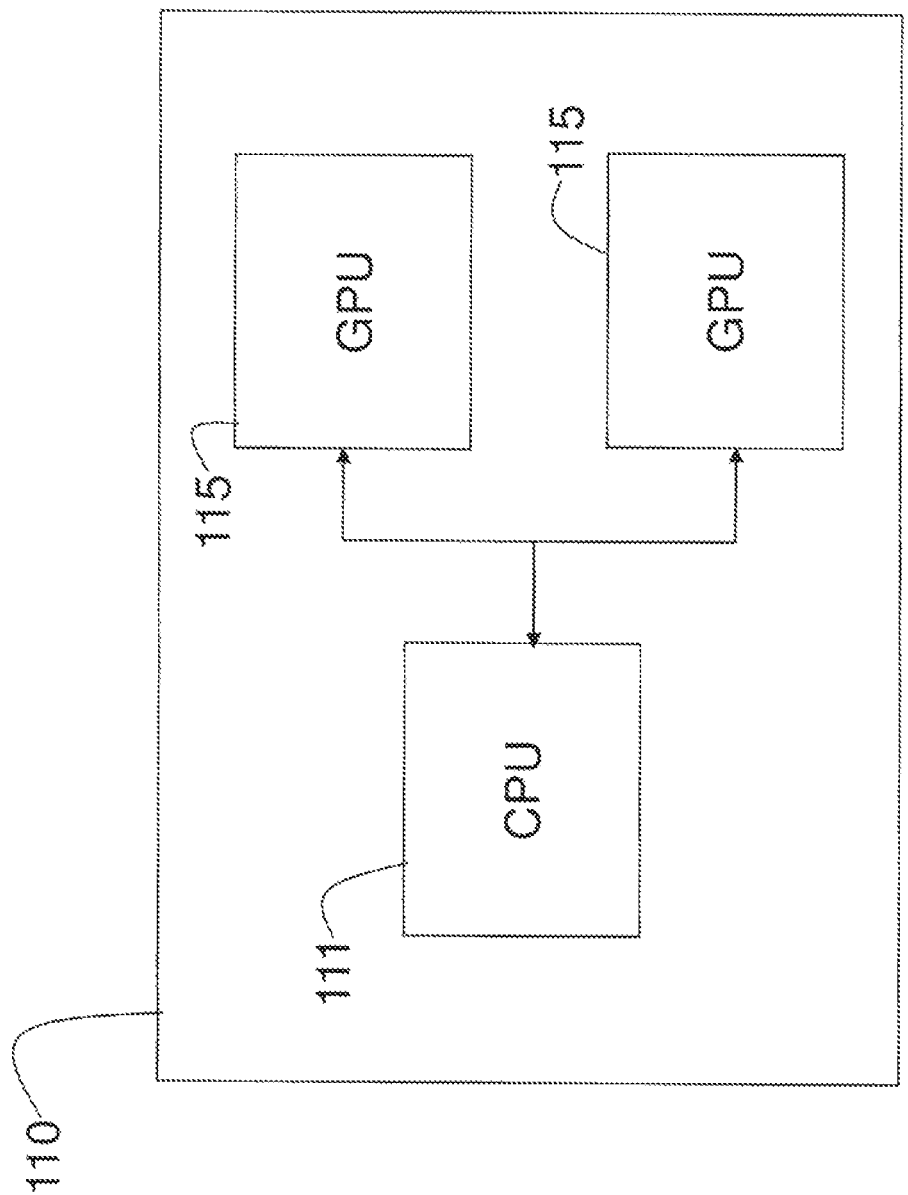

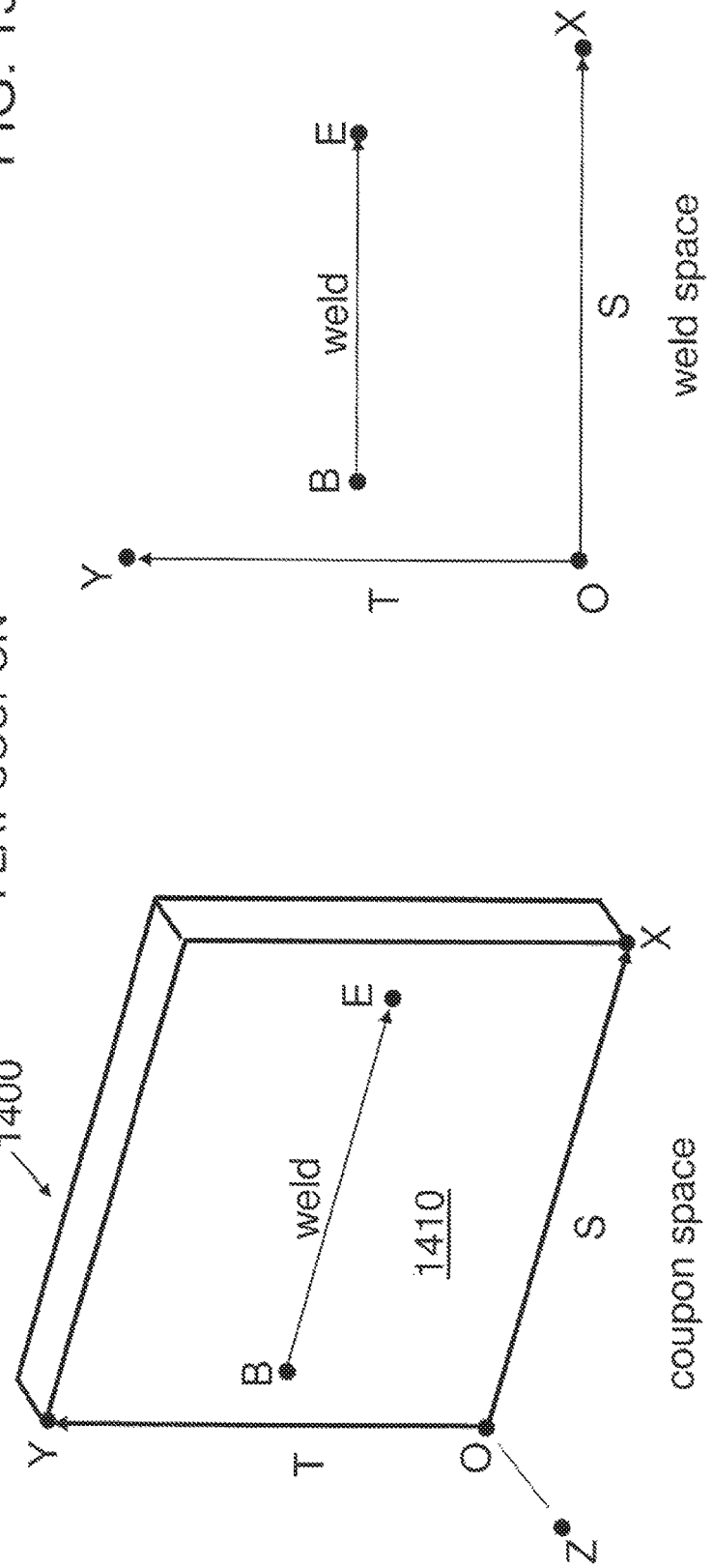

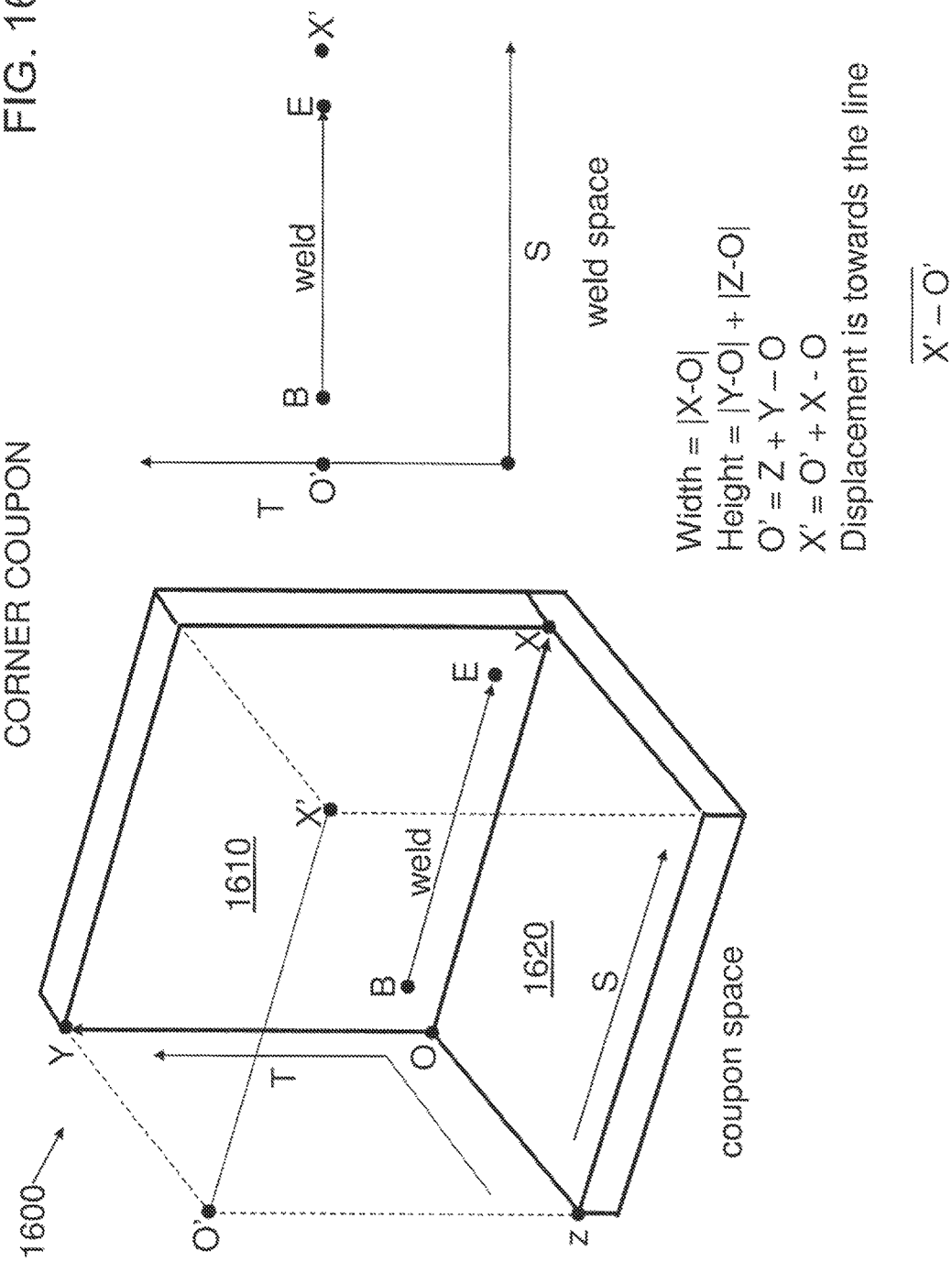

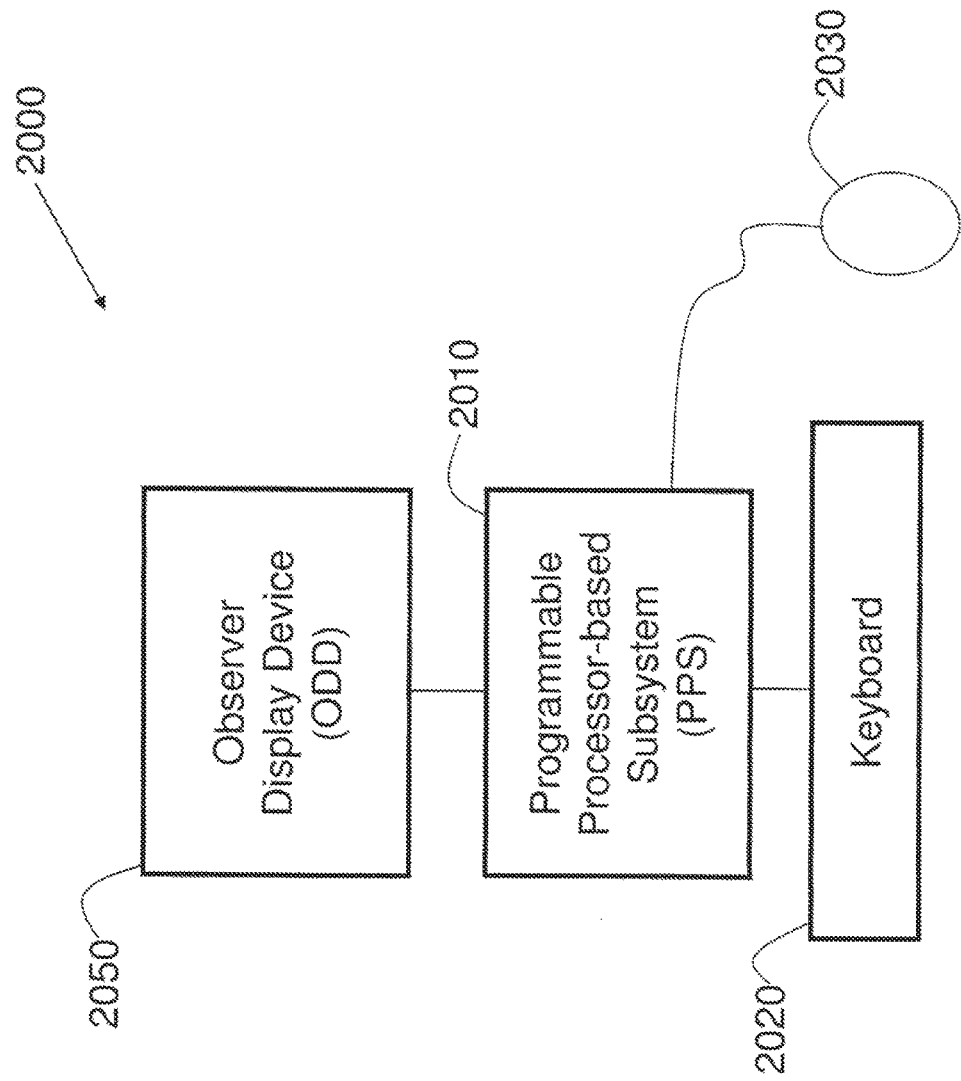

SYSTEMS AND METHODS PROVIDING ENHANCED EDUCATION AND TRAINING IN A VIRTUAL REALITY ENVIRONMENT

This U.S. patent application claims priority to and is a divisional patent application of U.S. patent application Ser. No. 13/792,300 filed on Mar. 11, 2013, which is a continuation-in-part (CIP) patent application of pending U.S. patent application Ser. No. 13/081,725 filed on Apr. 7, 2011 which is incorporated herein by reference in its entirety and which claims priority to U.S. provisional patent application Ser. No. 61/349,029 filed on May 27, 2010, and which further claims priority to and is a continuation-in-part (CIP) patent application of pending U.S. patent application Ser. No. 12/501,257 filed on Jul. 10, 2009 which is incorporated herein by reference in its entirety.

TECHNICAL FIELD

Certain embodiments relate to virtual reality simulation. More particularly, certain embodiments relate to systems and methods for enhancing welding education and training in a virtual environment.

BACKGROUND

In real world welding and training, a welding student may have to use real welding equipment and materials which can be expensive. Furthermore, a real world welding environment can present safety hazards to the student and, therefore, an instructing institution may have to carry significant liability insurance which can be costly. The ability for a welding student to easily understand what he is doing incorrectly, and to make corrections, can take much time in a real world welding environment and consume much time of a welding instructor. Furthermore, the ability to readily access additional educational materials or welding instructor help may be very limited in real world welding environment.

Further limitations and disadvantages of conventional, traditional, and proposed approaches will become apparent to one of skill in the art, through comparison of such approaches with embodiments of the present invention as set forth in the remainder of the present application with reference to the drawings.

SUMMARY

One embodiment provides a virtual reality arc welding system. The system includes a programmable processor-based subsystem, a spatial tracker operatively connected to the programmable processor-based subsystem, at least one mock welding tool configured to be spatially tracked by the spatial tracker, and at least one user interface configured to allow a user to perform one or more of inputting information into the system and making selections. The system further includes a communication component operatively connected to the programmable processor-based subsystem and configured to access an external communication infrastructure. Furthermore, the virtual reality welding system is configured to direct a user to one or more pre-identified web sites on the internet, in response to a user request, related to welding education and theory via the external communication infrastructure using the communication component.

Another embodiment provides a virtual reality arc welding system. The system includes a programmable processor-based subsystem, a spatial tracker operatively connected to the programmable processor-based subsystem, at least one mock welding tool configured to be spatially tracked by the spatial tracker, and at least one display device operatively connected to the programmable processor-based subsystem. The system is configured to simulate, in a virtual reality environment, a weld puddle that is responsive to manipulation of the at least one mock welding tool by a user and has real-time molten metal fluidity and heat dissipation characteristics, and display the simulated weld puddle on the at least one display device in real-time. The system is further configured to overlay and display an image of an ideal weld puddle onto the simulated weld puddle when at least one characteristic of the simulated weld puddle deviates more than a determined amount from an ideal amount of the at least one characteristic.

A further embodiment provides a virtual reality arc welding system. The system includes a programmable processor-based subsystem operable to execute coded instructions. The coded instructions include a rendering engine configured to generate a three-dimensional (3D) rendering of a virtual weldment created by a user on the virtual reality welding system. The coded instructions further include an analysis engine configured to perform simulated testing of the 3D virtual weldment and generate corresponding test data. The coded instructions also include at least one intelligent agent (IA) configured to generate recommended corrective actions for the user, based on at least the test data.

Another embodiment provides a method. The method includes displaying a virtual welding environment to a user on one or more display devices of a virtual reality welding system, wherein the virtual welding environment is generated by the virtual reality welding system and simulates one or more unsafe conditions within the virtual welding environment. The method further includes allowing the user to proceed with performing a virtual welding activity using the virtual reality welding system after the user has correctly identified the one or more unsafe conditions to the virtual reality welding system via a user interface of the virtual reality welding system.

A further embodiment provides a method. The method includes setting a plurality of welding parameters on a virtual reality welding system for a welding process, wherein at least one of the welding parameters is improperly set for the welding process. The method also includes a user performing a virtual welding activity using the virtual reality welding system having the set plurality of welding parameters to create a virtual weldment. The method further includes the user observing the virtual weldment on at least one display device of the virtual reality welding system and attempting to identify the at least one improperly set welding parameter based at least on the observing.

These and other features of the claimed invention, as well as details of illustrated embodiments thereof, will be more fully understood from the following description and drawings.

BRIEF DESCRIPTION OF THE DRAWINGS

FIG. 7A illustrates an example embodiment of a pipe welding coupon (WC) of the system of FIG. 1;

FIG. 7B illustrates the pipe WC of FIG. 7A mounted in an arm of the table/stand (TS) of FIG. 6;

FIG. 9A illustrates an example embodiment of a face-mounted display device (FMDD) of the system of FIG. 1;

FIG. 9B is an illustration of how the FMDD of FIG. 9A is secured on the head of a user;

FIG. 9C illustrates an example embodiment of the FMDD of FIG. 9A mounted within a welding helmet;

FIG. 10 illustrates an example embodiment of a subsystem block diagram of a programmable processor-based subsystem (PPS) of the system of FIG. 1;

FIG. 15 illustrates an example embodiment of a coupon space and a weld space of a flat welding coupon (WC) simulated in the system of FIG. 1;

FIG. 16 illustrates an example embodiment of a coupon space and a weld space of a corner (tee joint) welding coupon (WC) simulated in the system of FIG. 1;

FIG. 20 illustrates an example embodiment of a stand-alone virtual weldment inspection (VWI) system capable of simulating inspection of a virtual weldment and displaying an animation of the virtual weldment under inspection to observe the effects due to various characteristics associated with the weldment;

DETAILED DESCRIPTION

Data representing defects or discontinuities may be captured as part of the definition of a virtual weldment, either by pre-defining the virtual weldment or by creating a virtual weldment using a virtual reality welding simulator system (e.g., a virtual reality arc welding (VRAW) system) as part of a virtual welding process. The VRAW system comprises a programmable processor-based subsystem, a spatial tracker operatively connected to the programmable processor-based subsystem, at least one mock welding tool capable of being spatially tracked by the spatial tracker, and at least one display device operatively connected to the programmable processor-based subsystem. The system is capable of simulating, in a virtual reality space, a weld puddle having real-time molten metal fluidity and heat dissipation characteristics. The system is also capable of displaying the simulated weld puddle on the display device in real-time. The real-time molten metal fluidity and heat dissipation characteristics of the simulated weld puddle provide real-time visual feedback to a user of the mock welding tool when displayed, allowing the user to adjust or maintain a welding technique in real-time in response to the real-time visual feedback (i.e., helps the user learn to weld correctly). The displayed weld puddle is representative of a weld puddle that would be formed in the real-world based on the user's welding technique and the selected welding process and parameters. By viewing a puddle (e.g., shape, color, slag, size, stacked dimes), a user can modify his technique to make a good weld and determine the type of welding being done. The shape of the puddle is responsive to the movement of the gun or stick. As used herein, the term "real-time" means perceiving and experiencing in time in a simulated environment in the same way that a user would perceive and experience in a real-world welding scenario. Furthermore, the weld puddle is responsive to the effects of the physical environment including gravity, allowing a user to realistically practice welding in various positions including overhead welding and various pipe welding angles (e.g., 1G, 2G, 5G, 6G). Such a real-time virtual welding scenario results in the generating of data representative of a virtual weldment.

Figure 1:
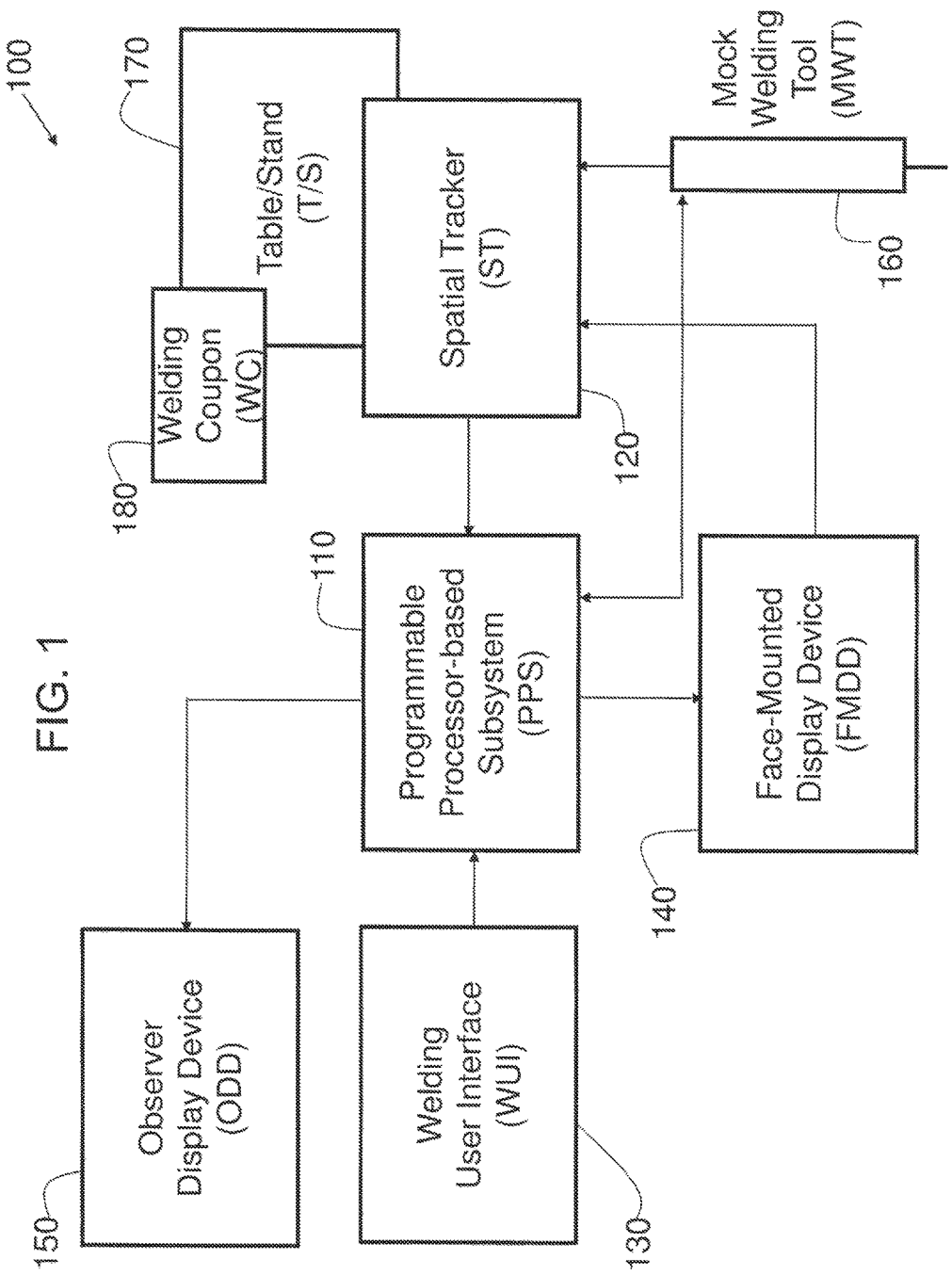
FIG. 1 illustrates an example embodiment of a system block diagram of a system providing arc welding training in a real-time virtual reality environment.

FIG. 1 illustrates an example embodiment of a system block diagram of a system 100 providing arc welding training in a real-time virtual reality environment. The system 100 includes a programmable processor-based subsystem (PPS) 110. The PPS 110 provides the hardware and software configured as a rendering engine for providing 3D animated renderings of virtual weldments. The PPS 110 also provides hardware and software configured as an analysis engine for performing testing and inspection of a virtual weldment. In the context of the system of FIG. 1, a virtual weldment is the resultant simulation of a welding coupon that has gone through a simulated welding process to form a weld bead or weld joint.

The system 100 further includes a spatial tracker (ST) 120 operatively connected to the PPS 110. The system 100 also includes a physical welding user interface (WUI) 130 operatively connected to the PPS 110 and a face-mounted display device (FMDD) 140 (see FIGS. 9A-9C) operatively connected to the PPS 110 and the ST 120. However, certain embodiments may not provide a FMDD. The system 100 further includes an observer display device (ODD) 150 operatively connected to the PPS 110. The system 100 also includes at least one mock welding tool (MWT) 160 operatively connected to the ST 120 and the PPS 110. The system 100 further includes a table/stand (T/S) 170 and at least one welding coupon (WC) 180 capable of being attached to the T/S 170. In accordance with an alternative embodiment of the present invention, a mock gas bottle is provided (not shown) simulating a source of shielding gas and having an adjustable flow regulator.

Figure 2:
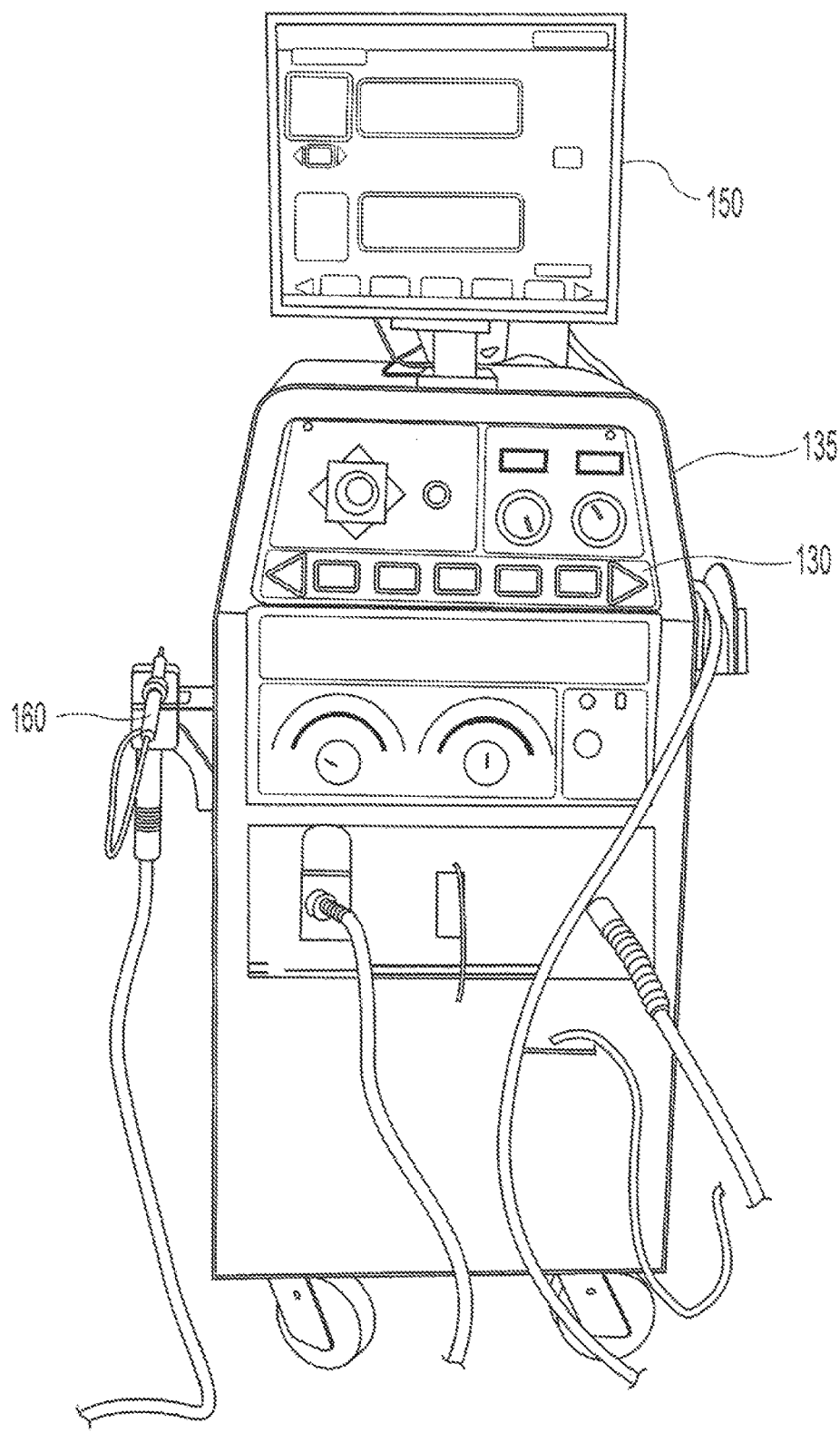
FIG. 2 illustrates an example embodiment of a combined simulated welding console and observer display device (ODD) of the system of FIG. 1.

FIG. 2 illustrates an example embodiment of a combined simulated welding console 135 (simulating a welding power source user interface) and observer display device (ODD) 150 of the system 100 of FIG. 1. The physical WUI 130 resides on a front portion of the console 135 and provides knobs, buttons, and a joystick for user selection of various modes and functions. The ODD 150 is attached to a top portion of the console 135, in accordance with an embodiment of the present invention. The MWT 160 rests in a holder attached to a side portion of the console 135. Internally, the console 135 holds the PPS 110 and a portion of the ST 120.

Figure 3:
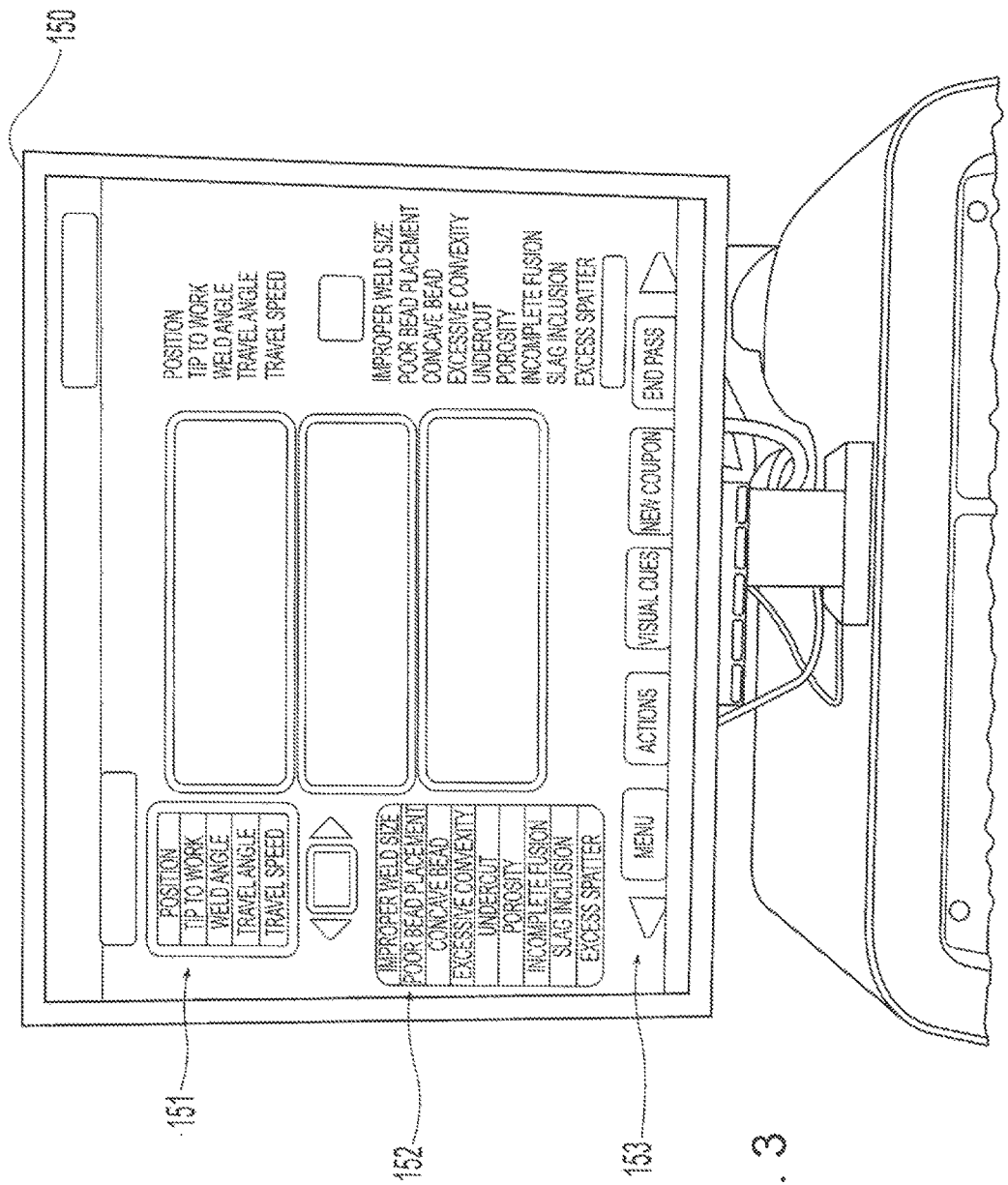
FIG. 3 illustrates an example embodiment of the observer display device (ODD) of FIG. 2.

FIG. 3 illustrates an example embodiment of the observer display device (ODD) 150 of FIG. 2. In accordance with an embodiment of the present invention, the ODD 150 is a liquid crystal display (LCD) device. Other display devices are possible as well. For example, the ODD 150 may be a touchscreen display, in accordance with another embodiment of the present invention. The ODD 150 receives video (e.g., SVGA format) and display information from the PPS 110.

As shown in FIG. 3, the ODD 150 is capable of displaying a first user scene showing various welding parameters 151 including position, tip to work, weld angle, travel angle, and travel speed. These parameters may be selected and displayed in real time in graphical form and are used to teach proper welding technique. Furthermore, as shown in FIG. 3, the ODD 150 is capable of displaying simulated welding discontinuity states 152 including, for example, improper weld size, poor bead placement, concave bead, excessive convexity, undercut, porosity, incomplete fusion, slag inclusion, excess spatter, overfill, and burnthrough (melt through). Undercut is a groove melted into the base metal adjacent to the weld or weld root and left unfilled by weld metal. Undercut is often due to an incorrect angle of welding. Porosity is cavity type discontinuities formed by gas entrapment during solidification often caused by moving the arc too far away from the coupon. Such simulated welding discontinuity states are generated by the system 100 during a simulated welding process to form a virtual weldment using a simulated welding coupon.

Also, as shown in FIG. 3, the ODD 150 is capable of displaying user selections 153 including menu, actions, visual cues, new coupon, and end pass. These user selections are tied to user buttons on the console 135. As a user makes various selections via, for example, a touchscreen of the ODD 150 or via the physical WUI 130, the displayed characteristics can change to provide selected information and other options to the user. Furthermore, the ODD 150 may display a view seen by a welder wearing the FMDD 140 at the same angular view of the welder or at various different angles, for example, chosen by an instructor. The ODD 150 may be viewed by an instructor and/or students for various training purposes, including for destructive/non-destructive testing and inspection of a virtual weldment. For example, the view may be rotated around the finished weld allowing visual inspection by an instructor. In accordance with an alternate embodiment of the present invention, video from the system 100 may be sent to a remote location via, for example, the Internet for remote viewing and/or critiquing. Furthermore, audio may be provided, allowing real-time audio communication between a student and a remote instructor.

Figure 4:
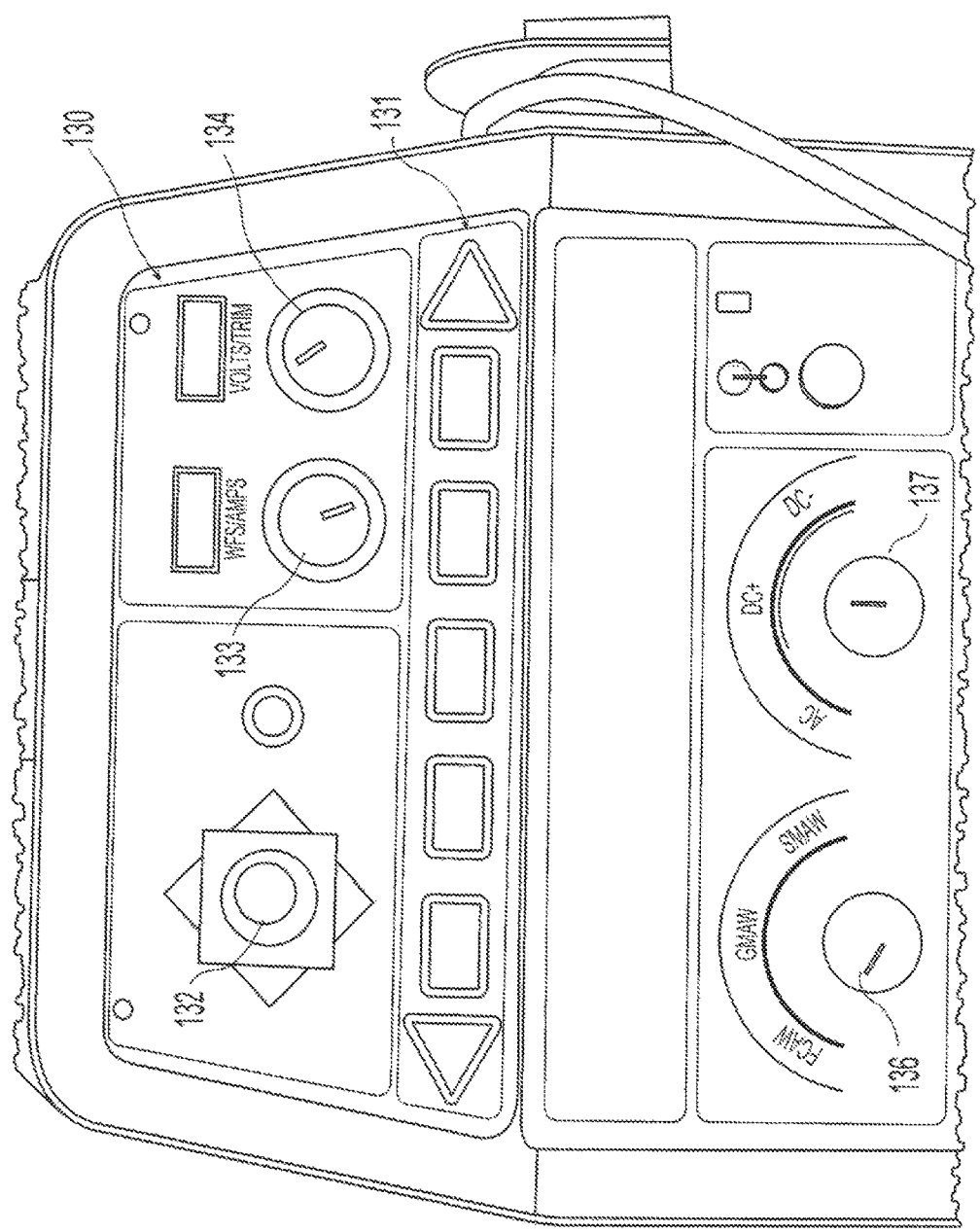
FIG. 4 illustrates an example embodiment of a front portion of the simulated welding console of FIG. 2 showing a physical welding user interface (WUI)

FIG. 4 illustrates an example embodiment of a front portion of the simulated welding console 135 of FIG. 2 showing a physical welding user interface (WUI) 130. The WUI 130 includes a set of buttons 131 corresponding to the user selections 153 displayed on the ODD 150. The buttons 131 are colored to correspond to the colors of the user selections 153 displayed on the ODD 150. When one of the buttons 131 is pressed, a signal is sent to the PPS 110 to activate the corresponding function. The WUI 130 also includes a joystick 132 capable of being used by a user to select various parameters and selections displayed on the ODD 150. The WUI 130 further includes a dial or knob 133 for adjusting wire feed speed/amps, and another dial or knob 134 for adjusting volts/trim. The WUI 130 also includes a dial or knob 136 for selecting an arc welding process. In accordance with an embodiment of the present invention, three arc welding processes are selectable including flux cored arc welding (FCAW) including gas-shielded and self-shielded processes; gas metal arc welding (GMAW) including short arc, axial spray, STT, and pulse; gas tungsten arc welding (GTAW); and shielded metal arc welding (SMAW) including E6010, E6013, and E7018 electrodes. The WUI 130 further includes a dial or knob 137 for selecting a welding polarity. In accordance with an embodiment of the present invention, three arc welding polarities are selectable including alternating current (AC), positive direct current (DC+), and negative direct current (DC−).

Figure 5:
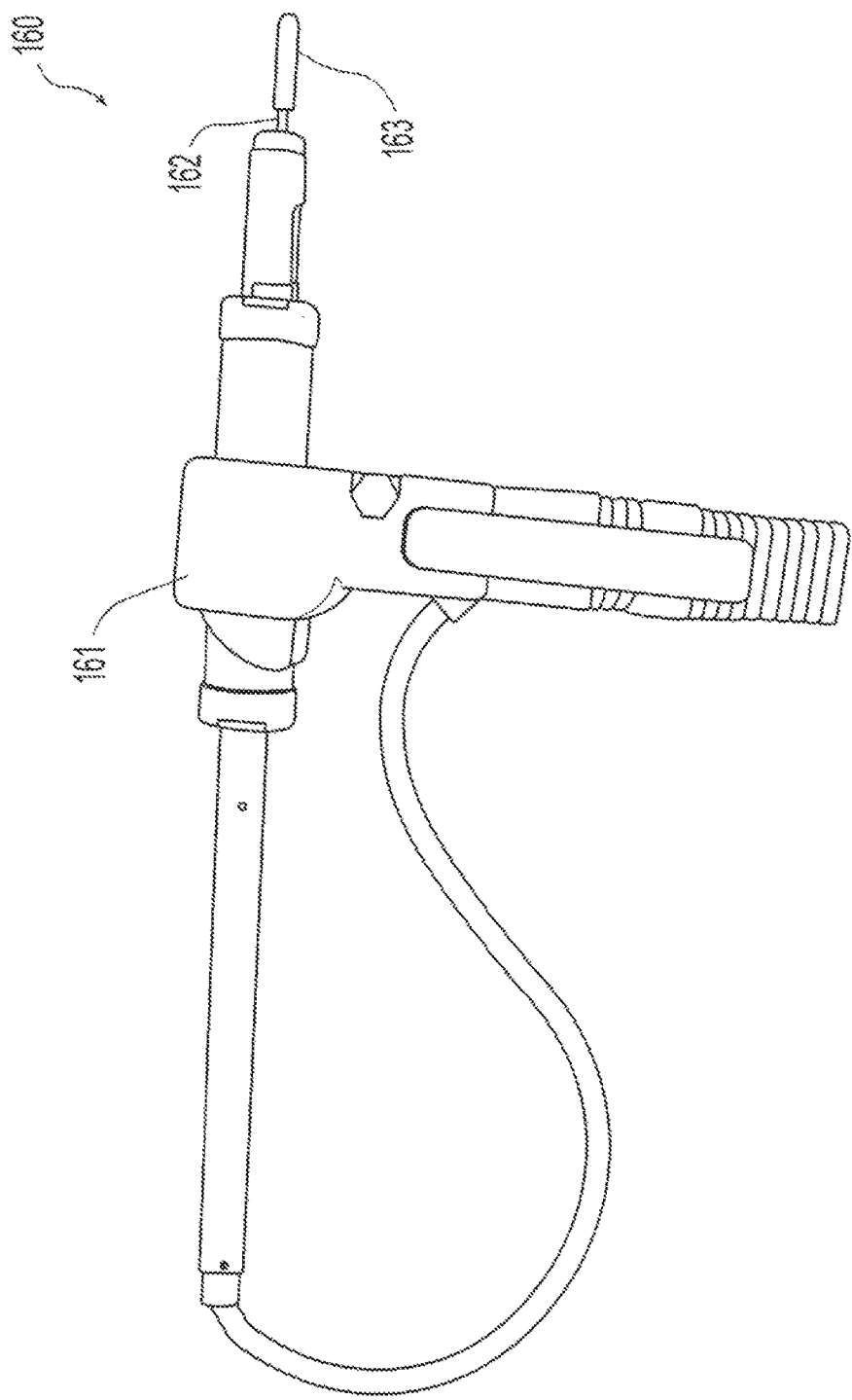
FIG. 5 illustrates an example embodiment of a mock welding tool (MWT) of the system of FIG. 1.

FIG. 5 illustrates an example embodiment of a mock welding tool (MWT) 160 of the system 100 of FIG. 1. The MWT 160 of FIG. 5 simulates a stick welding tool for plate and pipe welding and includes a holder 161 and a simulated stick electrode 162. A trigger on the MWD 160 is used to communicate a signal to the PPS 110 to activate a selected simulated welding process. The simulated stick electrode 162 includes a tactilely resistive tip 163 to simulate resistive feedback that occurs during, for example, a root pass welding procedure in real-world pipe welding or when welding a plate. If the user moves the simulated stick electrode 162 too far back out of the root, the user will be able to feel or sense the lower resistance, thereby deriving feedback for use in adjusting or maintaining the current welding process.

It is contemplated that the stick welding tool may incorporate an actuator, not shown, that withdraws the simulated stick electrode 162 during the virtual welding process. That is to say that as a user engages in virtual welding activity, the distance between holder 161 and the tip of the simulated stick electrode 162 is reduced to simulate consumption of the electrode. The consumption rate, i.e. withdrawal of the stick electrode 162, may be controlled by the PPS 110 and more specifically by coded instructions executed by the PPS 110. The simulated consumption rate may also depend on the user's technique. It is noteworthy to mention here that as the system 100 facilitates virtual welding with different types of electrodes, the consumption rate or reduction of the stick electrode 162 may change with the welding procedure used and/or setup of the system 100.

Other mock welding tools are possible as well, in accordance with other embodiments of the present invention, including a MWD that simulates a hand-held semi-automatic welding gun having a wire electrode fed through the gun, for example. Furthermore, in accordance with other certain embodiments of the present invention, a real welding tool could be used as the MWT 160 to better simulate the actual feel of the tool in the user's hands, even though, in the system 100, the tool would not be used to actually create a real arc. Also, a simulated grinding tool may be provided, for use in a simulated grinding mode of the simulator 100. Similarly, a simulated cutting tool may be provided, for use in a simulated cutting mode of the simulator 100 such as, for example, as used in Oxyfuel and plasma cutting. Furthermore, a simulated gas tungsten arc welding (GTAW) torch or filler material may be provided for use in the simulator 100.

Figure 6:
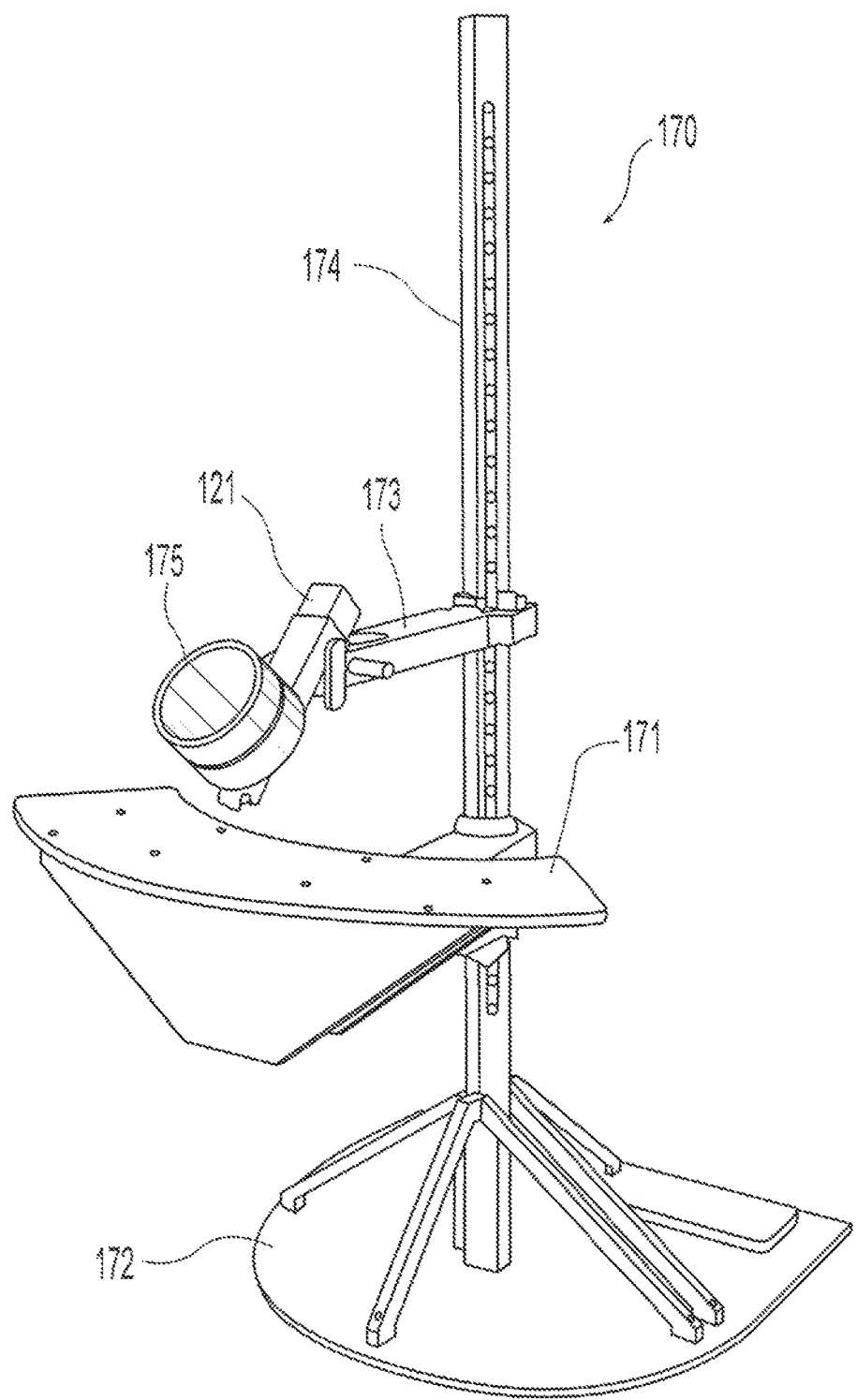
FIG. 6 illustrates an example embodiment of a table/stand (T/S) of the system of FIG. 1.

FIG. 6 illustrates an example embodiment of a table/stand (T/S) 170 of the system 100 of FIG. 1. The T/S 170 includes an adjustable table 171, a stand or base 172, an adjustable arm 173, and a vertical post 174. The table 171, the stand 172, and the arm 173 are each attached to the vertical post 174. The table 171 and the arm 173 are each capable of being manually adjusted upward, downward, and rotationally with respect to the vertical post 174. The arm 173 is used to hold various welding coupons (e.g., welding coupon 175) and a user may rest his/her arm on the table 171 when training. The vertical post 174 is indexed with position information such that a user may know exactly where the arm 173 and the table 171 are vertically positioned on the post 171. This vertical position information may be entered into the system by a user using the WUI 130 and the ODD 150.

In accordance with an alternative embodiment of the present invention, the positions of the table 171 and the arm 173 may be automatically set by the PSS 110 via preprogrammed settings, or via the WUI 130 and/or the ODD 150 as commanded by a user. In such an alternative embodiment, the T/S 170 includes, for example, motors and/or servo-mechanisms, and signal commands from the PPS 110 activate the motors and/or servo-mechanisms. In accordance with a further alternative embodiment of the present invention, the positions of the table 171 and the arm 173 and the type of coupon are detected by the system 100. In this way, a user does not have to manually input the position information via the user interface. In such an alternative embodiment, the T/S 170 includes position and orientation detectors and sends signal commands to the PPS 110 to provide position and orientation information, and the WC 175 includes position detecting sensors (e.g., coiled sensors for detecting magnetic fields). A user is able to see a rendering of the T/S 170 adjust on the ODD 150 as the adjustment parameters are changed, in accordance with an embodiment of the present invention.

FIG. 7A illustrates an example embodiment of a pipe welding coupon (WC) 175 of the system 100 of FIG. 1. The WC 175 simulates two six inch diameter pipes 175' and 175" placed together to form a root 176 to be welded. The WC 175 includes a connection portion 177 at one end of the WC 175, allowing the WC 175 to be attached in a precise and repeatable manner to the arm 173. FIG. 7B illustrates the pipe WC 175 of FIG. 7A mounted on the arm 173 of the table/stand (TS) 170 of FIG. 6. The precise and repeatable manner in which the WC 175 is capable of being attached to the arm 173 allows for spatial calibration of the WC 175 to be performed only once at the factory. Then, in the field, as long as the system 100 is told the position of the arm 173, the system 100 is able to track the MWT 160 and the FMDD 140 with respect to the WC 175 in a virtual environment. A first portion of the arm 173, to which the WC 175 is attached, is capable of being tilted with respect to a second portion of the arm 173, as shown in FIG. 6. This allows the user to practice pipe welding with the pipe in any of several different orientations and angles.

Figure 8:
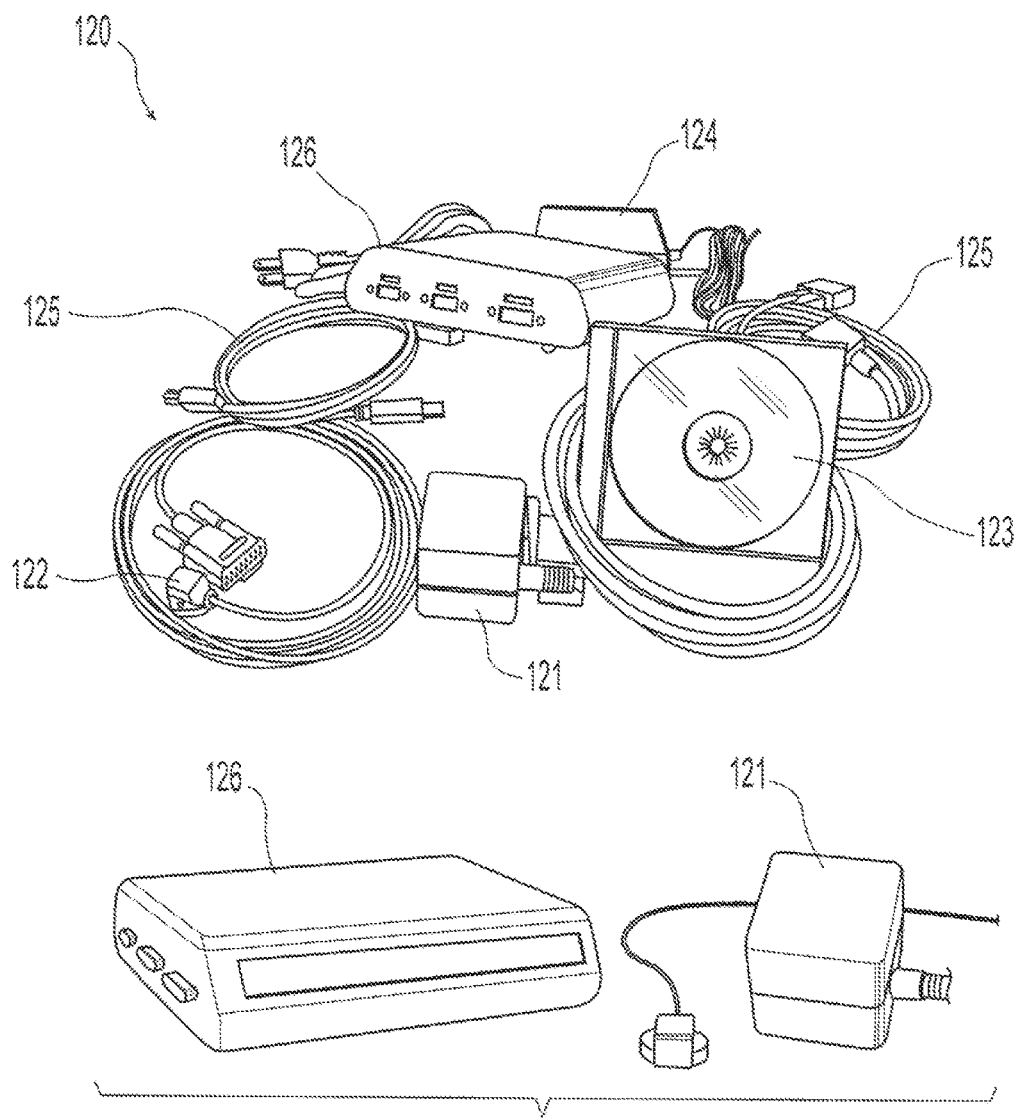
FIG. 8 illustrates various elements of an example embodiment of the spatial tracker (ST) of FIG. 1.

FIG. 8 illustrates various elements of an example embodiment of the spatial tracker (ST) 120 of FIG. 1. The ST 120 is a magnetic tracker that is capable of operatively interfacing with the PPS 110 of the system 100. The ST 120 includes a magnetic source 121 and source cable, at least one sensor 122 and associated cable, host software on disk 123, a power source 124 and associated cable, USB and RS-232 cables 125, and a processor tracking unit 126. The magnetic source 121 is capable of being operatively connected to the processor tracking unit 126 via a cable. The sensor 122 is capable of being operatively connected to the processor tracking unit 126 via a cable. The power source 124 is capable of being operatively connected to the processor tracking unit 126 via a cable. The processor tracking unit 126 is cable of being operatively connected to the PPS 110 via a USB or RS-232 cable 125. The host software on disk 123 is capable of being loaded onto the PPS 110 and allows functional communication between the ST 120 and the PPS 110.

Referring to FIG. 6 and FIG. 8, the magnetic source 121 of the ST 120 is mounted on the first portion of the arm 173. The magnetic source 121 creates a magnetic field around the source 121, including the space encompassing the WC 175 attached to the arm 173, which establishes a 3D spatial frame of reference. The T/S 170 is largely non-metallic (non-ferric and non-conductive) so as not to distort the magnetic field created by the magnetic source 121. The sensor 122 includes three induction coils orthogonally aligned along three spatial directions. The induction coils of the sensor 122 each measure the strength of the magnetic field in each of the three directions and provide that information to the processor tracking unit 126. As a result, the system 100 is able to know where any portion of the WC 175 is with respect to the 3D spatial frame of reference established by the magnetic field when the WC 175 is mounted on the arm 173. The sensor 122 may be attached to the MWT 160 or to the FMDD 140, allowing the MWT 160 or the FMDD 140 to be tracked by the ST 120 with respect to the 3D spatial frame of reference in both space and orientation. When two sensors 122 are provided and operatively connected to the processor tracking unit 126, both the MWT 160 and the FMDD 140 may be tracked. In this manner, the system 100 is capable of creating a virtual WC, a virtual MWT, and a virtual T/S in virtual reality space and displaying the virtual WC, the virtual MWT, and the virtual T/S on the FMDD 140 and/or the ODD 150 as the MWT 160 and the FMDD 140 are tracked with respect to the 3D spatial frame of reference.

In accordance with an alternative embodiment of the present invention, the sensor(s) 122 may wirelessly interface to the processor tracking unit 126, and the processor tracking unit 126 may wirelessly interface to the PPS 110. In accordance with other alternative embodiments of the present invention, other types of spatial trackers 120 may be used in the system 100 including, for example, an accelerometer/gyroscope-based tracker, an optical tracker (active or passive), an infrared tracker, an acoustic tracker, a laser tracker, a radio frequency tracker, an inertial tracker, and augmented reality based tracking systems. Other types of trackers may be possible as well.

FIG. 9A illustrates an example embodiment of the face-mounted display device 140 (FMDD) of the system 100 of FIG. 1. FIG. 9B is an illustration of how the FMDD 140 of FIG. 9A is secured on the head of a user. FIG. 9C illustrates an example embodiment of the FMDD 140 of FIG. 9A integrated into a welding helmet 900. The FMDD 140 operatively connects to the PPS 110 and the ST 120 either via wired means or wirelessly. A sensor 122 of the ST 120 may be attached to the FMDD 140 or to the welding helmet 900, in accordance with various embodiments of the present invention, allowing the FMDD 140 and/or welding helmet 900 to be tracked with respect to the 3D spatial frame of reference created by the ST 120.

In accordance with an embodiment of the present invention, the FMDD 140 includes two high-contrast SVGA 3D OLED microdisplays capable of delivering fluid full-motion video in the 2D and frame sequential video modes. Video of the virtual reality environment is provided and displayed on the FMDD 140. A zoom (e.g., 2x) mode may be provided, allowing a user to simulate a cheater lens, for example.

The FMDD 140 further includes two earbud speakers 910, allowing the user to hear simulated welding-related and environmental sounds produced by the system 100. The FMDD 140 may operatively interface to the PPS 110 via wired or wireless means, in accordance with various embodiments of the present invention. In accordance with an embodiment of the present invention, the PPS 110 provides stereoscopic video to the FMDD 140, providing enhanced depth perception to the user. In accordance with an alternate embodiment of the present invention, a user is able to use a control on the MWT 160 (e.g., a button or switch) to call up and select menus and display options on the FMDD 140. This may allow the user to easily reset a weld if he makes a mistake, change certain parameters, or back up a little to re-do a portion of a weld bead trajectory, for example.

FIG. 10 illustrates an example embodiment of a subsystem block diagram of the programmable processor-based subsystem (PPS) 110 of the system 100 of FIG. 1. The PPS 110 includes a central processing unit (CPU) 111 and two graphics processing units (GPU) 115, in accordance with an embodiment of the present invention. The two GPUs 115 are programmed to provide virtual reality simulation of a weld puddle (a.k.a. a weld pool) having real-time molten metal fluidity and heat absorption and dissipation characteristics, in accordance with an embodiment of the present invention.

Figure 11:
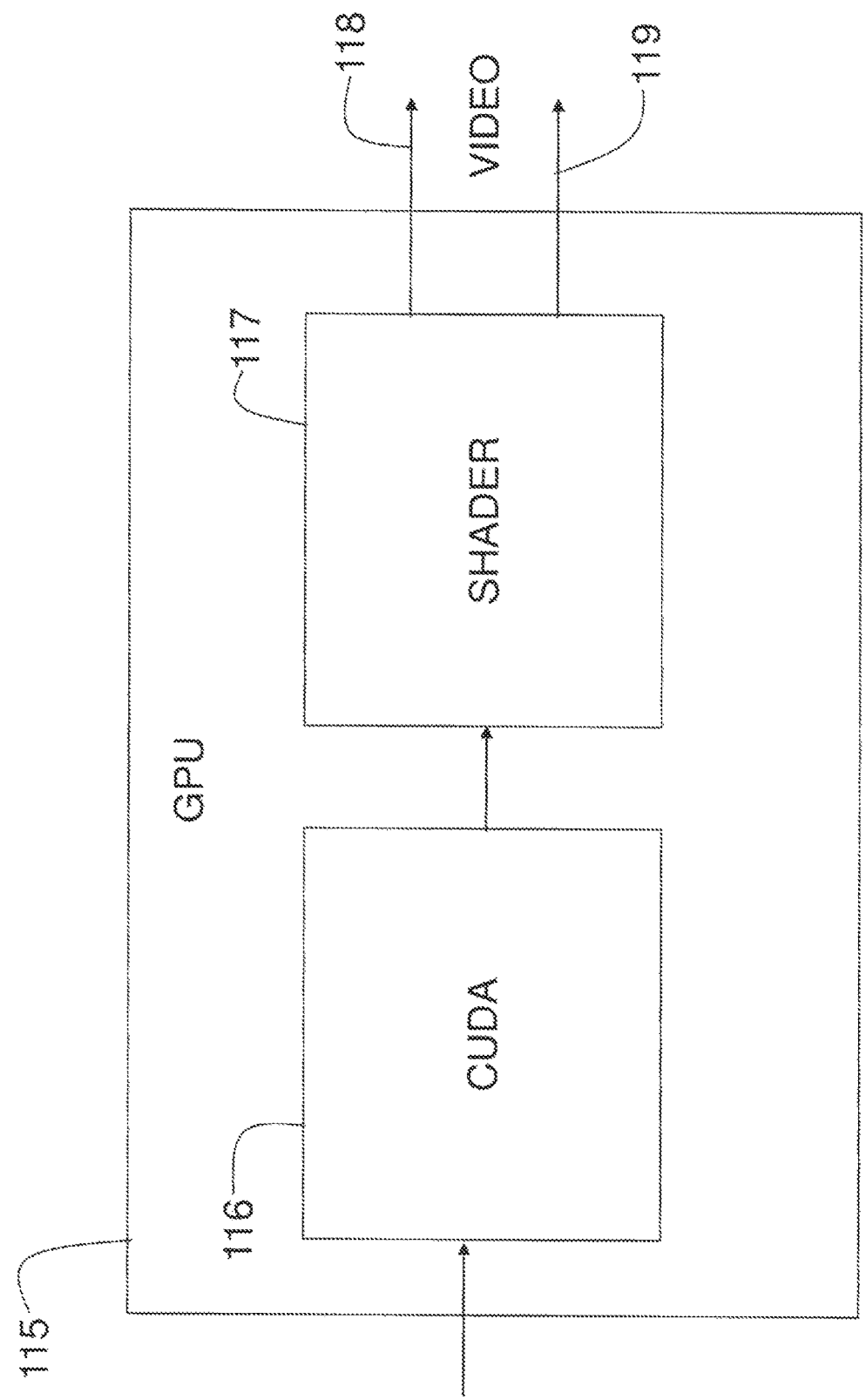
FIG. 11 illustrates an example embodiment of a block diagram of a graphics processing unit (GPU) of the PPS of FIG. 10.

FIG. 11 illustrates an example embodiment of a block diagram of a graphics processing unit (GPU) 115 of the PPS 110 of FIG. 10. Each GPU 115 supports the implementation of data parallel algorithms. In accordance with an embodiment of the present invention, each GPU 115 provides two video outputs 118 and 119 capable of providing two virtual reality views. Two of the video outputs may be routed to the FMDD 140, rendering the welder's point of view, and a third video output may be routed to the ODD 150, for example, rendering either the welder's point of view or some other point of view. The remaining fourth video output may be routed to a projector, for example. Both GPUs 115 perform the same welding physics computations but may render the virtual reality environment from the same or different points of view. The GPU 115 includes a compute unified device architecture (CUDA) 116 and a shader 117. The CUDA 116 is the computing engine of the GPU 115 which is accessible to software developers through industry standard programming languages. The CUDA 116 includes parallel cores and is used to run the physics model of the weld puddle simulation described herein. The CPU 111 provides real-time welding input data to the CUDA 116 on the GPU 115. The shader 117 is responsible for drawing and applying all of the visuals of the simulation. Bead and puddle visuals are driven by the state of a wexel displacement map which is described later herein. In accordance with an embodiment of the present invention, the physics model runs and updates at a rate of about 30 times per second. During virtual destructive/non-destructive testing and inspection simulations, the GPUs 115 act as a rendering engine to provide 3D animated renderings of a virtual weldment created during a simulated welding process. Furthermore, the CPU 111 acts as an analysis engine to provide testing analysis of the virtual weldment with respect to the various defects and discontinuities that may be present in the virtual weldment.

Figure 12:
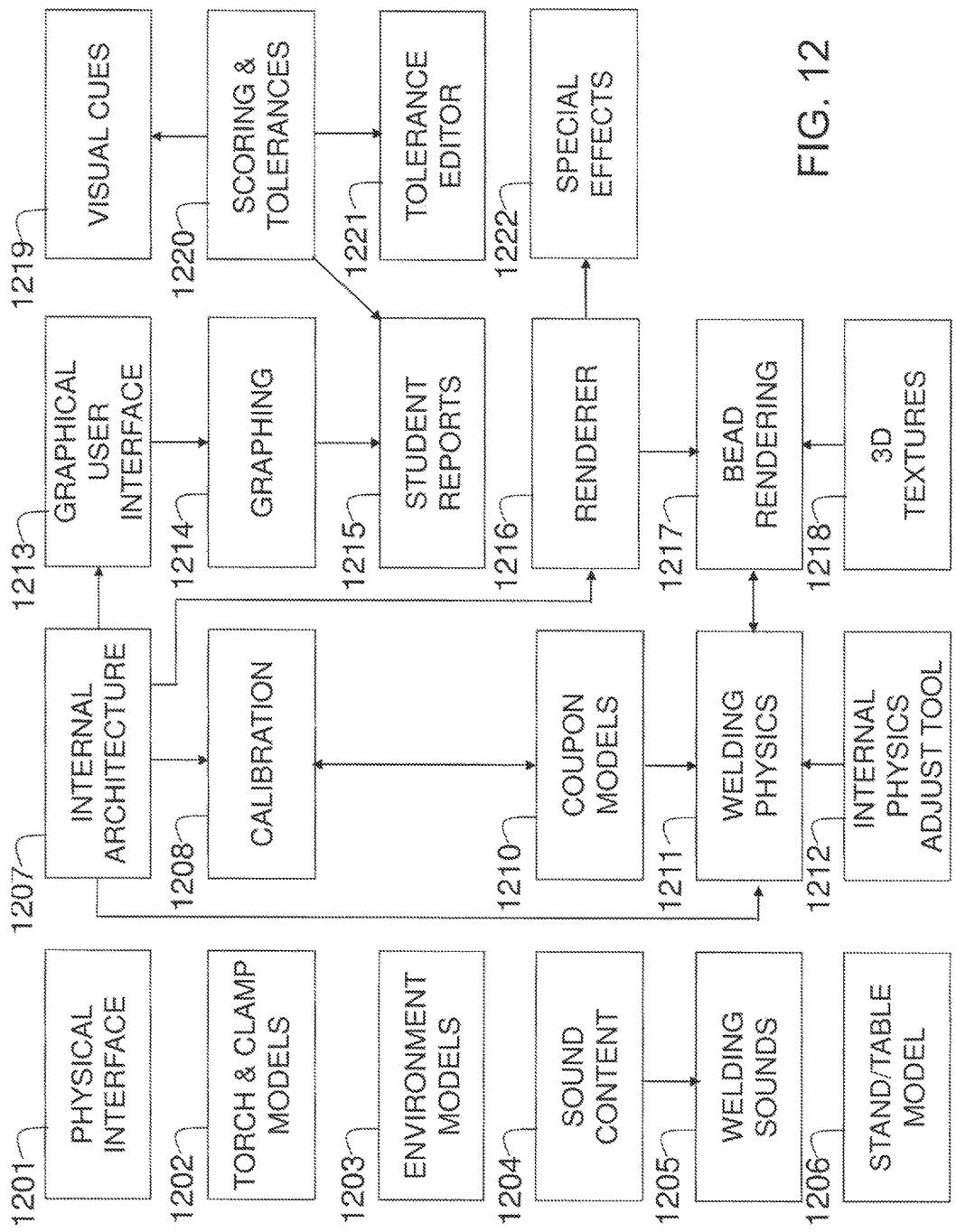
FIG. 12 illustrates an example embodiment of a functional block diagram of the system of FIG. 1.

FIG. 12 illustrates an example embodiment of a functional block diagram of the system 100 of FIG. 1. The various functional blocks of the system 100 as shown in FIG. 12 are implemented largely via software instructions and modules running on the PPS 110. The various functional blocks of the system 100 include a physical interface 1201, torch and clamp models 1202, environment models 1203, sound content functionality 1204, welding sounds 1205, stand/table model 1206, internal architecture functionality 1207, calibration functionality 1208, coupon models 1210, welding physics 1211, internal physics adjustment tool (tweaker) 1212, graphical user interface functionality 1213, graphing functionality 1214, student reports functionality 1215, renderer 1216, bead rendering 1217, 3D textures 1218, visual cues functionality 1219, scoring and tolerance functionality 1220, tolerance editor 1221, and special effects 1222. The renderer 1216, the bead rendering 1217, the 3D textures 1218, and the scoring and tolerance functionality 1220 are employed during virtual destructive/non-destructive testing and inspection as well as during a simulated welding process, in accordance with an embodiment of the present invention.

The internal architecture functionality 1207 provides the higher level software logistics of the processes of the system 100 including, for example, loading files, holding information, managing threads, turning the physics model on, and triggering menus. The internal architecture functionality 1207 runs on the CPU 111, in accordance with an embodiment of the present invention. Certain real-time inputs to the PPS 110 include arc location, gun position, FMDD or helmet position, gun on/off state, and contact made state (yes/no).

The graphical user interface functionality 1213 allows a user, through the ODD 150 using the joystick 132 of the physical user interface 130, to set up a welding scenario, a testing scenario, or an inspection scenario. In accordance with an embodiment of the present invention, the set up of a welding scenario includes selecting a language, entering a user name, selecting a practice plate (i.e., a welding coupon), selecting a welding process (e.g., FCAW, GMAW, SMAW) and associated axial spray, pulse, or short arc methods, selecting a gas type and flow rate, selecting a type of stick electrode (e.g., 6010 or 7018), and selecting a type of flux cored wire (e.g., self-shielded, gas-shielded). The set up of a welding scenario also includes selecting a table height, an arm height, an arm position, and an arm rotation of the T/S 170. The set up of a welding scenario further includes selecting an environment (e.g., a background environment in virtual reality space), setting a wire feed speed, setting a voltage level, setting an amperage, selecting a polarity, and turning particular visual cues on or off. Similarly, the set up of a virtual testing or inspection scenario may include selecting a language, entering a user name, selecting a virtual weldment, selecting a destructive or a non-destructive test, selecting an interactive tool, and selecting an animated perspective view.

During a simulated welding scenario, the graphing functionality 1214 gathers user performance parameters and provides the user performance parameters to the graphical user interface functionality 1213 for display in a graphical format (e.g., on the ODD 150). Tracking information from the ST 120 feeds into the graphing functionality 1214. The graphing functionality 1214 includes a simple analysis module (SAM) and a whip/weave analysis module (WWAM). The SAM analyzes user welding parameters including welding travel angle, travel speed, weld angle, position, and tip to work distance by comparing the welding parameters to data stored in bead tables. The WWAM analyzes user whipping parameters including dime spacing, whip time, and puddle time. The WWAM also analyzes user weaving parameters including width of weave, weave spacing, and weave timing. The SAM and WWAM interpret raw input data (e.g., position and orientation data) into functionally usable data for graphing. For each parameter analyzed by the SAM and the WWAM, a tolerance window is defined by parameter limits around an optimum or ideal set point input into bead tables using the tolerance editor 1221, and scoring and tolerance functionality 1220 is performed.

The tolerance editor 1221 includes a weldometer which approximates material usage, electrical usage, and welding time. Furthermore, when certain parameters are out of tolerance, welding discontinuities (i.e., welding defects) may occur. The state of any welding discontinuities are processed by the graphing functionality 1214 and presented via the graphical user interface functionality 1213 in a graphical format. Such welding discontinuities include improper weld size, poor bead placement, concave bead, excessive convexity, undercut, porosity, incomplete fusion, slag entrapment, overfill, burnthrough, and excessive spatter. In accordance with an embodiment of the present invention, the level or amount of a discontinuity is dependent on how far away a particular user parameter is from the optimum or ideal set point. Such welding discontinuities that are generated as part of the simulated welding process are used as inputs to the virtual destructive/non-destructive and inspection processes as associated with a virtual weldment.

Different parameter limits may be pre-defined for different types of users such as, for example, welding novices, welding experts, and persons at a trade show. The scoring and tolerance functionality 1220 provide number scores depending on how close to optimum (ideal) a user is for a particular parameter and depending on the level of discontinuities or defects present in the weld. The optimum values are derived from real-world data. Information from the scoring and tolerance functionality 1220 and from the graphics functionality 1214 may be used by the student reports functionality 1215 to create a performance report for an instructor and/or a student.

The system 100 is capable of analyzing and displaying the results of virtual welding activity. By analyzing the results, it is meant that system 100 is capable of determining when during the welding pass and where along the weld joints, the user deviated from the acceptable limits of the welding process. A score may be attributed to the user's performance. In one embodiment, the score may be a function of deviation in position, orientation and speed of the mock welding tool 160 through ranges of tolerances, which may extend from an ideal welding pass to marginal or unacceptable welding activity. Any gradient of ranges may be incorporated into the system 100 as chosen for scoring the users performance. Scoring may be displayed numerically or alpha-numerically. Additionally, the users performance may be displayed graphically showing, in time and/or position along the weld joint, how closely the mock welding tool traversed the weld joint. Parameters such as travel angle, work angle, speed, and distance from the weld joint are examples of what may be measured, although any parameters may be analyzed for scoring purposes. The tolerance ranges of the parameters are taken from real-world welding data, thereby providing accurate feedback as to how the user will perform in the real world. In another embodiment, analysis of the defects corresponding to the user's performance may also be incorporated and displayed on the ODD 150. In this embodiment, a graph may be depicted indicating what type of discontinuity resulted from measuring the various parameters monitored during the virtual welding activity. While occlusions may not be visible on the ODD 150, defects may still have occurred as a result of the users performance, the results of which may still be correspondingly displayed, i.e. graphed, and also tested (e.g., via a bend test) and inspected.

Visual cues functionality 1219 provide immediate feedback to the user by displaying overlaid colors and indicators on the FMDD 140 and/or the ODD 150. Visual cues are provided for each of the welding parameters 151 including position, tip to work distance, weld angle, travel angle, travel speed, and arc length (e.g., for stick welding) and visually indicate to the user if some aspect of the user's welding technique should be adjusted based on the predefined limits or tolerances. Visual cues may also be provided for whip/weave technique and weld bead "dime" spacing, for example. Visual cues may be set independently or in any desired combination.

Calibration functionality 1208 provides the capability to match up physical components in real world space (3D frame of reference) with visual components in virtual reality space. Each different type of welding coupon (WC) is calibrated in the factory by mounting the WC to the arm 173 of the T/S 170 and touching the WC at predefined points (indicated by, for example, three dimples on the WC) with a calibration stylus operatively connected to the ST 120. The ST 120 reads the magnetic field intensities at the predefined points, provides position information to the PPS 110, and the PPS 110 uses the position information to perform the calibration (i.e., the translation from real world space to virtual reality space).

Any particular type of WC fits into the arm 173 of the T/S 170 in the same repeatable way to within very tight tolerances. Therefore, once a particular WC type is calibrated, that WC type does not have to be re-calibrated (i.e., calibration of a particular type of WC is a one-time event). WCs of the same type are interchangeable. Calibration ensures that physical feedback perceived by the user during a welding process matches up with what is displayed to the user in virtual reality space, making the simulation seem more real. For example, if the user slides the tip of a MWT 160 around the corner of a actual WC 180, the user will see the tip sliding around the corner of the virtual WC on the FMDD 140 as the user feels the tip sliding around the actual corner. In accordance with an embodiment of the present invention, the MWT 160 is placed in a pre-positioned jig and is calibrated as well, based on the known jig position.

In accordance with an alternative embodiment of the present invention, "smart" coupons are provided, having sensors on, for example, the corners of the coupons. The ST 120 is able to track the corners of a "smart" coupon such that the system 100 continuously knows where the "smart" coupon is in real world 3D space. In accordance with a further alternative embodiment of the present invention, licensing keys are provided to "unlock" welding coupons. When a particular WC is purchased, a licensing key is provided allowing the user to enter the licensing key into the system 100, unlocking the software associated with that WC. In accordance with another embodiment of the present invention, special non-standard welding coupons may be provided based on real-world CAD drawings of parts. Users may be able to train on welding a CAD part even before the part is actually produced in the real world.

Sound content functionality 1204 and welding sounds 1205 provide particular types of welding sounds that change depending on if certain welding parameters are within tolerance or out of tolerance. Sounds are tailored to the various welding processes and parameters. For example, in a MIG spray arc welding process, a crackling sound is provided when the user does not have the MWT 160 positioned correctly, and a hissing sound is provided when the MWT 160 is positioned correctly. In a short arc welding process, a steady crackling or frying sound is provided for proper welding technique, and a hissing sound may be provided when undercutting is occurring. These sounds mimic real world sounds corresponding to correct and incorrect welding technique.

High fidelity sound content may be taken from real world recordings of actual welding using a variety of electronic and mechanical means, in accordance with various embodiments of the present invention. In accordance with an embodiment of the present invention, the perceived volume and directionality of sound is modified depending on the position, orientation, and distance of the user's head (assuming the user is wearing a FMDD 140 that is tracked by the ST 120) with respect to the simulated arc between the MWT 160 and the WC 180. Sound may be provided to the user via ear bud speakers 910 in the FMDD 140 or via speakers configured in the console 135 or T/S 170, for example.

Environment models 1203 are provided to provide various background scenes (still and moving) in virtual reality space. Such background environments may include, for example, an indoor welding shop, an outdoor race track, a garage, etc. and may include moving cars, people, birds, clouds, and various environmental sounds. The background environment may be interactive, in accordance with an embodiment of the present invention. For example, a user may have to survey a background area, before starting welding, to ensure that the environment is appropriate (e.g., safe) for welding. Torch and clamp models 1202 are provided which model various MWTs 160 including, for example, guns, holders with stick electrodes, etc. In virtual reality space.

Coupon models 1210 are provided which model various WCs 180 including, for example, flat plate coupons, T-joint coupons, butt-joint coupons, groove-weld coupons, and pipe coupons (e.g., 2-inch diameter pipe and 6-inch diameter pipe) in virtual reality space. A stand/table model 1206 is provided which models the various parts of the T/S 170 including an adjustable table 171, a stand 172, an adjustable arm 173, and a vertical post 174 in virtual reality space. A physical interface model 1201 is provided which models the various parts of the welding user interface 130, console 135, and ODD 150 in virtual reality space. Again, the resultant simulation of a welding coupon that has gone through a simulated welding process to form a weld bead, a weld joint, a pipe-on-plate weld, a plug weld, or a lap weld is known herein as a virtual weldment with respect to the system 100. Welding coupons may be provided to support each of these scenarios.

In accordance with an embodiment of the present invention, simulation of a weld puddle or pool in virtual reality space is accomplished where the simulated weld puddle has real-time molten metal fluidity and heat dissipation characteristics. At the heart of the weld puddle simulation is the welding physics functionality 1211 (a.k.a., the physics model) which is run on the GPUs 115, in accordance with an embodiment of the present invention. The welding physics functionality employs a double displacement layer technique to accurately model dynamic fluidity/viscosity, solidity, heat gradient (heat absorption and dissipation), puddle wake, and bead shape, and is described in more detail herein with respect to FIGS. 14A-14C.

The welding physics functionality 1211 communicates with the bead rendering functionality 1217 to render a weld bead in all states from the heated molten state to the cooled solidified state. The bead rendering functionality 1217 uses information from the welding physics functionality 1211 (e.g., heat, fluidity, displacement, dime spacing) to accurately and realistically render a weld bead in virtual reality space in real-time. The 3D textures functionality 1218 provides texture maps to the bead rendering functionality 1217 to overlay additional textures (e.g., scorching, slag, grain) onto the simulated weld bead. For example, slag may be shown rendered over a weld bead during and just after a welding process, and then removed to reveal the underlying weld bead. The renderer functionality 1216 is used to render various non-puddle specific characteristics using information from the special effects module 1222 including sparks, spatter, smoke, arc glow, fumes and gases, and certain discontinuities such as, for example, undercut and porosity.

The internal physics adjustment tool 1212 is a tweaking tool that allows various welding physics parameters to be defined, updated, and modified for the various welding processes. In accordance with an embodiment of the present invention, the internal physics adjustment tool 1212 runs on the CPU 111 and the adjusted or updated parameters are downloaded to the GPUs 115. The types of parameters that may be adjusted via the internal physics adjustment tool 1212 include parameters related to welding coupons, process parameters that allow a process to be changed without having to reset a welding coupon (allows for doing a second pass), various global parameters that can be changed without resetting the entire simulation, and other various parameters.

Figure 13:
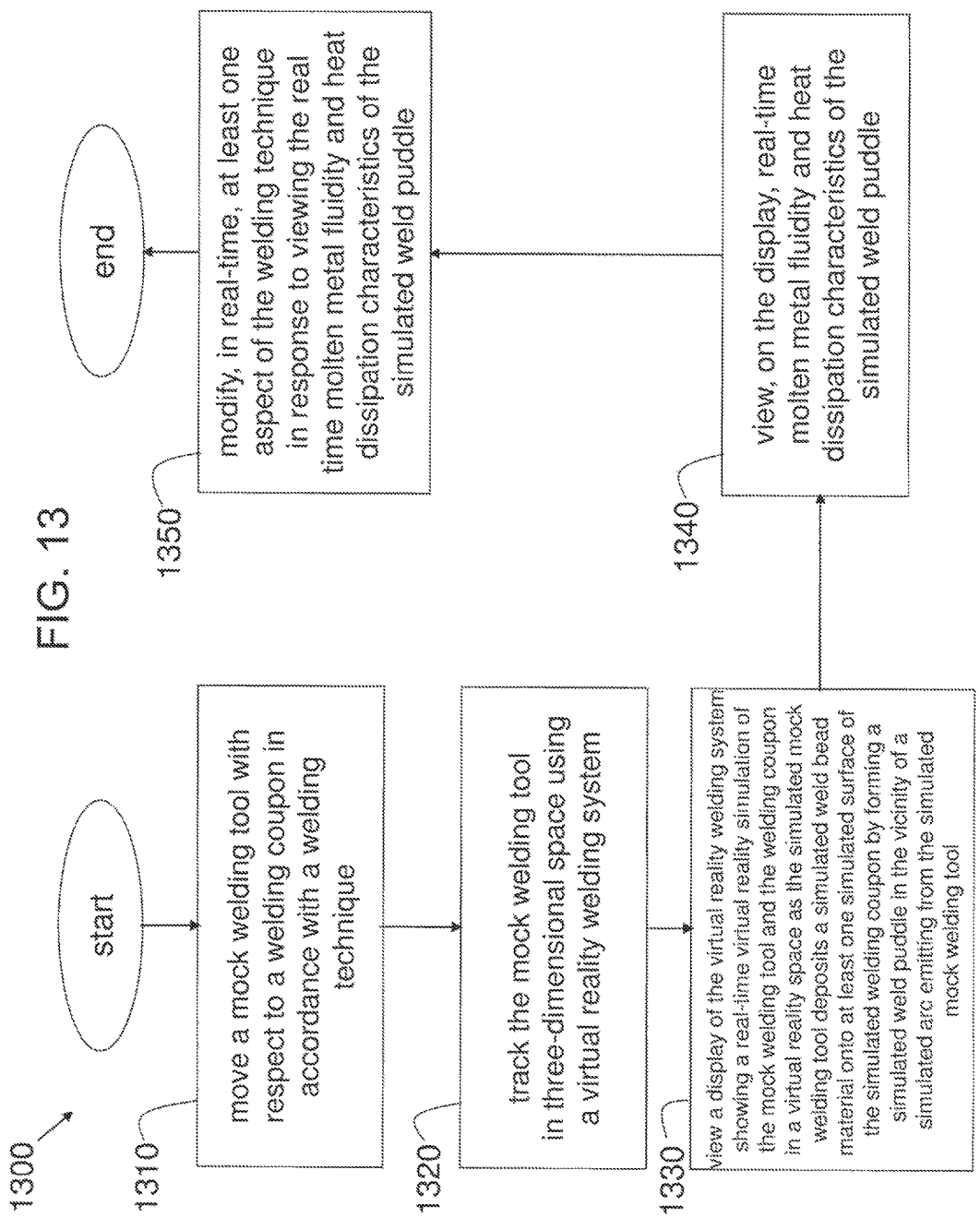
FIG. 13 is a flow chart of an embodiment of a method of training using the virtual reality training system of FIG. 1.

FIG. 13 is a flow chart of an embodiment of a method 1300 of training using the virtual reality training system 100 of FIG. 1. The method proceeds as follows: in step 1310, move a mock welding tool with respect to a welding coupon in accordance with a welding technique; in step 1320, track position and orientation of the mock welding tool in three-dimensional space using a virtual reality system; in step 1330, view a display of the virtual reality welding system showing a real-time virtual reality simulation of the mock welding tool and the welding coupon in a virtual reality space as the simulated mock welding tool deposits a simulated weld bead material onto at least one simulated surface of the simulated welding coupon by forming a simulated weld puddle in the vicinity of a simulated arc emitting from said simulated mock welding tool; in step 1340, view on the display, real-time molten metal fluidity and heat dissipation characteristics of the simulated weld puddle; in step 1350, modify in real-time, at least one aspect of the welding technique in response to viewing the real-time molten metal fluidity and heat dissipation characteristics of the simulated weld puddle.

The method 1300 illustrates how a user is able to view a weld puddle in virtual reality space and modify his welding technique in response to viewing various characteristics of the simulated weld puddle, including real-time molten metal fluidity (e.g., viscosity) and heat dissipation. The user may also view and respond to other characteristics including real-time puddle wake and dime spacing. Viewing and responding to characteristics of the weld puddle is how most welding operations are actually performed in the real world. The double displacement layer modeling of the welding physics functionality 1211 run on the GPUs 115 allows for such real-time molten metal fluidity and heat dissipation characteristics to be accurately modeled and represented to the user. For example, heat dissipation determines solidification time (i.e., how much time it takes for a wexel to completely solidify).

Furthermore, a user may make a second pass over the weld bead material of the virtual weldment using the same or a different (e.g., a second) mock welding tool and/or welding process. In such a second pass scenario, the simulation shows the simulated mock welding tool, the welding coupon, and the original simulated weld bead material in virtual reality space as the simulated mock welding tool deposits a second simulated weld bead material merging with the first simulated weld bead material by forming a second simulated weld puddle in the vicinity of a simulated arc emitting from the simulated mock welding tool. Additional subsequent passes using the same or different welding tools or processes may be made in a similar manner. In any second or subsequent pass, the previous weld bead material is merged with the new weld bead material being deposited as a new weld puddle is formed in virtual reality space from the combination of any of the previous weld bead material, the new weld bead material, and possibly the underlying coupon material thus modifying the resultant virtual weldment, in accordance with certain embodiments of the present invention. Such subsequent passes may be needed to make a large fillet or groove weld, performed to repair a weld bead formed by a previous pass, for example, or may include a hot pass and one or more fill and cap passes after a root pass as is done in pipe welding. In accordance with various embodiments of the present invention, weld bead and base material may include mild steel, stainless steel, aluminum, nickel based alloys, or other materials.

Figure 14A:
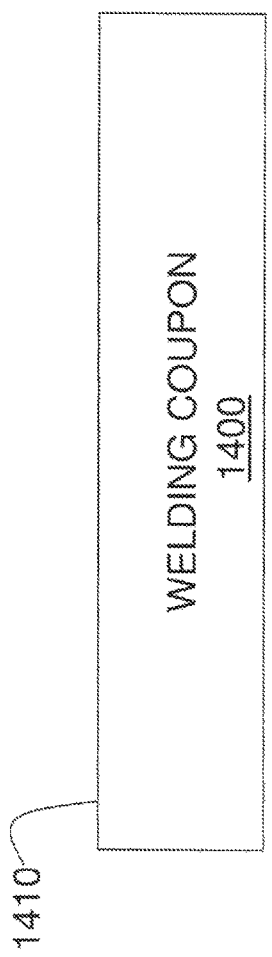
FIGS. 14A-14B illustrate the concept of a welding pixel (wexel) displacement map, in accordance with an embodiment of the present invention.
Figure 14B:
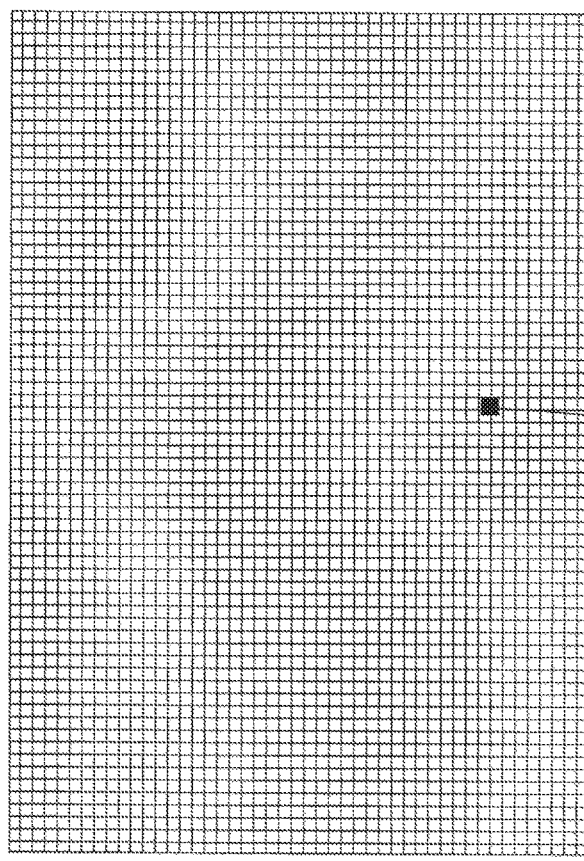

FIGS. 14A-14B illustrate the concept of a welding element (wexel) displacement map 1420, in accordance with an embodiment of the present invention. FIG. 14A shows a side view of a flat welding coupon (WC) 1400 having a flat top surface 1410. The welding coupon 1400 exists in the real world as, for example, a plastic part, and also exists in virtual reality space as a simulated welding coupon. FIG. 14B shows a representation of the top surface 1410 of the simulated WC 1400 broken up into a grid or array of welding elements (i.e., wexels) forming a wexel map 1420. Each wexel (e.g., wexel 1421) defines a small portion of the surface 1410 of the welding coupon. The wexel map defines the surface resolution. Changeable channel parameter values are assigned to each wexel, allowing values of each wexel to dynamically change in real-time in virtual reality weld space during a simulated welding process. The changeable channel parameter values correspond to the channels Puddle (molten metal fluidity/viscosity displacement), Heat (heat absorption/dissipation), Displacement (solid displacement), and Extra (various extra states, e.g., slag, grain, scorching, virgin metal). These changeable channels are referred to herein as PHED for Puddle, Heat, Extra, and Displacement, respectively.

FIG. 15 illustrates an example embodiment of a coupon space and a weld space of the flat welding coupon (WC) 1400 of FIG. 14 simulated in the system 100 of FIG. 1. Points O, X, Y, and Z define the local 3D coupon space. In general, each coupon type defines the mapping from 3D coupon space to 2D virtual reality weld space. The wexel map 1420 of FIG. 14 is a two-dimensional array of values that map to weld space in virtual reality. A user is to weld from point B to point E as shown in FIG. 15. A trajectory line from point B to point E is shown in both 3D coupon space and 2D weld space in FIG. 15.

Each type of coupon defines the direction of displacement for each location in the wexel map. For the flat welding coupon of FIG. 15, the direction of displacement is the same at all locations in the wexel map (i.e., in the Z-direction). The texture coordinates of the wexel map are shown as S, T (sometimes called U, V) in both 3D coupon space and 2D weld space, in order to clarify the mapping. The wexel map is mapped to and represents the rectangular surface 1410 of the welding coupon 1400.

FIG. 16 illustrates an example embodiment of a coupon space and a weld space of a corner (tee joint) welding coupon (WC) 1600 simulated in the system 100 of FIG. 1. The corner WC 1600 has two surfaces 1610 and 1620 in 3D coupon space that are mapped to 2D weld space as shown in FIG. 16. Again, points O, X, Y, and Z define the local 3D coupon space. The texture coordinates of the wexel map are shown as S, T in both 3D coupon space and 2D weld space, in order to clarify the mapping. A user is to weld from point B to point E as shown in FIG. 16. A trajectory line from point B to point E is shown in both 3D coupon space and 2D weld space in FIG. 16. However, the direction of displacement is towards the line X'-O' as shown in the 3D coupon space, towards the opposite corner as shown in FIG. 16.

Figure 17:
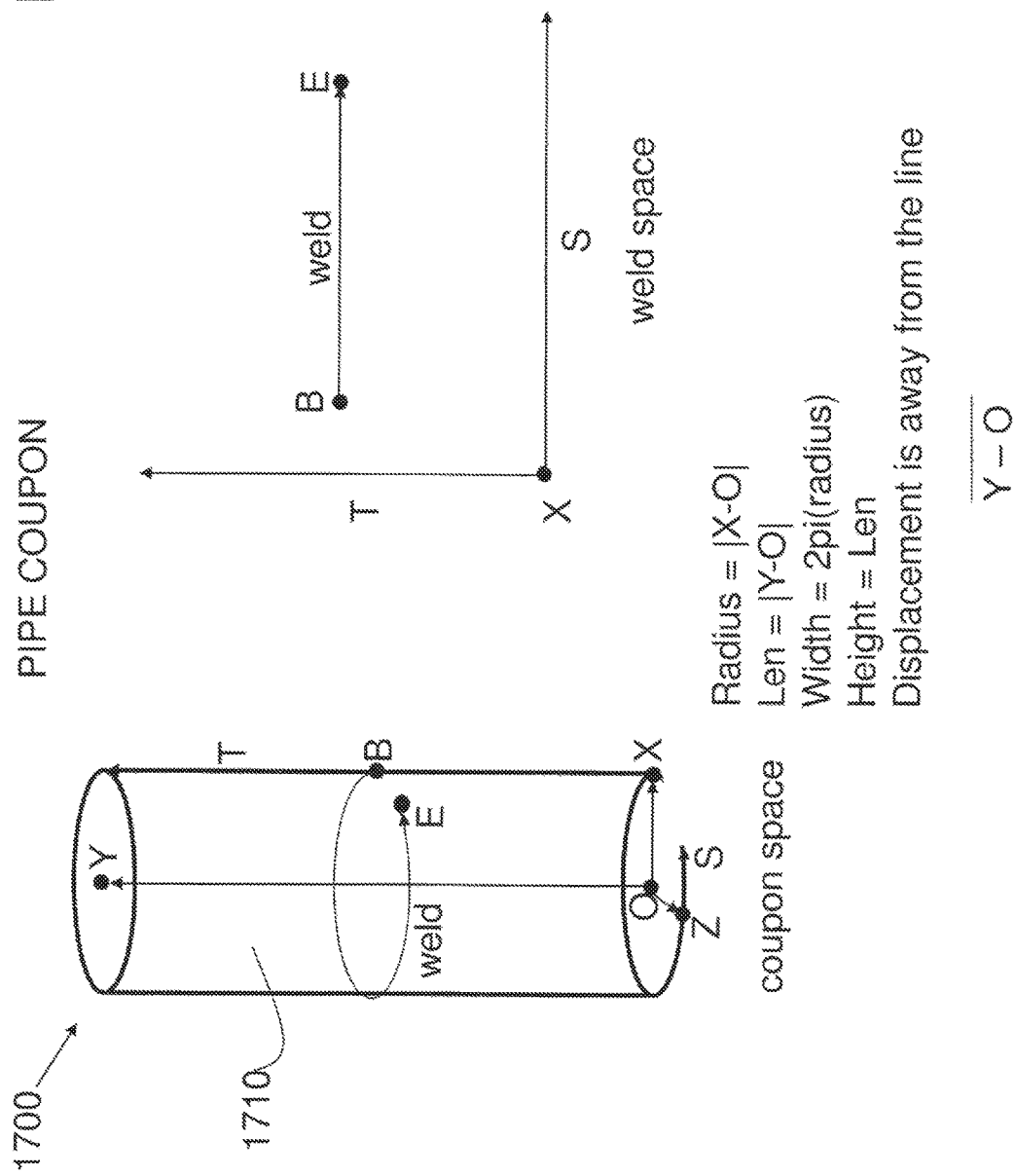
FIG. 17 illustrates an example embodiment of a coupon space and a weld space of a pipe welding coupon (WC) simulated in the system of FIG. 1.
Figure 18:
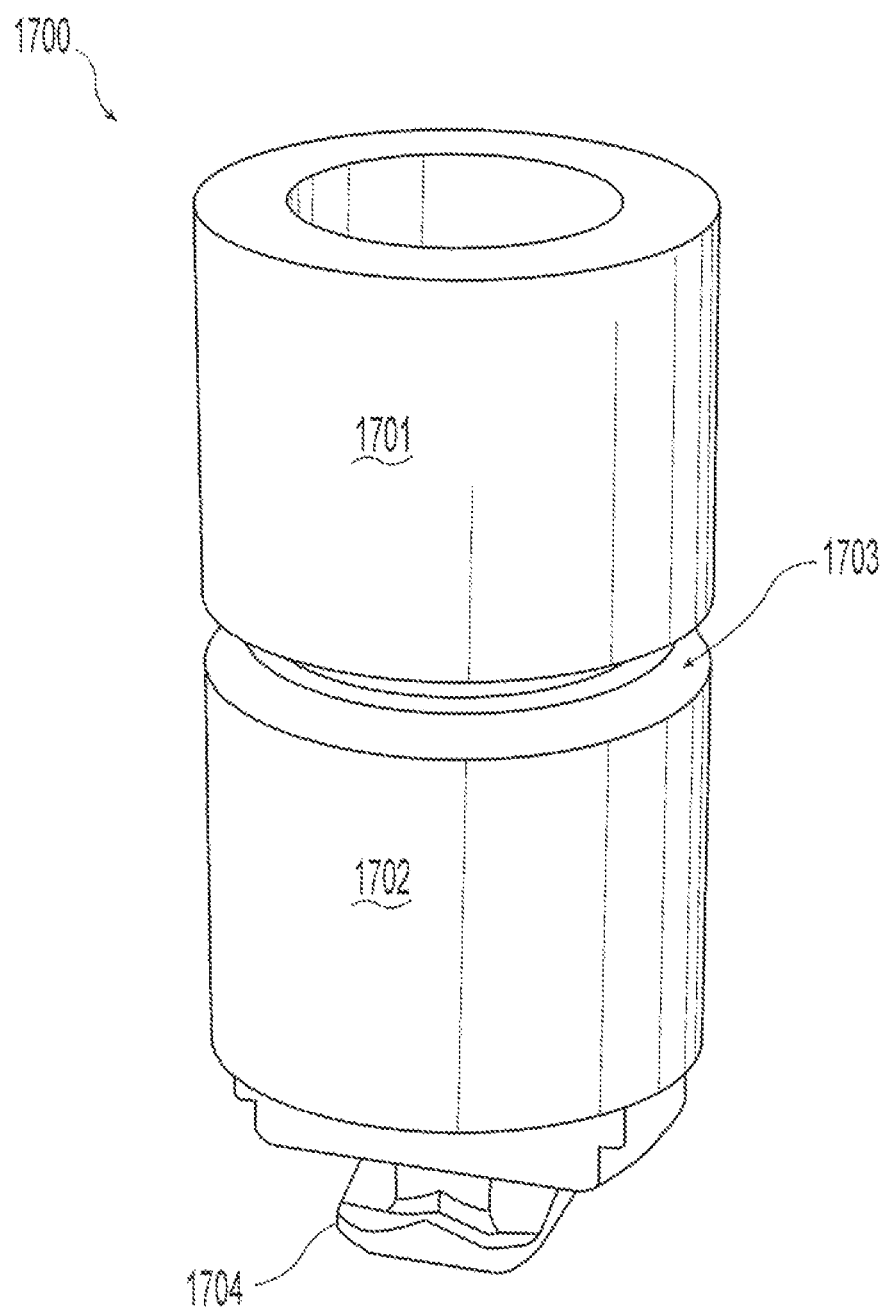
FIG. 18 illustrates an example embodiment of the pipe welding coupon (WC) of FIG. 17.

FIG. 17 illustrates an example embodiment of a coupon space and a weld space of a pipe welding coupon (WC) 1700 simulated in the system 100 of FIG. 1. The pipe WC 1700 has a curved surface 1710 in 3D coupon space that is mapped to 2D weld space as shown in FIG. 17. Again, points O, X, Y, and Z define the local 3D coupon space. The texture coordinates of the wexel map are shown as S, T in both 3D coupon space and 2D weld space, in order to clarify the mapping. A user is to weld from point B to point E along a curved trajectory as shown in FIG. 17. A trajectory curve and line from point B to point E is shown in 3D coupon space and 2D weld space, respectively, in FIG. 17. The direction of displacement is away from the line Y-O (i.e., away from the center of the pipe). FIG. 18 illustrates an example embodiment of the pipe welding coupon (WC) 1700 of FIG. 17. The pipe WC 1700 is made of a non-ferric, non-conductive plastic and simulates two pipe pieces 1701 and 1702 coming together to form a root joint 1703. An attachment piece 1704 for attaching to the arm 173 of the T/S 170 is also shown.

In a similar manner that a texture map may be mapped to a rectangular surface area of a geometry, a weldable wexel map may be mapped to a rectangular surface of a welding coupon. Each element of the weldable map is termed a wexel in the same sense that each element of a picture is termed a pixel (a contraction of picture element). A pixel contains channels of information that define a color (e.g., red, green, blue, etc.). A wexel contains channels of information (e.g., P, H, E, D) that define a weldable surface in virtual reality space.

In accordance with an embodiment of the present invention, the format of a wexel is summarized as channels PHED (Puddle, Heat, Extra, Displacement) which contains four floating point numbers. The Extra channel is treated as a set of bits which store logical information about the wexel such as, for example, whether or not there is any slag at the wexel location. The Puddle channel stores a displacement value for any liquefied metal at the wexel location. The Displacement channel stores a displacement value for the solidified metal at the wexel location. The Heat channel stores a value giving the magnitude of heat at the wexel location. In this way, the weldable part of the coupon can show displacement due to a welded bead, a shimmering surface "puddle" due to liquid metal, color due to heat, etc. All of these effects are achieved by the vertex and pixel shaders applied to the weldable surface. In accordance with an alternative embodiment of the present invention, a wexel may also incorporate specific metallurgical properties that may change during a welding simulation, for example, due to heat input to the wexel. Such metallurgical properties may be used to simulate virtual testing and inspection of a weldment.

In accordance with an embodiment of the present invention, a displacement map and a particle system are used where the particles can interact with each other and collide with the displacement map. The particles are virtual dynamic fluid particles and provide the liquid behavior of the weld puddle but are not rendered directly (i.e., are not visually seen directly). Instead, only the particle effects on the displacement map are visually seen. Heat input to a wexel affects the movement of nearby particles. There are two types of displacement involved in simulating a welding puddle which include Puddle and Displacement. Puddle is "temporary" and only lasts as long as there are particles and heat present. Displacement is "permanent". Puddle displacement is the liquid metal of the weld which changes rapidly (e.g., shimmers) and can be thought of as being "on top" of the Displacement. The particles overlay a portion of a virtual surface displacement map (i.e., a wexel map). The Displacement represents the permanent solid metal including both the initial base metal and the weld bead that has solidified.

In accordance with an embodiment of the present invention, the simulated welding process in virtual reality space works as follows: Particles stream from the emitter (emitter of the simulated MWT 160) in a thin cone. The particles make first contact with the surface of the simulated welding coupon where the surface is defined by a wexel map. The particles interact with each other and the wexel map and build up in real-time. More heat is added the nearer a wexel is to the emitter. Heat is modeled in dependence on distance from the arc point and the amount of time that heat is input from the arc. Certain visuals (e.g., color, etc.) are driven by the heat. A weld puddle is drawn or rendered in virtual reality space for wexels having enough heat. Wherever it is hot enough, the wexel map liquefies, causing the Puddle displacement to "raise up" for those wexel locations. Puddle displacement is determined by sampling the "highest" particles at each wexel location. As the emitter moves on along the weld trajectory, the wexel locations left behind cool. Heat is removed from a wexel location at a particular rate. When a cooling threshold is reached, the wexel map solidifies. As such, the Puddle displacement is gradually converted to Displacement (i.e., a solidified bead). Displacement added is equivalent to Puddle removed such that the overall height does not change. Particle lifetimes are tweaked or adjusted to persist until solidification is complete. Certain particle properties that are modeled in the system 100 include attraction/repulsion, velocity (related to heat), dampening (related to heat dissipation), direction (related to gravity).

Figure 19A:
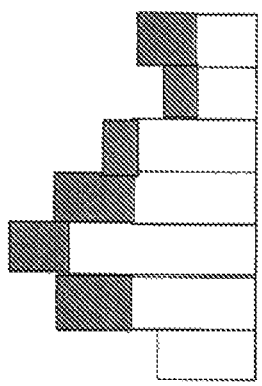
FIGS. 19A-19C illustrate an example embodiment of the concept of a dual-displacement puddle model of the system of FIG. 1.
Figure 19B:
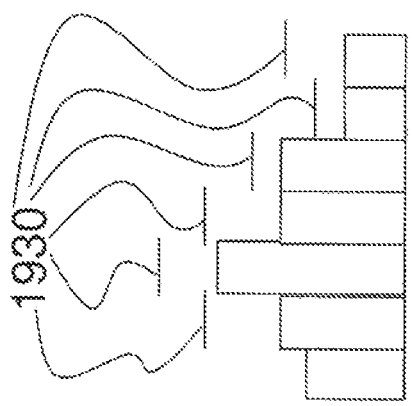
Figure 19C:
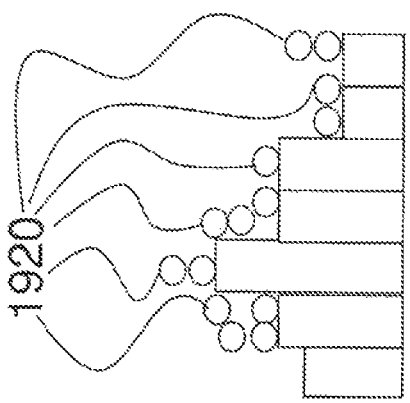

FIGS. 19A-19C illustrate an example embodiment of the concept of a dual-displacement (displacement and particles) puddle model of the system 100 of FIG. 1. Welding coupons are simulated in virtual reality space having at least one surface. The surfaces of the welding coupon are simulated in virtual reality space as a double displacement layer including a solid displacement layer and a puddle displacement layer. The puddle displacement layer is capable of modifying the solid displacement layer.

As described herein, "puddle" is defined by an area of the wexel map where the Puddle value has been raised up by the presence of particles. The sampling process is represented in FIGS. 19A-19C. A section of a wexel map is shown having seven adjacent wexels. The current Displacement values are represented by un-shaded rectangular bars 1910 of a given height (i.e., a given displacement for each wexel). In FIG. 19A, the particles 1920 are shown as round un-shaded dots colliding with the current Displacement levels and are piled up. In FIG. 19B, the "highest" particle heights 1930 are sampled at each wexel location. In FIG. 19C, the shaded rectangles 1940 show how much Puddle has been added on top of the Displacement as a result of the particles. The weld puddle height is not instantly set to the sampled values since Puddle is added at a particular liquification rate based on Heat. Although not shown in FIGS. 19A-19C, it is possible to visualize the solidification process as the Puddle (shaded rectangles) gradually shrink and the Displacement (un-shaded rectangles) gradually grow from below to exactly take the place of the Puddle. In this manner, real-time molten metal fluidity characteristics are accurately simulated. As a user practices a particular welding process, the user is able to observe the molten metal fluidity characteristics and the heat dissipation characteristics of the weld puddle in real-time in virtual reality space and use this information to adjust or maintain his welding technique.

The number of wexels representing the surface of a welding coupon is fixed. Furthermore, the puddle particles that are generated by the simulation to model fluidity are temporary, as described herein. Therefore, once an initial puddle is generated in virtual reality space during a simulated welding process using the system 100, the number of wexels plus puddle particles tends to remain relatively constant. This is because the number of wexels that are being processed is fixed and the number of puddle particles that exist and are being processed during the welding process tend to remain relatively constant because puddle particles are being created and "destroyed" at a similar rate (i.e., the puddle particles are temporary). Therefore, the processing load of the PPS 110 remains relatively constant during a simulated welding session.

In accordance with an alternate embodiment of the present invention, puddle particles may be generated within or below the surface of the welding coupon. In such an embodiment, displacement may be modeled as being positive or negative with respect to the original surface displacement of a virgin (i.e., un-welded) coupon. In this manner, puddle particles may not only build up on the surface of a welding coupon, but may also penetrate the welding coupon. However, the number of wexels is still fixed and the puddle particles being created and destroyed is still relatively constant.

In accordance with alternate embodiments of the present invention, instead of modeling particles, a wexel displacement map may be provided having more channels to model the fluidity of the puddle. Or, instead of modeling particles, a dense voxel map may be modeled. Or, instead of a wexel map, only particles may be modeled which are sampled and never go away. Such alternative embodiments may not provide a relatively constant processing load for the system, however.

Furthermore, in accordance with an embodiment of the present invention, blowthrough or a keyhole is simulated by taking material away. For example, if a user keeps an arc in the same location for too long, in the real world, the material would burn away causing a hole. Such real-world burn-through is simulated in the system 100 by wexel decimation techniques. If the amount of heat absorbed by a wexel is determined to be too high by the system 100, that wexel may be flagged or designated as being burned away and rendered as such (e.g., rendered as a hole). Subsequently, however, wexel re-constitution may occur for certain welding process (e.g., pipe welding) where material is added back after being initially burned away. In general, the system 100 simulates wexel decimation (taking material away) and wexel reconstitution (i.e., adding material back). Furthermore, removing material in root-pass welding is properly simulated in the system 100.

Furthermore, removing material in root-pass welding is properly simulated in the system 100. For example, in the real world, grinding of the root pass may be performed prior to subsequent welding passes. Similarly, system 100 may simulate a grinding pass that removes material from the virtual weld joint. It will be appreciated that the material removed may be modeled as a negative displacement on the wexel map. That is to say that the grinding pass removes material that is modeled by the system 100 resulting in an altered bead contour. Simulation of the grinding pass may be automatic, which is to say that the system 100 removes a predetermined thickness of material, which may be respective to the surface of the root pass weld bead.

In an alternative embodiment, an actual grinding tool, or grinder, may be simulated that turns on and off by activation of the mock welding tool 160 or another input device. It is noted that the grinding tool may be simulated to resemble a real world grinder. In this embodiment, the user maneuvers the grinding tool along the root pass to remove material responsive to the movement thereof. It will be understood that the user may be allowed to remove too much material. In a manner similar to that described above, holes or other defects (described above) may result if the user grinds away too much material. Still, hard limits or stops may be implemented, i.e. programmed, to prevent the user from removing too much material or indicate when too much material is being removed.

In addition to the non-visible "puddle" particles described herein, the system 100 also uses three other types of visible particles to represent Arc, Flame, and Spark effects, in accordance with an embodiment of the present invention. These types of particles do not interact with other particles of any type but interact only with the displacement map. While these particles do collide with the simulated weld surface, they do not interact with each other. Only Puddle particles interact with each other, in accordance with an embodiment of the present invention. The physics of the Spark particles is setup such that the Spark particles bounce around and are rendered as glowing dots in virtual reality space.

The physics of the Arc particles is setup such that the Arc particles hit the surface of the simulated coupon or weld bead and stay for a while. The Arc particles are rendered as larger dim bluish-white spots in virtual reality space. It takes many such spots superimposed to form any sort of visual image. The end result is a white glowing nimbus with blue edges.

The physics of the Flame particles is modeled to slowly raise upward. The Flame particles are rendered as medium sized dim red-yellow spots. It takes many such spots superimposed to form any sort of visual image. The end result is blobs of orange-red flames with red edges raising upward and fading out. Other types of non-puddle particles may be implemented in the system 100, in accordance with other embodiments of the present invention. For example, smoke particles may be modeled and simulated in a similar manner to flame particles.

The final steps in the simulated visualization are handled by the vertex and pixel shaders provided by the shaders 117 of the GPUs 115 (see FIG. 11). The vertex and pixel shaders apply Puddle and Displacement, as well as surface colors and reflectivity altered due to heat, etc. The Extra (E) channel of the PHED wexel format, as discussed earlier herein, contains all of the extra information used per wexel. In accordance with an embodiment of the present invention, the extra information includes a non virgin bit (true=bead, false=virgin steel), a slag bit, an undercut value (amount of undercut at this wexel where zero equals no undercut), a porosity value (amount of porosity at this wexel where zero equals no porosity), and a bead wake value which encodes the time at which the bead solidifies. There are a set of image maps associated with different coupon visuals including virgin steel, slag, bead, and porosity. These image maps are used both for bump mapping and texture mapping. The amount of blending of these image maps is controlled by the various flags and values described herein.

A bead wake effect is achieved using a 1D image map and a per wexel bead wake value that encodes the time at which a given bit of bead is solidified. Once a hot puddle wexel location is no longer hot enough to be called "puddle", a time is saved at that location and is called "bead wake". The end result is that the shader code is able to use the 1D texture map to draw the "ripples" that give a bead its unique appearance which portrays the direction in which the bead was laid down. In accordance with an alternative embodiment of the present invention, the system 100 is capable of simulating, in virtual reality space, and displaying a weld bead having a real-time weld bead wake characteristic resulting from a real-time fluidity-to-solidification transition of the simulated weld puddle, as the simulated weld puddle is moved along a weld trajectory.

In accordance with an alternative embodiment of the present invention, the system 100 is capable of teaching a user how to troubleshoot a welding machine. For example, a troubleshooting mode of the system may train a user to make sure he sets up the system correctly (e.g., correct gas flow rate, correct power cord connected, etc.) In accordance with another alternate embodiment of the present invention, the system 100 is capable of recording and playing back a welding session (or at least a portion of a welding session, for example, N frames). A track ball may be provided to scroll through frames of video, allowing a user or instructor to critique a welding session. Playback may be provided at selectable speeds as well (e.g., full speed, half speed, quarter speed). In accordance with an embodiment of the present invention, a split-screen playback may be provided, allowing two welding sessions to be viewed side-by-side, for example, on the ODD 150. For example, a "good" welding session may be viewed next to a "poor" welding session for comparison purposes.

Virtual Testing and Inspection

An embodiment of the present invention comprises a system for the virtual testing and inspecting of a virtual weldment. The system includes a programmable processor-based subsystem operable to execute coded instructions. The coded instructions include a rendering engine and an analysis engine. The rendering engine is configured to render at least one of a three-dimensional (3D) virtual weldment before simulated testing, a 3D animation of a virtual weldment under simulated testing, and a 3D virtual weldment after simulated testing. The analysis engine is configured to perform simulated testing of a 3D virtual weldment. The simulated testing may include at least one of simulated destructive testing and simulated non-destructive testing. The analysis engine is further configured to perform inspection of at least one of a 3D virtual weldment before simulated testing, a 3D animation of a virtual weldment under simulated testing, and a 3D virtual weldment after simulated testing for at least one of pass/fail conditions and defect/discontinuity characteristics. The system also includes at least one display device operatively connected to the programmable processor-based subsystem for displaying at least one of a 3D virtual weldment before simulated testing, a 3D animation of a virtual weldment under simulated testing, and a 3D virtual weldment after simulated testing. The system further includes a user interface operatively connected to the programmable processor-based subsystem and configured for at least manipulating an orientation of at least one of a 3D virtual weldment before simulated testing, a 3D animation of a virtual weldment under simulated testing, and a 3D virtual weldment after simulated testing on the at least one display device. The programmable processor-based subsystem may include a central processing unit and at least one graphics processing unit. The at least one graphics processing unit may include a computer unified device architecture (CUDA) and a shader. The analysis engine may include at least one of an expert system, a support vector machine (SVM), a neural network, and one or more intelligent agents. The analysis engine may use welding code data or welding standards data to analyze at least one of a 3D virtual weldment before simulated testing, a 3D animation of a virtual weldment under simulated testing, and a 3D virtual weldment after simulated testing. The analysis engine may also include programmed virtual inspection tools that can be accessed and manipulated by a user using the user interface to inspect a virtual weldment.

Another embodiment of the present invention comprises a virtual welding testing and inspecting simulator. The simulator includes means for performing one or more simulated destructive and non-destructive tests on a rendered 3D virtual weldment. The simulator also includes means for analyzing results of the one or more simulated destructive and non-destructive tests on the rendered 3D virtual weldment. The simulator further includes means for inspecting the rendered 3D virtual weldment at least after a simulated test of the 3D virtual weldment. The simulator may also include means for rendering a 3D virtual weldment. The simulator may further include means for rendering a 3D animation of the virtual weldment while performing the one or more simulated destructive and non-destructive tests. The simulator may also include means for displaying and manipulating an orientation of the 3D animation of the virtual weldment. The simulator may further include means for inspecting a 3D virtual weldment before, during, and after simulated testing of the 3D virtual weldment.

A further embodiment of the present invention comprises a method of assessing the quality of a rendered baseline virtual weldment in virtual reality space. The method includes subjecting the baseline virtual weldment to a first computer-simulated test configured to test at least one characteristic of the baseline virtual weldment. The method also includes rendering a first tested virtual weldment and generating first test data in response to the first test. The method further includes subjecting the first tested virtual weldment and the first test data to a computer-simulated analysis configured to determine at least one pass/fail condition of the first tested virtual weldment with respect to the at least one characteristic. The first computer-simulated test may simulate a real-world destructive test or a real-world non-destructive test. The method may further include re-rendering the baseline virtual weldment in virtual reality space, subjecting the baseline virtual weldment to a second computer-simulated test configured to test at least one other characteristic of the baseline virtual weldment, rendering a second tested virtual weldment and generating second test data in response to the second test, and subjecting the second tested virtual weldment and the second test data to a computer-simulated analysis configured to determine at least one other pass/fail condition of the second tested virtual weldment with respect to the at least one other characteristic. The second computer-simulated test may simulate a real-world destructive test or a real-world non-destructive test. The method may further include manually inspecting a displayed version of the rendered first tested virtual weldment. The method may also include manually inspecting a displayed version of the rendered second tested virtual weldment.

A completed virtual weldment formed in virtual reality space may be analyzed for weld defects and a determination may be made as to whether or not such a weldment would pass or fail standard industry tests, in accordance with an embodiment of the present invention. Certain defects may cause certain types of failures within certain locations within the weldment. The data representing any defects or discontinuities is captured as part of the definition of the virtual weldment either by pre-defining the virtual weldment or by creating a virtual weldment using a virtual reality welding simulator system (e.g., a virtual reality arc welding (VRAW) system) as part of a virtual welding process.

Also, criterion for pass/fail of any particular test is known apriori based on predefined welding codes and standards such as, for example, the AWS welding standards. In accordance with an embodiment of the present invention, an animation is created allowing visualization of a simulated destructive or non-destructive test of the virtual weldment. The same virtual weldment can be tested many different ways. Testing and inspection of a virtual weldment may occur on a virtual reality welding simulator system (e.g., a virtual reality arc welding (VRAW) system) which is described in detail later herein. Inspection of a virtual weldment may occur on a standalone virtual weldment inspection (VWI) system which is described in detail later herein.

The VRAW system is capable of allowing a user to create a virtual weldment in real time by simulating a welding scenario as if the user is actually welding, and capturing all of the resultant data which defines the virtual weldment, including defects and discontinuities. The VRAW system is further capable of performing virtual destructive and non-destructive testing and inspection of the virtual weldment as well as materials testing and inspection of the virtual weldment. The standalone VWI system is capable of inputting a predefined virtual weldment or a virtual weldment created using the VRAW system, and performing virtual inspection of the virtual weldment. A three-dimensional virtual weldment or part may be derived from a computer-aided design (CAD) model, in accordance with an embodiment of the present invention. Therefore, testing and inspection may be simulated on irregular geometries for specific parts. In accordance with an embodiment of the present application, the VRAW system is also capable of performing virtual inspection of a predefined virtual weldment. For example, the VRAW system may include pre-made virtual weldments which a student may refer to in order to learn how a good weld should look.

Various types of welding discontinuities and defects include improper weld size, poor bead placement, concave bead, excessive convexity, undercut, porosity, incomplete fusion, slag inclusion, excess spatter, overfill, cracks, and burnthrough or melt through which are all well known in the art. For example, undercut is often due to an incorrect angle of welding. Porosity is cavity type discontinuities formed by gas entrapment during solidification, often caused by moving the arc too far away from the weldment. Other problems may occur due to an incorrect process, fill material, wire size, or technique, all of which may be simulated.

Various types of destructive tests that may be performed include a root bend test, a face bend test, a side bend test, a tensile or pull test, a break test (e.g., a nick break test or a T-joint break test), an impact test, and a hardness test which are all well known in the art. For many of these tests, a piece is cut out of the weldment and the test is performed on that piece. For example, a root bend test is a test that bends the cut piece from the weldment such that the weld root is on the convex surface of a specified bend radius. A side bend test is a test that bends the weldment such that the side of a transverse section of the weld is on the convex surface of a specified bend radius. A face bend test is a test that bends the weldment such that the weld face is on the convex surface of a specified bend radius.

A further destructive test is a tensile or pull test where a cut piece from a weldment is pulled or stretched until the weld breaks, testing the elastic limit and tensile strength of the weld. Another destructive test is a break test. One type of break test is a test on a weldment having two sections welded together at 90 degrees to each other to form a T-joint, where one section is bent over toward the other section to determine if the weld breaks or not. If the weld breaks, the internal weld bead can be inspected. An impact test is a test where an impacting element is forced into a weldment at various temperatures to determine the ability of the weldment to resist impact. A weldment may have good strength under static loading, yet may fracture if subjected to a high-velocity impact. For example, a pendulum device may be used to swing down and hit a weldment (possibly breaking the weldment) and is called a Charpy impact test.

A further destructive test is a hardness test which tests a weldments ability to resist indentation or penetration at the weld joint. The hardness of a weldment depends on the resultant metallurgical properties at the weld joint which is based, in part, on how the weld joint cools in the heat-affected zone. Two types of hardness tests are the Brinell test and the Rockwell tests. Both tests use a penetrator with either a hard sphere or a sharp diamond point. The penetrator is applied to the weld under a standardized load. When the load is removed, the penetration is measured. The test may be performed at several points in the surrounding metal and is a good indicator of potential cracking. A further type of destructive test is a bend-on-pipe test where a welded pipe is cut to take a piece out of each of the four quadrants of the pipe. A root bend is performed on two of the pieces and a face bend is performed on the other two pieces.

Various types of non-destructive tests that may be performed include radiographic tests and ultrasonic tests. In a radiographic test, the weldment is exposed to X-rays and an X-ray image of the weld joint is generated which can be examined. In an ultrasonic test, the weldment is exposed to ultrasonic energy and various properties of the weld joint are derived from the reflected ultrasonic waves. For certain types of non-destructive testing, the weldment is subjected (in a virtual manner) to X-ray or ultrasound exposure and defects such as internal porosity, slag entrapment, and lack of penetration are visually presented to the user. Another type of non-destructive testing is dye penetrant or liquid penetrant testing which may be simulated in a virtual reality manner. A weldment is subjected to a dye material and the weldment is then exposed to a developer to determine, for example, if surface cracks exist that are not visible to the naked eye. A further non-destructive testing is magnetic particle testing that is also used for detecting cracks and may be simulated in a virtual reality manner. Small cracks below the surface of a weldment can be created by improper heat input to the weldment. In accordance with an embodiment of the present invention, travel speed and other welding process parameters are tracked in the virtual reality environment and used to determine heat input to the weldment and, therefore, cracks near the surface of the weldment which may be detected using virtual non-destructive testing.

Furthermore, simulation of a weldment in a simulated structure may be performed. For example, a virtual weldment having a virtual weld joint created by a user of a VRAW system may be incorporated into a virtual simulation of a bridge for testing. The virtual weldment may correspond to a key structural element of the bridge, for example. The bridge may be specified to last one-hundred years before failing. The test may involve observing the bridge over time (i.e., virtual time) to see if the weldment fails. For example, if the weldment is of poor quality (i.e., has unacceptable discontinuities or defects), the simulation may show an animation of the bridge collapsing after 45 years.

FIGS. 1-19C disclose an embodiment of a virtual reality arc welding (VRAW) system 100 capable of simulating, in virtual reality space, a real time welding scenario including formation of a virtual weldment by a user (welder) and various defect and discontinuity characteristics associated with the weldment, as well as simulating testing and inspection of the virtual weldment and displaying an animation of the virtual weldment under test to observe the effects. The VRAW system is capable of creating a sophisticated virtual rendering of a weldment and performing a sophisticated analysis of the virtual rendering that compares various characteristics of the virtual weldment to a welding code.

Virtual inspection may be implemented on the VRAW system in any of a number of different ways and/or combinations thereof. In accordance with one embodiment of the present invention, the VRAW system includes an expert system and is driven by a set of rules. An expert system is software that attempts to provide an answer to a problem, or clarify uncertainties where normally one or more human experts would need to be consulted. Expert systems are most common in a specific problem domain, and is a traditional application and/or subfield of artificial intelligence. A wide variety of methods can be used to simulate the performance of the expert, however, common to many are 1) the creation of a knowledge base which uses some knowledge representation formalism to capture the Subject Matter Expert's (SME) knowledge (e.g., a certified welding inspector's knowledge) and 2) a process of gathering that knowledge from the SME and codifying it according to the formalism, which is called knowledge engineering. Expert systems may or may not have learning components but a third common element is that, once the system is developed, it is proven by being placed in the same real world problem solving situation as the human SME, typically as an aid to human workers or a supplement to some information system.

In accordance with another embodiment of the present invention, the VRAW system includes support vector machines. Support vector machines (SVMs) are a set of related supervised learning methods used for classification and regression. Given a set of training examples, each marked as belonging to one of two categories, a SVM training algorithm builds a model that predicts whether a new example falls into one category or the other (e.g., pass/fail categories for particular defects and discontinuities). Intuitively, an SVM model is a representation of the examples as points in space, mapped so that the examples of the separate categories are divided by a clear gap that is as wide as possible. New examples are then mapped into that same space and predicted to belong to a category based on which side of the gap they fall on.

In accordance with still a further embodiment of the present invention, the VRAW system includes a neural network that is capable of being trained and adapted to new scenarios. A neural network is made up of interconnecting artificial neurons (programming constructs that mimic the properties of biological neurons). Neural networks may either be used to gain an understanding of biological neural networks, or for solving artificial intelligence problems without necessarily creating a model of a real biological system. In accordance with an embodiment of the present invention, a neural network is devised that inputs defect and discontinuity data from virtual weldment data, and outputs pass/fail data.

In accordance with various embodiments of the present invention, intelligent agents may be employed to provide feedback to a student concerning areas where the student needs more practice, or to provide feedback to an instructor or educator as to how to modify the teaching curriculum to improve student learning. In artificial intelligence, an intelligent agent is an autonomous entity, usually implemented in software, which observes and acts upon an environment and directs its activity towards achieving goals. An intelligent agent may be able to learn and use knowledge to achieve a goal (e.g., the goal of providing relevant feedback to a welding student or a welding educator).

In accordance with an embodiment of the present invention, a virtual rendering of a weldment created using the VRAW system is exported to a destructive/non-destructive testing portion of the system. The testing portion of the system is capable of automatically generating cut sections of the virtual weldment (for destructive testing) and submitting those cut sections to one of a plurality of possible tests within the testing portion of the VRAW system. Each of the plurality of tests is capable of generating an animation illustrating that particular test. The VRAW system is capable of displaying the animation of the test to the user. The animation clearly shows to the user whether or not the virtual weldment generated by the user passes the test. For non-destructive testing, the weldment is subjected (in a virtual manner) to X-ray or ultrasound exposure and defects such as internal porosity, slag entrapment, and lack of penetration are visually presented to the user.

For example, a virtual weldment that is subjected to a virtual bend test may be shown to break in the animation at a location where a particular type of defect occurs in the weld joint of the virtual weldment. As another example, a virtual weldment that is subjected to a virtual bend test may be shown to bend in the animation and crack or show a significant amount of defect, even though the weldment does not completely break. The same virtual weldment may be tested over and over again for different tests using the same cut sections (e.g., the cut sections may be reconstituted or re-rendered by the VRAW system) or different cut sections of the virtual weldment. In accordance with an embodiment of the present invention, a virtual weldment is tagged with metallurgical characteristics such as, for example, type of metal and tensile strength which are factored into the particular selected destructive/non-destructive test. Various common base welding metals are simulated, including welding metals such as aluminum and stainless, in accordance with various embodiments of the present invention.

In accordance with an embodiment of the present invention, a background running expert system may pop up in a window on a display of the VRAW system and indicate to the user (e.g., via a text message and/or graphically) why the weldment failed the test (e.g., too much porosity at these particular points in the weld joint) and what particular welding standard(s) was not met. In accordance with another embodiment of the present invention, the VRAW system may hyper-text link to an external tool that ties the present test to a particular welding standard. Furthermore, a user may have access to a knowledge base including text, pictures, video, and diagrams to support their training.

In accordance with an embodiment of the present invention, the animation of a particular destructive/non-destructive test is a 3D rendering of the virtual weldment as modified by the test such that a user may move the rendered virtual weldment around in a three-dimensional manner on a display of the VRAW system during the test to view the test from various angles and perspectives. The same 3D rendered animation of a particular test may be played over and over again to allow for maximum training benefit for the same user or for multiple users.

In accordance with an embodiment of the present invention, the rendered virtual weldment and/or the corresponding 3D rendered animation of the virtual weldment under test may be exported to an inspection portion of the system to perform an inspection of the weld and/or to train a user in welding inspection (e.g., for becoming a certified welding inspector). The inspection portion of the system includes a teaching mode and a training mode.

In the teaching mode, the virtual weldment and/or the 3D rendered animation of a virtual weldment under test is displayed and viewed by a grader (trainer) along with a welding student. The trainer and the welding student are able to view and interact with the virtual weldment. The trainer is able to make a determination (e.g., via a scoring method) how well the welding student performed at identifying defects and discontinuities in the virtual weldment, and indicate to the welding student how well the welding student performed and what the student missed by interacting with the displayed virtual weldment (viewing from different perspectives, etc.).

In the training mode, the system asks a welding inspector student various questions about the virtual weldment and allows the welding inspector student to input answers to the questions. The system may provide the welding inspector student with a grade at the end of the questioning. For example, the system may initially provide sample questions to the welding inspector student for one virtual weldment and then proceed to provide timed questions to the welding inspector student for another virtual weldment which is to be graded during a testing mode.

The inspection portion of the system may also provide certain interactive tools that help a welding inspector student or trainer to detect defects and make certain measurements on the virtual weld which are compared to predefined welding standards (e.g., a virtual gauge that measures penetration of a root weld and compares the measurement to a required standard penetration). Grading of a welding inspector student may also include whether or not the welding inspector student uses the correct interactive tools to evaluate the weld. In accordance with an embodiment of the present invention, the inspection portion of the system, based on grading (i.e., scoring) determines which areas the welding inspector student needs help and provides the welding inspector student with more representative samples upon which to practice inspecting.

As discussed previously herein, intelligent agents may be employed to provide feedback to a student concerning areas where the student needs more practice, or to provide feedback to an instructor or educator as to how to modify the teaching curriculum to improve student learning. In artificial intelligence, an intelligent agent is an autonomous entity, usually implemented in software, which observes and acts upon an environment and directs its activity towards achieving goals. An intelligent agent may be able to learn and use knowledge to achieve a goal (e.g., the goal of providing relevant feedback to a welding student or a welding educator). In accordance with an embodiment of the present invention, the environment perceived and acted upon by an intelligent agent is the virtual reality environment generated by the VRAW system, for example.

Again, the various interactive inspection tools may be used on either the virtual weldment before being subjected to testing, the virtual weldment after being subjected to testing, or both. The various interactive inspection tools and methodologies are configured for various welding processes, types of metals, and types of welding standards, in accordance with an embodiment of the present invention. On the standalone VWI system, the interactive inspection tools may be manipulated using a keyboard and mouse, for example. On the VRAW system, the interactive inspection tools may be manipulated via a joystick and/or a console panel, for example.

As discussed earlier herein, a standalone virtual weldment inspection (VWI) system is capable of inputting a predefined virtual weldment or a virtual weldment created using the VRAW system, and performing virtual inspection of the virtual weldment. However, unlike the VRAW system, the VWI system may not be capable of creating a virtual weldment as part of a simulated virtual welding process, and may or may not be capable of performing virtual destructive/non-destructive testing of that weldment, in accordance with certain embodiments of the present invention.

FIG. 20 illustrates an example embodiment of a standalone virtual weldment inspection (VWI) system 2000 capable of simulating inspection of a virtual weldment and displaying an animation of the virtual weldment under inspection to observe the effects due to various characteristics associated with the weldment. In one embodiment the VWI system 2000 includes a programmable processor-based subsystem (PPS) 2010, similar to the PPS 110 of FIG. 1. The VWI system 2000 further includes an observer display device (ODD) 2050, similar to the ODD 150 of FIG. 1, operatively connected to the PPS 2010. The VWI system 2000 also includes a keyboard 2020 and a mouse 2030 operatively connected to the PPS 2010.

In a first embodiment of the system 2000 of FIG. 20, the PPS 110 provides hardware and software configured as a rendering engine for providing 3D animated renderings of virtual weldments. The PPS 110 also provides hardware and software configured as an analysis engine for performing testing and inspection of a virtual weldment. The PPS 2010 is capable of inputting data representative of a virtual weldment and generating an animated 3D rendering of the virtual weldment for inspection using a rendering engine of the PPS 110 operating on the input data. The virtual weldment data may be "pre-canned" (i.e. pre-defined) virtual weldments (e.g., generated using a separate computer system) or virtual weldment data created using a virtual reality welding simulator system (e.g., a VRAW system as previously described herein).

Furthermore, in accordance with an enhanced embodiment of the present invention, the PPS 2010 includes an advanced analysis/rendering/animation capability that allows the VWI system 2000 to perform a virtual destructive/non-destructive test on an input virtual weldment and display an animation of the test, similar to that of the VRAW system.

In accordance with an embodiment of the present invention, a virtual rendering of a weldment created using a VRAW system in exported the VWI system. A testing portion of the VWI system is capable of automatically generating cut sections of the virtual weldment and submitting those cut sections (or the uncut virtual weldment itself) to one of a plurality of possible destructive and non-destructive tests within the testing portion of the VWI system. Each of the plurality of tests is capable of generating an animation illustrating that particular test. The VWI system is capable of displaying the animation of the test to the user. The animation clearly shows to the user whether or not the virtual weldment generated by the user passes the test.

For example, a virtual weldment that is subjected to a virtual bend test may be shown to break in the animation at a location where a particular type of defect occurs in the weld joint of the virtual weldment. As another example, a virtual weldment that is subjected to a virtual bend test may be shown to bend in the animation and crack or show a significant amount of defect, even though the weldment does not completely break. The same virtual weldment may be tested over and over again for different tests using the same cut sections (e.g., the cut sections may be reconstituted by the VWI system) or different cut sections of the virtual weldment. In accordance with an embodiment of the present invention, a virtual weldment is tagged with metallurgical characteristics such as, for example, type of metal and tensile strength which are factored into the particular selected destructive/non-destructive test.

In accordance with an embodiment of the present invention, a background running expert system may pop up in a window on a display of the VWI system and indicate to the user (e.g., via a text message and/or graphically) why the weldment failed the test (e.g., too much porosity at these particular points in the weld joint) and what particular welding standard(s) was not met. In accordance with another embodiment of the present invention, the VWI system may hyper-text link to an external tool that ties the present test to a particular welding standard.

In accordance with an embodiment of the present invention, the animation of a particular destructive/non-destructive test is a 3D rendering of the virtual weldment as modified by the test such that a user may move the rendered virtual weldment around in a three-dimensional manner on a display of the VWI system during the test to view the test from various angles and perspectives. The same 3D rendered animation of a particular test may be played over and over again to allow for maximum training benefit for the same user or for multiple users.

In a simpler, less complex embodiment of the VWI system 2000 of FIG. 20, the PPS 2010 is capable of inputting an animated 3D rendering of a virtual destructive or non-destructive test generated by a VRAW system, and displaying the animation for inspection purposes. The PPS 2010 provides hardware and software configured as an analysis engine for performing inspection of a virtual weldment. However, in this simpler embodiment, the PPS 2010 does not provide hardware and software configured as a rendering engine for providing 3D animated renderings of virtual weldments, and the analysis engine is limited to supporting inspection of a virtual weldment. The renderings and testing are done elsewhere (e.g., on a VRAW system) and are input to the VWI system in such an embodiment. In such a simpler embodiment, the PPS 2010 may be a standard, off-the-shelf personal computer or work station programmed with software to perform virtual inspection and to train with respect to welding inspection.

As previously discussed herein, virtual inspection may be implemented on the VWI system in any of a number of different ways and/or combinations thereof. In accordance with one embodiment of the present invention, the VWI system includes an expert system and is driven by a set of rules. In accordance with another embodiment of the present invention, the VWI system includes support vector machines. In accordance with still a further embodiment of the present invention, the VWI system includes a neural network that is capable of being trained and adapted to new scenarios, and/or intelligent agents that provide feedback to a student concerning areas where the student needs more practice, or to provide feedback to an instructor or educator as to how to modify the teaching curriculum to improve student learning. Furthermore, a user may have access to a knowledge base which includes text, pictures, video, and diagrams to support their training.

In accordance with an embodiment of the present invention, a rendered virtual weldment and/or a corresponding 3D rendered animation of the virtual weldment under test may be input to the VWI system to perform an inspection of the weld and/or to train a user in welding inspection (e.g., for becoming a certified welding inspector). The inspection portion of the system includes a teaching mode and a training mode.

In the teaching mode, the virtual weldment and/or the 3D rendered animation of a virtual weldment under test is displayed and viewed by a grader (trainer) along with a welding student. The trainer and the welding student are able to view and interact with the virtual weldment. The trainer is able to make a determination (e.g., via a scoring method) how well the welding student performed at identifying defects and discontinuities in the virtual weldment, and indicate to the welding student how well the welding student performed and what the student missed by interacting with the displayed virtual weldment (viewing from different perspectives, etc.).

In the training mode, the system asks a welding inspector student various questions about the virtual weldment and allows the welding inspector student to input answers to the questions. The system may provide the welding inspector student with a grade at the end of the questioning. For example, the system may initially provide sample questions to the welding inspector student for one virtual weldment and then proceed to provide timed questions to the welding inspector student for another virtual weldment which is to be graded.

The inspection portion of the system may also provide certain interactive tools that help a welding inspector student or trainer to detect defects and make certain measurements on the virtual weld which are compared to predefined welding standards (e.g., a virtual gauge that measures, for example, penetration of a root weld and compares the measurement to a required standard penetration). Grading of a welding inspector student may also include whether or not the welding inspector student uses the correct interactive tools to evaluate the weld. In accordance with an embodiment of the present invention, the inspection portion of the system, based on grading (i.e., scoring) determines which areas the welding inspector student needs help and provides the welding inspector student with more representative samples upon which to practice inspecting.

Again, the various interactive inspection tools may be used on either the virtual weldment before being subjected to testing, the virtual weldment after being subjected to testing, or both. The various interactive inspection tools and methodologies are configured for various welding processes, types of metals, and types of welding standards, in accordance with an embodiment of the present invention. On the standalone VWI system 2000, the interactive inspection tools may be manipulated using a keyboard 2020 and mouse 2030, for example. Other examples of interactive inspection tools include a virtual Palmgren gauge for performing a throat measurement, a virtual fillet gauge for determining leg size, a virtual VWAC gauge for performing a convexity measurement or measurement of undercut, a virtual sliding caliper for measuring the length of a crack, a virtual micrometer for measuring the width of a crack, and a virtual magnifying lens for magnifying a portion of a weld for inspection. Other virtual interactive inspection tools are possible as well, in accordance with various embodiments of the present invention.

Figure 21:
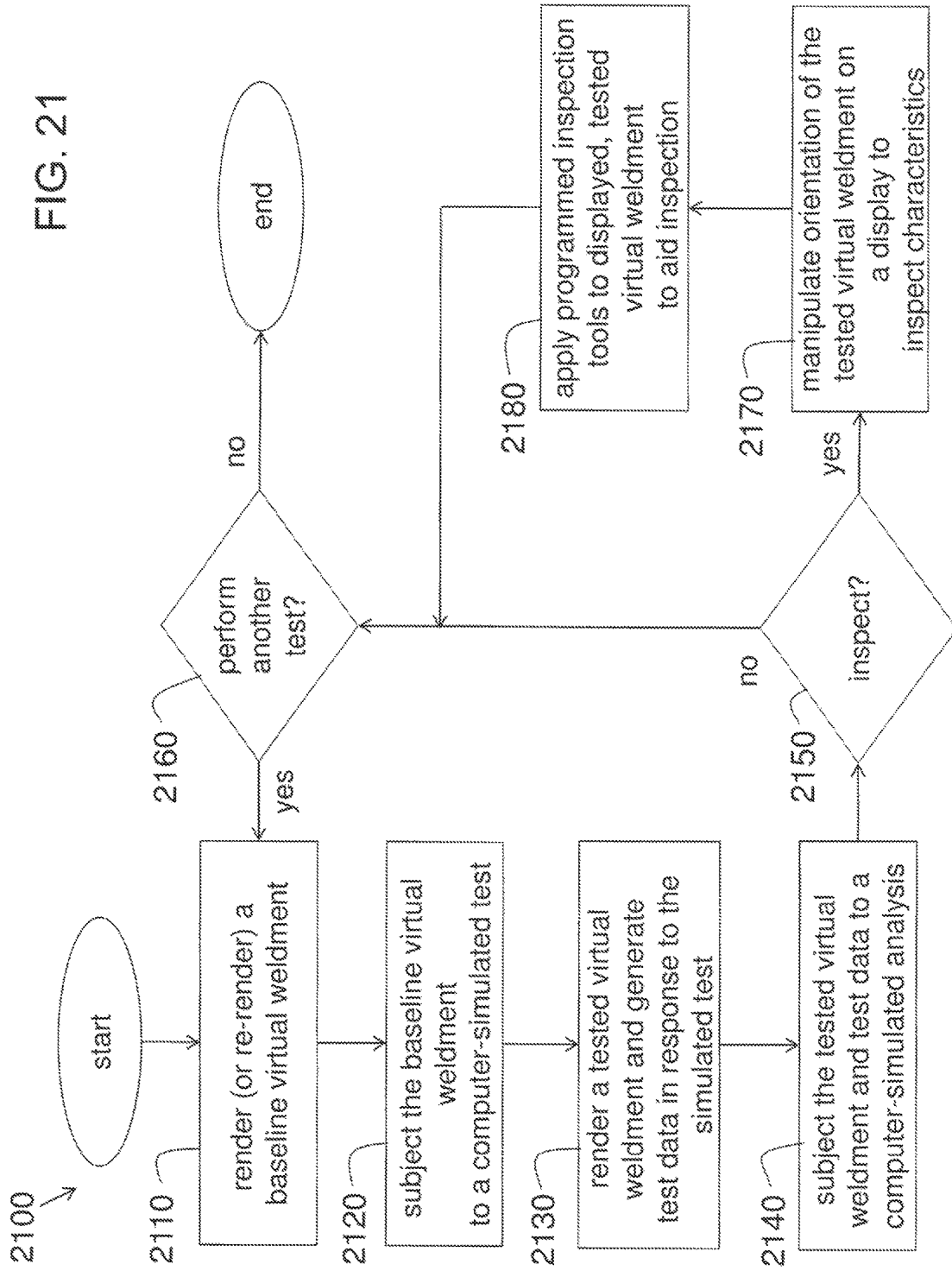
FIG. 21 illustrates a flow chart of an example embodiment of a method to assess the quality of a rendered baseline virtual weldment in virtual reality space.

FIG. 21 illustrates a flow chart of an example embodiment of a method 2100 to assess the quality of a rendered baseline virtual weldment in virtual reality space. In step 2110, a baseline virtual weldment is rendered (or rendered again . . . re-rendered). For example, a user may employ the VRAW system 100 to practice his welding technique on a virtual part and render the baseline virtual weldment, being representative of the user's welding ability. As used herein, the term "virtual weldment" may refer to the entire virtual welded part or a virtual cut section thereof, as is used in many welding tests.

In step 2120, the baseline virtual weldment is subjected to a computer-simulated test (e.g., a destructive virtual test or a non-destructive virtual test) configured to test a characteristic(s) of the baseline virtual weldment. The computer-simulated test may be performed by the VRAW system or the VWI system, for example. In step 2130, in response to the simulated testing, a tested virtual weldment is rendered (e.g., a modification of the baseline virtual weldment due to destructive testing) and associated test data is generated. In step 2140, the tested virtual weldment and the test data is subjected to a computer-simulated analysis. The computer-simulated analysis is configured to determine pass/fail conditions of the tested virtual weldment with respect to the characteristic(s) of the virtual weldment. For example, a determination may be made as to whether or not the virtual weldment passed a bend test, based on analysis of the characteristic(s) after the test.

In step 2150, a decision is made by the user to inspect the tested virtual weldment or not. If the decision is not to inspect then, in step 2160, a decision is made as to performing another test or not. If the decision is made to perform another test, then the method reverts back to step 2110 and the baseline virtual weldment is re-rendered, as if the previous test did not take place on the virtual weldment. In this manner, many tests (destructive and non-destructive) can be run on the same baseline virtual weldment and analyzed for various pass/fail conditions. In step 2150, if the decision is to inspect then, in step 2170, the tested virtual weldment (i.e., the virtual weldment after testing) is displayed to the user and the user may manipulate the orientation of the tested virtual weldment to inspect various characteristics of the tested virtual weldment. In step 2180, the user may access and apply programmed inspection tools to the tested virtual weldment to aid in the inspection. For example, a user may access a virtual gauge that measures penetration of a root weld and compares the measurement to a required standard penetration. After inspection, again in step 2160, the decision is made to perform another test or not. If another test is not to be performed, then the method ends.

Figure 22:
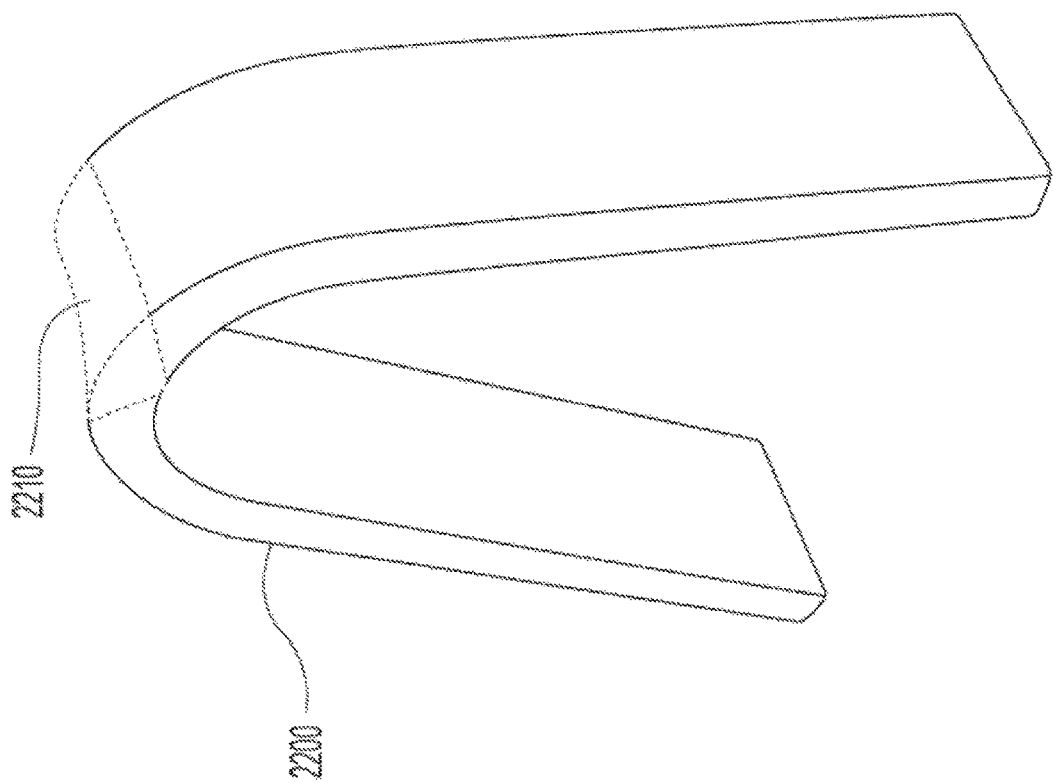
FIGS. 22-24 illustrate embodiments of virtual animations of a simulated bend test, a simulated pull test, and a simulated break test for a same virtual section of a weldment.
Figure 23:
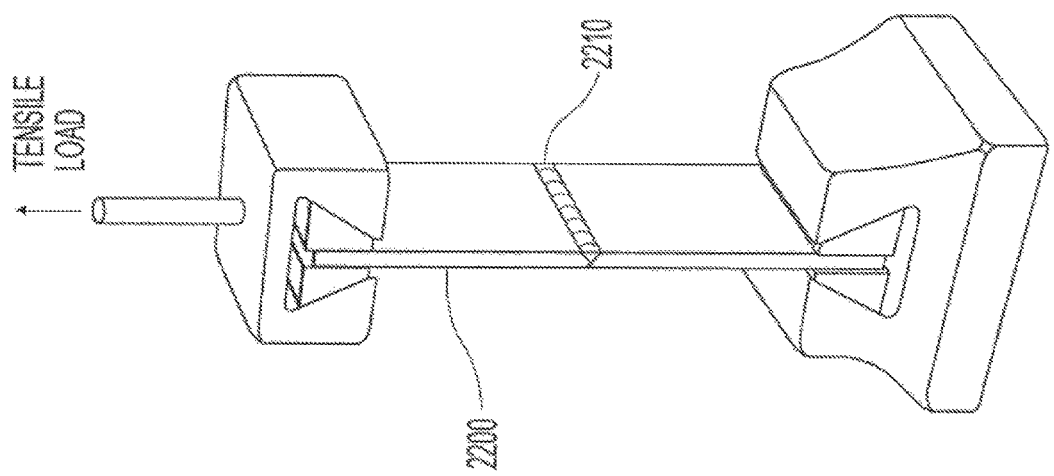
Figure 24:
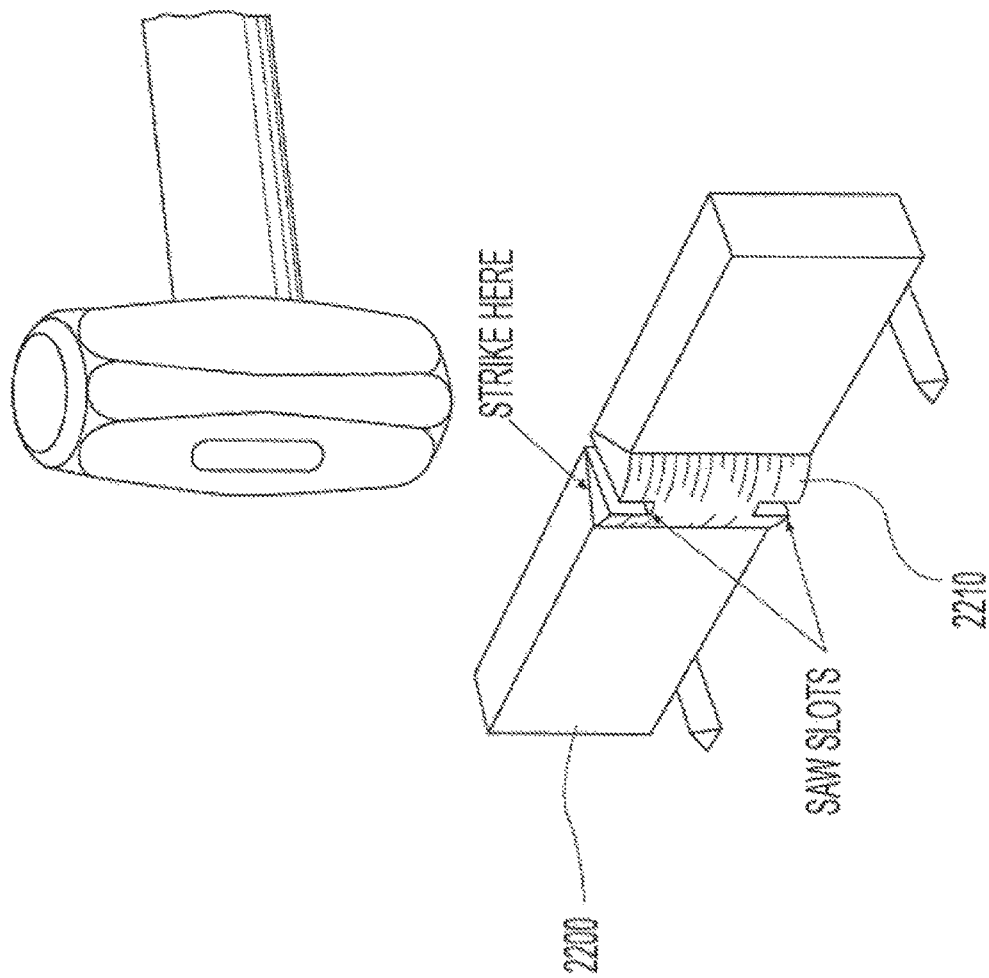

As an example, a same cut section of a virtual weldment 2200 may be subjected to a simulated bend test, a simulated tensile or pull test, and a simulated nick break test as shown in FIGS. 22-24, respectively. Referring to FIG. 22, a straight cut section of a virtual weldment 2200 having a weld joint 2210 is subject to a simulated bend test. The bend test may be performed to find various weld properties such as ductility of the welded zone, weld penetration, fusion, crystalline structure (of the fractured surface), and strength. The bend test helps to determine the quality of the weld metal, the weld junction, and the heat affected zone. Any cracking of the metal during the bend test indicates poor fusion, poor penetration, or some other condition that can cause cracking. Stretching of the metal helps indicate the ductility of the weld. A fractured surface reveals the crystalline structure of the weld. Larger crystals tend to indicate a defective welding procedure or inadequate heat treatment after welding. A quality weld has small crystals.

Referring to FIG. 23, after the bend test, the same straight cut section of the virtual weldment 2200 having the same weld joint 2210 may be re-rendered and subject to a simulated pull test. The pull test (or tensile test) may be performed to find the strength of a welded joint. In the simulated test, the virtual weldment 2200 is held on one end and pulled on the other end until the virtual weldment 2200 breaks. The tensile load or pull, at which the weldment 2200 breaks, is determined and may be compared to a standard measure for pass/fail determination.

Referring to FIG. 24, after the pull test, the same straight cut section of the virtual weldment 2200 having the same weld joint 2210 may be re-rendered and subject to a simulated nick break test. The simulated nick break test is performed to determine if the weld metal of a welded butt joint has any internal defects such as, for example, slag inclusion, gas pockets, poor fusion, and oxidized metal. A slot is cut into each side of the weld joint 2210 as shown in FIG. 24. The virtual weldment 2200 is positioned across two supports and struck with a hammer until the section of the weld 2210 between the slots fractures. The internal metal of the weld 2210 may be inspected for defects. Defects may be compared to standard measures for pass/fail determination.

Enhanced Education and Training

One embodiment provides a virtual reality arc welding system. The system includes a programmable processor-based subsystem, a spatial tracker operatively connected to the programmable processor-based subsystem, at least one mock welding tool configured to be spatially tracked by the spatial tracker, and at least one user interface configured to allow a user to perform one or more of inputting information into the system and making selections. The system further includes a communication component operatively connected to the programmable processor-based subsystem and configured to access an external communication infrastructure. Furthermore, the virtual reality welding system is configured to direct a user to one or more pre-identified web sites on the internet, in response to a user request, related to welding education and theory via the external communication infrastructure using the communication component. The user request may be prompted by one or more of the user, a human welding instructor, or an intelligent agent configured on the programmable processor-based subsystem. The system may further include one or more audio transducer devices operatively connected to the programmable processor-based subsystem and configured to facilitate audio communication between a user and a welding instructor at a remote location via the external communication infrastructure using the communication component. The system may further include one or more video devices operatively connected to the programmable processor-based subsystem and configured to facilitate visual communication between a user and a welding instructor at a remote location via the external communication infrastructure using the communication component. The virtual reality welding system may be further configured to receive commands from a remote device at a remote location via the external communication infrastructure using the communication component, wherein the commands are configured to direct one or more of troubleshooting the virtual reality welding system or changing settings of the virtual reality welding system. The remote device may include, for example, one of a hand-held mobile device, a desk top personal computer device, or a server computer operated by a remote user. The external communication infrastructure may include, for example, one or more of the internet, a cellular telephone network, or a satellite communication network.

Figure 25:
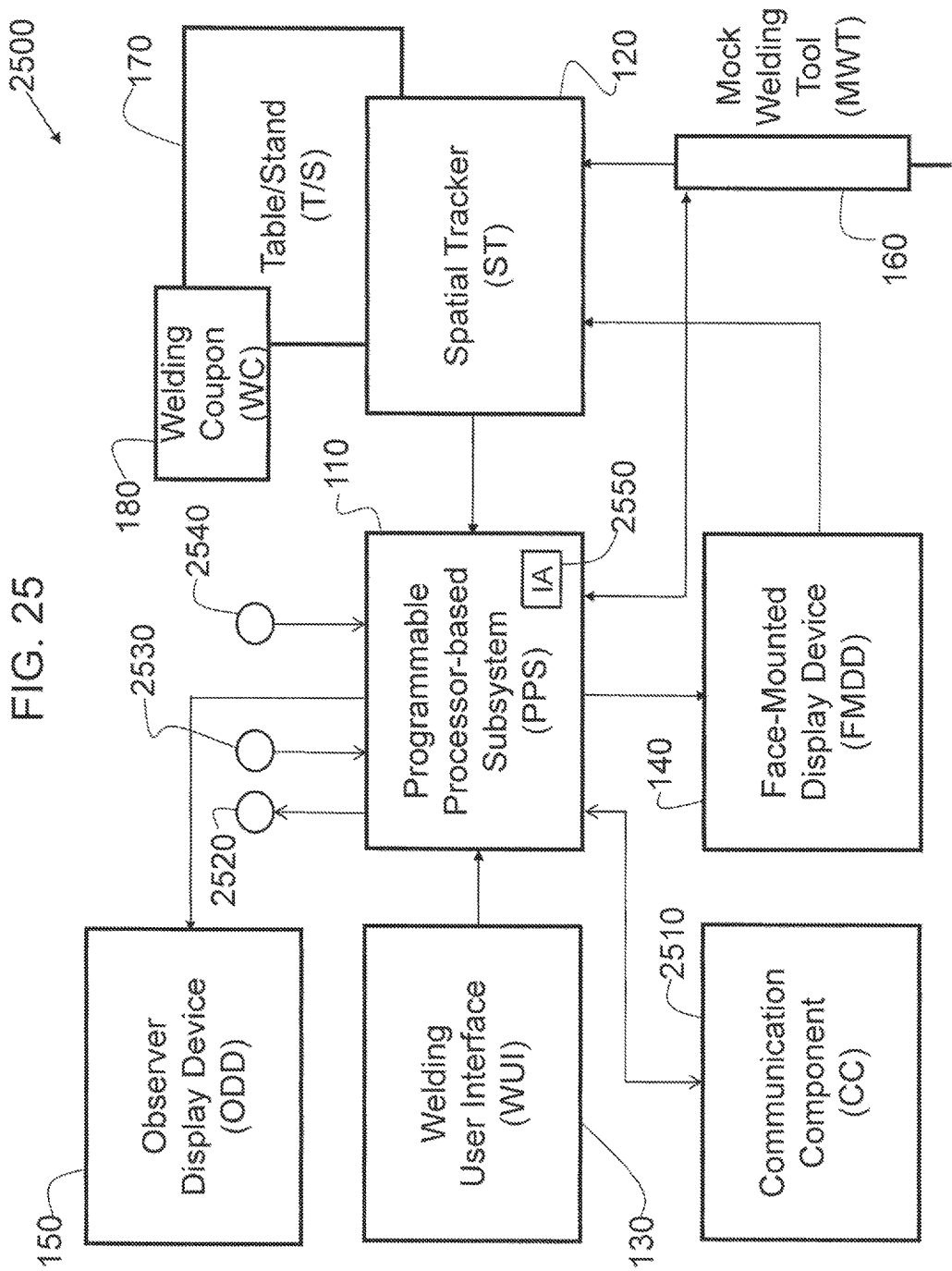
FIG. 25 illustrates a second example embodiment of a system block diagram of a system providing arc welding training in a real-time virtual reality environment.

FIG. 25 illustrates a second example embodiment of a system block diagram of a system 2500 providing arc welding training in a real-time virtual reality environment. The system 2500 is similar to the system 100 of FIG. 1. However, the system 2500 of FIG. 25 illustrates additional elements including a communication component (CC) 2510, audio transducers 2520 (e.g., a speaker) and 2530 (e.g., a microphone), a video device 2540 (e.g., a camera), and an intelligent agent 2550.

Figure 26:
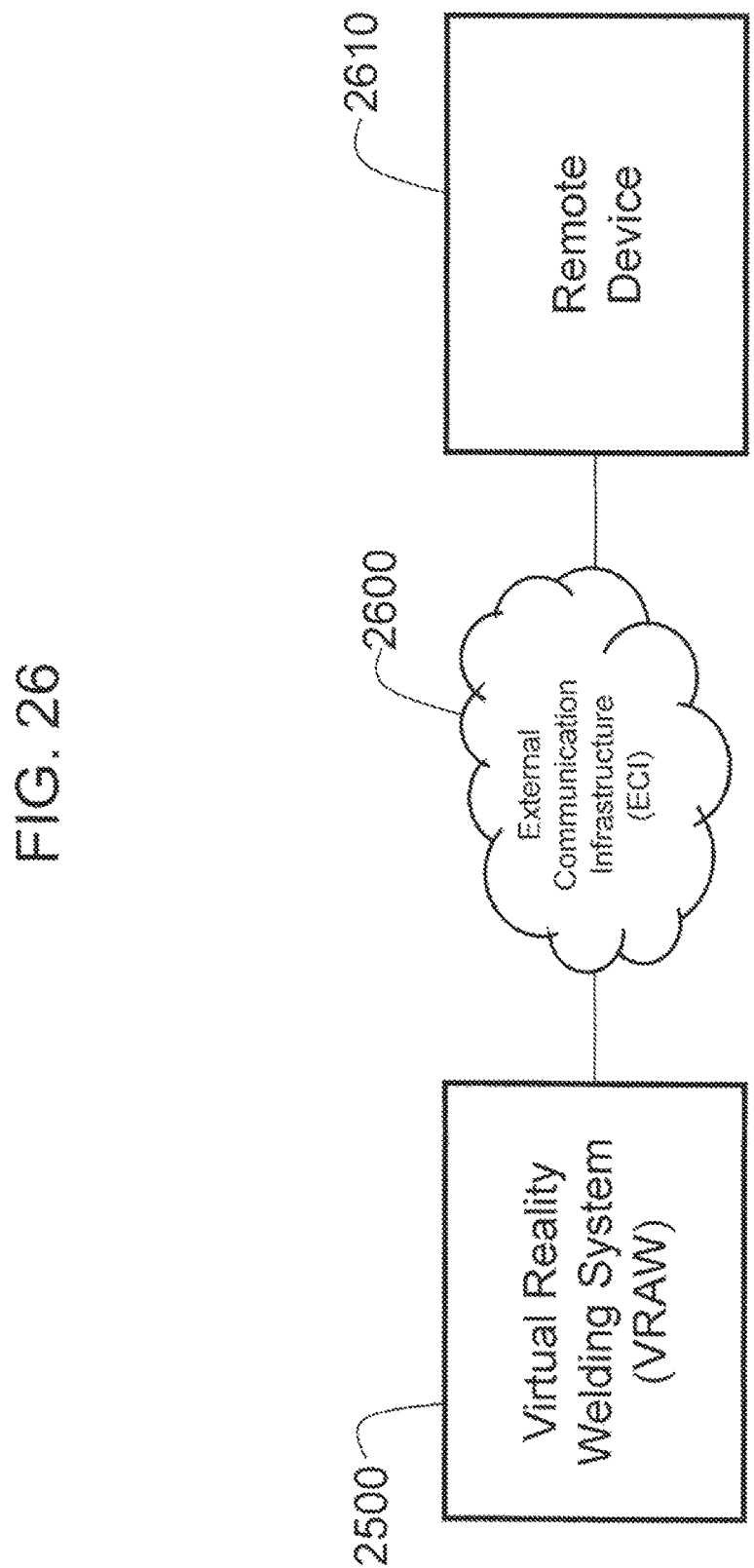
FIG. 26 illustrates a system block diagram showing how the virtual reality arc welding system of FIG. 25 may interface to a remote device via an external communication infrastructure.

The CC 2510 may be, for example, one or more of a cable modem, a wireless router, or a 3G or 4G cellular communication module, providing access and connection to an external communication infrastructure (e.g., the internet). In accordance with an embodiment, the CC 2510 also provides a web browser to aid in facilitating accessing of web sites on the internet. FIG. 26 illustrates a system block diagram showing how the virtual reality arc welding system 2500 of FIG. 25 may interface to a remote device 2610 via an external communication infrastructure 2600. The remote device 2610 is operated by a remote user and may be, for example, a wireless mobile device, a desktop personal computer, or a server computer.

When a user of the virtual reality welding system (e.g., a welding student) is performing a simulated welding procedure, the user may experience difficulty or become confused about some aspect of performing the welding procedure properly. In accordance with an embodiment, the user may, via a user interface (e.g., the WUI 130 or the ODD 150) request to be directed to one of a plurality of pre-identified web sites on the internet related to welding education and theory.

The system 2500 can automatically access the selected web site using the CC 2510 and display a corresponding main web page to the user on, for example, the ODD 150 or the FMDD 140. Once at the main web page, the user can select other web pages associated with the web site via the user interface. In accordance with an embodiment, the identified web sites and associated web pages are specifically designed to deal with common problems experienced by welding students (e.g., orientation of a welding tool, electrode-to-workpiece distance, welding tool travel speed, etc.). In this manner, a user may quickly and easily find answers to alleviate his difficulty or confusion with respect to the present simulated welding procedure.

As an alternative, a welding instructor observing the user may see that the user is having some particular difficulty or problem and, as a result, may request that the user be directed to one of the plurality of pre-identified web sites. As a further alternative, an intelligent agent (IA) 2550 configured on the PPS 110 may automatically detect that the user is not understanding something or not performing some aspect of the simulated welding procedure properly. In accordance with an embodiment, an intelligent agent is an autonomous entity, usually implemented in software, which observes and acts upon an environment and directs its activity towards achieving goals. An intelligent agent may be able to learn and use knowledge to achieve a goal (e.g., the goal of providing relevant feedback to a welding student or a welding educator). In accordance with an embodiment of the present invention, the environment perceived and acted upon by an intelligent agent is the virtual reality environment generated by the VRAW system 2500, for example.

The IA 2550 may subsequently interrupt the simulated welding procedure, notify the user of the problem, and automatically direct the user to an appropriate web site of the plurality of pre-identified web sites in an attempt to help the user. The web sites may provide written instructions, graphical instructions, video instructions, or any other type of appropriate instructional format that can be accommodated over the internet connection.

As an example, the IA 2550 may detect that the user is not holding the mock welding tool at the proper angle and may display a message to the user saying, for example, "You seem to be having trouble holding the mock welding tool at the proper angle. I will now direct you to a web site showing a video of the proper orientation for the welding tool for the present welding procedure". The system 2500 may proceed to access the web site at the direction of the IA 2550 using the CC 2510. The system may even automatically select and play the video for the user. Alternatively, the user may select and play the video once at the web site.

In accordance with an embodiment, the system includes a speaker 2520, a microphone 2530, and a video camera 2540, as illustrated in FIG. 25, which may be used to facilitate communication between a user of the virtual reality arc welding system 2500 and a welding instructor at a remote site. The welding instructor may be connected to the internet via a hand-held mobile device or a desktop personal computer, for example. Communication may be in real time over the external communication infrastructure 2600 using the CC 2510, allowing a welding instructor to provide real-time instruction to a welding student (user) while the welding student is performing a simulated welding process.

In accordance with an embodiment, the microphone 2530 receives sound waves from the user's voice and the video camera 2540 provides video images of the user in real time. The PPS 110 is configured to transform the user's voice and video images into digital data that may be transmitted over the external communication infrastructure 2600 to the welding instructor using the CC 2510. Similarly, the welding instructor's voice may be heard over the speaker 2520 after receiving digital data representative of the welding instructor's voice over the external communication infrastructure 2600 using the CC 2510, and after the PPS 110 transforms the digital data to electrical signals which drive the speaker 2520. Furthermore, video images of the welding instructor may be viewed on the ODD 150, for example, after receiving digital data representative of the video images over the external communication infrastructure 2600 using the CC 2510, and after the PPS 110 transforms the digital data to electrical signals which are displayed on the ODD 150.

In accordance with an embodiment, a user of a remote device 2610 may send commands from the remote device to the virtual reality welding system 2500 over the external communication infrastructure 2600. The commands are received by the PPS 110 through the CC 2510. A user of a remote device may send commands to facilitate remote troubleshooting of the virtual reality welding system 2500, for example. For example, a system technician may command that certain diagnostic procedures be run on the virtual reality welding simulator 2500. The PPS 110 may send results of the diagnostic procedures back to the remote device 2610. Furthermore, a user of a remote device may send commands to change settings of the virtual reality welding simulator 2500. For example, a welding instructor using a remote device at a remote location may set up a welding scenario for a welding student on the virtual reality welding system by changing the settings over the external communication infrastructure 2600. Other settings that may be changed include, for example, positions of the table 171 and the arm 173, a wire feed speed, a voltage level, an amperage, a polarity, and turning particular visual cues on or off.

Another embodiment provides a virtual reality arc welding system. The system includes a programmable processor-based subsystem, a spatial tracker operatively connected to the programmable processor-based subsystem, at least one mock welding tool configured to be spatially tracked by the spatial tracker, and at least one display device operatively connected to the programmable processor-based subsystem. The system is configured to simulate, in a virtual reality environment, a weld puddle that is responsive to manipulation of the at least one mock welding tool by a user and has real-time molten metal fluidity and heat dissipation characteristics, and display the simulated weld puddle on the at least one display device in real-time. The system is further configured to overlay and display an image of an ideal weld puddle onto the simulated weld puddle when at least one characteristic of the simulated weld puddle deviates more than a determined amount from an ideal amount of the at least one characteristic. The at least one characteristic of the simulated weld puddle may include one or more of a shape, a color, slag, a size, viscosity, heat dissipation, puddle wake, and dime spacing. In accordance with various embodiments, the image of the ideal weld puddle may be a partially transparent, ghosted image or an opaque image. The system may further be configured to overlay and display a partially transparent, ghosted image of an ideal weld puddle onto the simulated weld puddle at least during a first portion of a simulated welding process.

Figure 27:
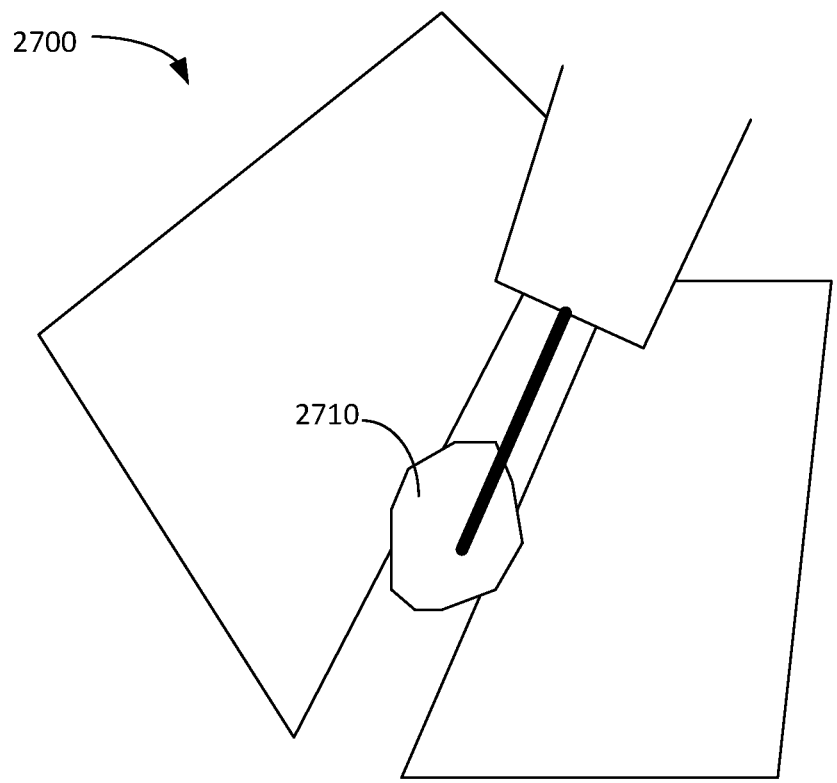
FIG. 27 illustrates an example embodiment of a displayed virtual weld, being created using the virtual reality arc welding system of FIG. 1 or FIG. 25 during a virtual welding process, showing a simulated weld puddle.

FIG. 27 illustrates an example embodiment of a displayed virtual weld 2700, being created using the system 100 during a virtual welding process, showing a simulated weld puddle 2710. In accordance with an embodiment, a simulated weld puddle may have various characteristics such as, for example, shape, color, slag, size, fluidity/viscosity, heat dissipation, puddle wake, and dime spacing. For a particular welding process, these characteristics ideally conform to particular defined ranges or values for an ideal weld puddle.

As an example, in FIG. 27, certain characteristics of the simulated weld puddle 2710 deviate from an ideal weld puddle for the virtual welding process in that the shape of the simulated weld puddle 2710 is too wide and the displayed heat dissipation characteristics are improper. Such deviation may be due to poor user technique of the mock welding tool, for example. Therefore, in accordance with an embodiment, an image of an ideal weld puddle may be overlaid and displayed onto the simulated weld puddle 2710 in real time during the simulated welding process to direct and encourage the user to modify his technique to more accurately match the resultant simulated weld puddle 2710 to the ideal weld puddle.

In accordance with an embodiment, the PPS 110 of the virtual reality arc welding system keeps track of values associated with the characteristics of the simulated weld puddle and compares the values to a set of ideal values for the particular welding process. The virtual reality welding system is configured to overlay and display an image of an ideal weld puddle onto the simulated weld puddle when at least one characteristic of the simulated weld puddle deviates more than a determined amount from an ideal value of the at least one characteristic.

Figure 28:
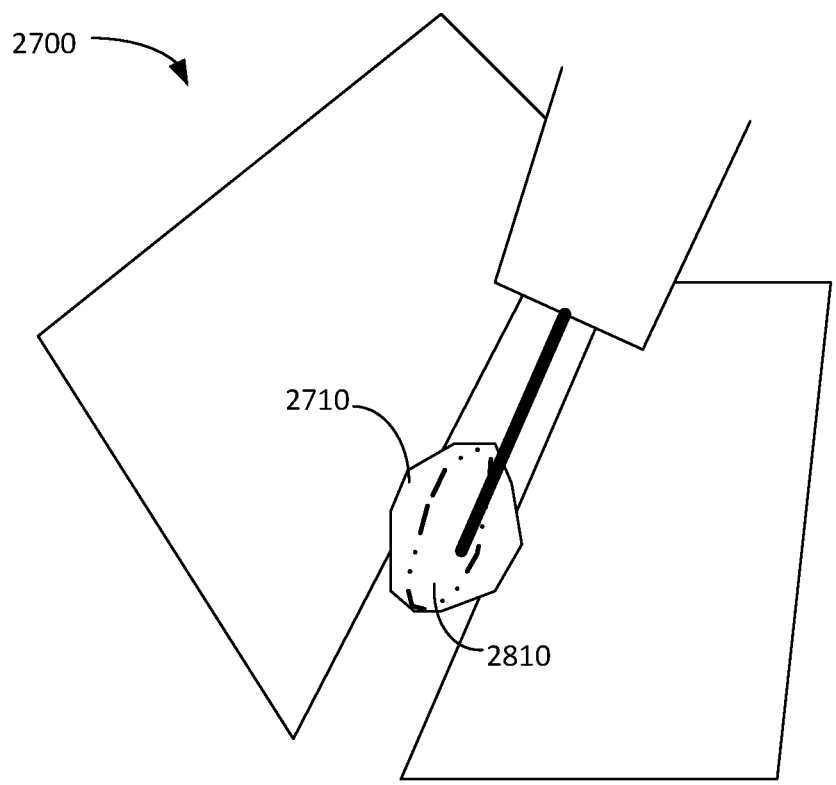
FIG. 28 illustrates the displayed virtual weld of FIG. 27 with an image of an ideal weld puddle overlaid onto an image of the simulated weld puddle.

FIG. 28 illustrates the displayed virtual weld 2700 of FIG. 27 with an image of an ideal weld puddle 2810 overlaid onto an image of the simulated weld puddle 2710. In FIG. 28, the width of the ideal weld puddle 2810 is seen to be narrower than the width of the simulated weld puddle 2710, and the displayed heat gradient of the ideal weld puddle 2810, as illustrated by the changing shades of gray across the ideal weld puddle 2810, is representative of proper heat dissipation for the virtual welding process. The displayed ideal weld puddle 2810 may be partially transparent, in accordance with an embodiment, such that the user can still see the simulated weld puddle 2710 through the ideal weld puddle 2810, allowing the user to see how the characteristics of the simulated weld puddle 2710 approach the characteristics of the ideal weld puddle 2810 as the user modifies his welding technique.

Alternatively, the displayed ideal weld puddle 2810 may be opaque, in accordance with an alternative embodiment, such that at least a portion of the simulated weld puddle 2710 is covered up. In such an alternative embodiment, the ideal weld puddle 2810 may be intermittently displayed, allowing the user to intermittently view the full simulated weld puddle 2710 to determine how the characteristics of the simulated weld puddle 2710 are approaching the characteristics of the ideal weld puddle 2810 as the user modifies his welding technique.

In accordance with an embodiment, the image of the ideal weld puddle 2810, whether partially transparent or opaque, may actually be real time moving video overlaid onto the simulated weld puddle 2710, to show ideal molten metal fluidity and viscosity characteristics, for example. Therefore, as used herein with respect to an ideal weld puddle, the term "Image" may refer to a single static image or dynamic video.

A further embodiment provides a virtual reality arc welding system. The system includes a programmable processor-based subsystem operable to execute coded instructions. The coded instructions include a rendering engine configured to generate a three-dimensional (3D) rendering of a virtual weldment created by a user on the virtual reality welding system. The coded instructions further include an analysis engine configured to perform simulated testing of the 3D virtual weldment and generate corresponding test data. The coded instructions also include at least one intelligent agent (IA) configured to generate recommended corrective actions for the user, based on at least the test data. The recommended corrective actions may include one or more of welding techniques of the user to be changed, training materials stored on the virtual reality welding system to be reviewed by the user, a customized training project to be completed by the user, and a setup of the virtual reality welding system to be changed by the user.

In accordance with an embodiment, an intelligent agent is an autonomous entity, usually implemented in software (coded instructions), which observes and acts upon an environment and directs its activity towards achieving goals. An intelligent agent may be able to learn and use knowledge to achieve a goal (e.g., the goal of providing relevant feedback to a welding student or a welding educator). In accordance with an embodiment of the present invention, the environment perceived and acted upon by an intelligent agent is the virtual reality environment generated by the VRAW system 2500, for example.

As an example, the analysis engine of the programmable processor-based subsystem may perform a simulated bend test on a 3D rendering of the virtual weldment as created by a welding student using the virtual reality welding system 2500. For example, referring to FIG. 22, a straight cut section of the virtual weldment 2200 having a virtual weld joint 2210 may be subjected to the simulated bend test. The bend test may be performed to find various weld properties such as ductility of the welded zone, weld penetration, fusion, crystalline structure (of the fractured surface), and strength. The bend test helps to determine the quality of the weld metal, the weld junction, and the heat affected zone. Any cracking of the metal during the bend test indicates poor fusion, poor penetration, or some other condition that can cause cracking. Stretching of the metal helps indicate the ductility of the weld. A fractured surface reveals the crystalline structure of the weld. Larger crystals tend to indicate a defective welding procedure or inadequate heat treatment after welding. A quality weld has small crystals. During the simulated bend test, test data is generated by the analysis engine.

In accordance with an embodiment, the intelligent agent 2550 is configured to generate recommended corrective actions for the user when the bend test reveals particular aspects of poor weld quality. The intelligent agent 2550 may use the test data generated during the simulated bend test, as well as other data (e.g., data collected in real time during the virtual welding process during which the virtual weldment was created such as, for example, an orientation of the mock welding tool) to generate the corrective actions. For example, the intelligent agent 2550 may generate changes to the welding student's welding technique which the welding student can practice to improve his welding technique. The changes to the student's welding technique may include, for example, the distance the student holds the end of the welding electrode of the mock welding tool from the mock welding coupon and the angle at which the student holds the mock welding tool with respect to the mock welding coupon. Other welding technique changes may be recommended as well.

Furthermore, or alternatively, the intelligent agent 2550 may direct the welding student to particular training materials that are stored on the virtual reality arc welding system 2500. The training materials may include, for example, slide show presentations and videos dealing with specific aspects of a welding process. Other types of training materials are possible as well, in accordance with various embodiments. Also, the intelligent agent 2550 may generate a customized training project to be completed by the welding student. For example, the intelligent agent may determine that the student is having trouble achieving the proper amount of weld penetration. As a result, the intelligent agent may generate a training project that has the student practicing specific welding techniques on the virtual reality welding system to achieve proper weld penetration for one or more types of welding coupons and simulated welding processes.

Finally, the intelligent agent may generate a changed setup that the welding student should apply to the virtual reality welding system to improve the quality of the virtual weldment. The changed setup may direct the welding student to change, for example, a position of the mock welding coupon, positions of the table/stand (T/S), an amperage setting of the virtual reality welding system, a voltage setting of the virtual reality welding system, or a wire feed speed setting of the virtual reality welding system. Other setup aspects may be changed as well, in accordance with other various embodiments.

In accordance with an embodiment, the recommendations generated by the intelligent agent may be presented to the welding student on a display device of the virtual reality welding system. In accordance with an alternative embodiment, the virtual reality welding system may be configured to interface to a printer device and the recommendations may be printed for the user. Furthermore, the virtual reality welding system may be configured to store and display various welding procedure specifications and blueprints with welding symbols to aid a welding student in his training.

In accordance with an embodiment, the virtual reality welding system is configured to track the progress of the welding student as the welding student progresses through a training program using the virtual reality welding system, and recall the student's place in the training program. A training program may include a plurality of welding procedures and/or training modules. For example, the virtual reality welding system may provide a means for the welding student to identify himself to the virtual reality welding system. Such identification may be accomplished through one of various well known techniques such as, for example, scanning of a user badge or identification card (e.g., bar code scanning or magnetic strip scanning), biometric scanning of the student (e.g., retinal scanning), or manual entering of a student identification number. In accordance with the various embodiments, the virtual reality welding system is configured to accommodate the identifying techniques. For example, the virtual reality welding system may have an integrated bar code scanner or retinal scanner.

Once a student is identified, the virtual reality welding system may recall from memory the section of the training program where the welding student left off including, for example, the last welding setup of the virtual reality training system and the last virtual weld created. Furthermore, the virtual reality welding system may be configured to store the past welding procedures and training modules the welding student has completed to date, and allow the welding student to recall and display a history of the completed procedures and modules. In this manner, multiple students may use the same virtual reality welding system, at different times, while having the virtual reality training system separately track and remember the progress of each welding student.

Another embodiment provides a method. The method includes displaying a virtual welding environment to a user on one or more display devices of a virtual reality welding system, wherein the virtual welding environment is generated by the virtual reality welding system and simulates one or more unsafe conditions within the virtual welding environment. The method further includes allowing the user to proceed with performing a virtual welding activity using the virtual reality welding system after the user has correctly identified the one or more unsafe conditions to the virtual reality welding system via a user interface of the virtual reality welding system. The method may further include removing the one or more unsafe conditions from the virtual welding environment in response to the user correctly identifying the one or more unsafe conditions to the virtual reality welding system. The method may also include introducing one or more new unsafe conditions into the virtual welding environment during a welding activity performed by the user using the virtual reality welding system, wherein the one or more new unsafe conditions are automatically introduced by the virtual reality welding system. The method may further include introducing one or more new unsafe conditions into the virtual welding environment during a welding activity performed by the user using the virtual reality welding system, wherein the one or more new unsafe conditions are introduced by the virtual reality welding system in response to a command from a welding instructor.

In accordance with an embodiment, unsafe conditions in the virtual welding environment may include, for example, an improperly positioned exhaust hood presenting a fume exposure hazard, a wooden structure near the welding workpiece presenting a fire hazard, a loose or tenuous welding cable connection to the workpiece presenting an electrical shock hazard, water near the workpiece presenting a slipping hazard, unsecured welding gas cylinders presenting an explosive hazard, and an excessively confined welding area presenting an electrical shock hazard and/or a fume exposure hazard. Other types of unsafe conditions are possible as well, in accordance with various other embodiments.

As an example, a user viewing the virtual welding environment on a display device of the virtual reality welding system may observe an improperly positioned exhaust hood presenting a fume exposure hazard. In accordance with an embodiment, the user may place a cursor over the improperly placed exhaust hood on the display device using the user interface of the virtual reality welding system and select the exhaust hood. In this manner, the user identifies the unsafe condition of the improperly positioned exhaust hood to the virtual reality welding system. Upon identifying the unsafe condition to the system, the system may properly position the exhaust hood in the virtual welding environment. If the improperly positioned exhaust hood was the only unsafe condition, then the user may proceed with performing a virtual welding activity using the virtual reality welding system. Other ways of identifying an unsafe condition to the virtual reality welding system are possible as well, in accordance with various other embodiments. Furthermore, in accordance with an embodiment, the virtual reality welding system may be configured to allow the user to properly position the exhaust hood in the virtual reality environment via the user interface.

As the user performs the virtual welding activity, the system may occasionally introduce a new unsafe condition into the virtual welding environment. Alternatively, a welding instructor may command the system to introduce a new unsafe condition using the user interface of the virtual reality welding system. As an example, as the user is performing the virtual welding activity, the welding cable connection to the workpiece may visibly become loose. If the user does not stop the virtual welding activity and identify the new unsafe condition to the system within a predetermined period of time, the system may provide an indication to the user that the user has failed to identify the new unsafe condition and may shut down the virtual welding process. In this manner, the user (e.g., a welding student) may learn to become aware of unsafe conditions in the welding environment.

A further embodiment provides a method. The method includes setting a plurality of welding parameters on a virtual reality welding system for a welding process, wherein at least one of the welding parameters is improperly set for the welding process. The method also includes a user performing a virtual welding activity using the virtual reality welding system having the set plurality of welding parameters to create a virtual weldment. The method further includes the user observing the virtual weldment on at least one display device of the virtual reality welding system and attempting to identify the at least one improperly set welding parameter based at least on the observing. The setting of the plurality of welding parameters may be performed by a welding instructor. Alternatively, the setting of the plurality of welding parameters may be performed automatically by the virtual reality welding system. The method may also include the user attempting to change the at least one improperly set welding parameter to a proper setting. One of the virtual reality welding system or a welding instructor may inform the user when the user has changed the at least one improperly set welding parameter to a proper setting.

In accordance with an embodiment, the plurality of welding parameters may include a wire feed speed, a voltage level, an amperage, and a polarity which are each settable on the welding user interface. Other settable welding parameters may be possible as well, in accordance with various other embodiments. As an example, the wire feed speed can be improperly set too high or too low for a particular welding process. Similarly, the voltage level and/or amperage can be improperly set too high or too low for a particular welding process. Furthermore, the polarity can be improperly set to the opposite polarity for a particular welding process. Setting one or more welding parameters incorrectly can result in a created virtual weld having defects and discontinuities. For example, setting the amperage too low can result in a lack of penetration into the workpiece (as represented by the virtual welding coupon).

Therefore, in accordance with an embodiment, the user may observe the resultant virtual weldment to check for any defects or discontinuities. The user may even desire to perform a virtual destructive or non-destructive test on the virtual weldment, as described previously herein, to aid observation. Based on the user's observations of the virtual weldment and the user's knowledge of the relationship between welding parameters and welding defects and discontinuities, the user may identify one or more welding parameters that were improperly set. The user may change the one or more improperly set welding parameters to what the user believes to be the proper settings, and proceed to re-create the virtual weldment, hopefully without the previous defects or discontinuities. In accordance with an embodiment, the virtual reality welding system is configured to inform the user (e.g., by displaying a message to the user on a display device of the system) that the parameters are now properly set for the selected welding process.

While the claimed subject matter of the present application has been described with reference to certain embodiments, it will be understood by those skilled in the art that various changes may be made and equivalents may be substituted without departing from the scope of the claimed subject matter. In addition, many modifications may be made to adapt a particular situation or material to the teachings of the claimed subject matter without departing from its scope. Therefore, it is intended that the claimed subject matter not be limited to the particular embodiments disclosed, but that the claimed subject matter will include all embodiments falling within the scope of the appended claims.

What is claimed is:

1. A virtual reality welding system, comprising:
a programmable processor-based subsystem;
a spatial tracker operatively connected to the programmable processor-based subsystem;
at least one mock welding tool configured to be spatially tracked by the spatial tracker; and
at least one display device operatively connected to the programmable processor-based subsystem,
wherein the system is configured to simulate, in a virtual reality environment, a weld puddle that is responsive to manipulation of the at least one mock welding tool by a user and has real-time molten metal fluidity and heat dissipation characteristics, and display the simulated weld puddle on the at least one display device in real-time, and
wherein the virtual reality welding system is further configured to overlay and display an image of an ideal weld puddle onto the simulated weld puddle when at least one characteristic of the simulated weld puddle deviates more than a determined amount from an ideal amount of the at least one characteristic.

2. The system of claim 1, wherein the image of the ideal weld puddle is a partially transparent, ghosted image.

3. The system of claim 1, wherein the image of the ideal weld puddle is an opaque image.

4. The system of claim 1, wherein the at least one characteristic of the simulated weld puddle includes one or more of a shape, a color, slag, a size, viscosity, heat dissipation, puddle wake, and dime spacing.

5. The system of claim 1, wherein the virtual reality welding system is further configured to overlay and display a partially transparent, ghosted image of an ideal weld puddle onto the simulated weld puddle at least during a first portion of a simulated welding process.

6. The system of claim 1, wherein the virtual welding system is further configured to intermittently display the image of the ideal weld puddle.

7. The system of claim 1, wherein the image of the ideal weld puddle is full motion video of the formation of the ideal weld puddle.

8. A simulated welding system, comprising:
a programmable processor-based subsystem;
a spatial tracker operatively coupled to the programmable processor-based subsystem;
a mock welding tool trackable by the spatial tracker; and
a display operatively coupled to the programmable processor-based subsystem,
wherein the programmable processor-based subsystem executes computer-executable instructions that configure the subsystem to:
simulate a weld puddle with real-time molten metal fluidity and heat dissipation characteristics responsive to manipulation of the mock welding tool based on tracking information obtained from the spatial tracker,
display a simulated weld puddle on the display in real-time, and
display an image of an ideal weld puddle with the simulated weld puddle.

9. The system of claim 8, wherein the programmable processor-based subsystem measures at least one characteristic of the simulated weld puddle.

10. The system of claim 9, wherein the at least one characteristic of the simulated weld puddle includes one or more of shape, color, slag, size, viscosity, heat dissipation, puddle wake, or dime spacing.

11. The system of claim 9, wherein the programmable processor-based subsystem determines when the at least one characteristic of the simulated weld puddle deviates from a predetermined value by more than a predetermined amount.

12. The system of claim 11, wherein the programmable processor-based subsystem displays the image of the ideal weld puddle when the at least one characteristic of the simulated weld puddle deviates in excess of the predetermined amount.

13. The system of claim 8, wherein the image of the ideal weld puddle is a partially transparent, ghosted image overlying the simulated weld puddle.

14. The system of claim 8, wherein the image of the ideal weld puddle is an opaque image overlying the simulated weld puddle.

15. The system of claim 8, wherein the image of the ideal weld puddle is full motion video of the formation of the ideal weld puddle.

16. A non-transitory, computer-readable storage medium having stored thereon computer-executable instruction for a welding simulation, wherein the instructions, when executed, configure a processor to:

obtain tracking information from a spatial tracker configured to spatially track a mock welding tool operated by a user;

simulate a weld puddle based on the tracking information and responsive to manipulation of the mock welding tool by the user, wherein the weld puddle is simulated with real-time molten metal fluidity and heat dissipation characteristics;

display a simulated weld puddle on a display in real-time; and display an overlay image of an ideal weld puddle on the simulated weld puddle.

17. The non-transitory, computer-readable storage medium of claim 16, further storing instructions that configure the processor to display the overlay image of the ideal weld puddle when at least one characteristic of the simulated weld puddle deviates from a normal value by a predetermined amount.

18. The non-transitory, computer-readable storage medium of claim 16, further storing instructions that configure the processor to display the overlay image as a partially transparent, ghosted image over the simulated weld puddle.

19. The non-transitory, computer-readable storage medium of claim 16, further storing instructions that configure the processor to display the overlay image on the simulated weld puddle at least during a first portion of a simulated welding process.

* * * * *